United States Patent
Demiray et al.

(10) Patent No.: US 9,984,736 B2
(45) Date of Patent: May 29, 2018

(54) MAGNETIC STORAGE DEVICE AND MEMORY SYSTEM

(71) Applicant: TOSHIBA MEMORY CORPORATION, Minato-ku, Tokyo (JP)

(72) Inventors: Ahmetserdar Demiray, Yokohama Kanagawa (JP); Masahiko Nakayama, Kawasaki Kanagawa (JP); Hiroshi Watanabe, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/426,032

(22) Filed: Feb. 6, 2017

(65) Prior Publication Data

US 2018/0053542 A1 Feb. 22, 2018

Related U.S. Application Data

(60) Provisional application No. 62/377,496, filed on Aug. 19, 2016.

(51) Int. Cl.
  *G11C 11/00* (2006.01)
  *G11C 11/16* (2006.01)
(52) U.S. Cl.
  CPC ........ *G11C 11/1675* (2013.01); *G11C 11/161* (2013.01)
(58) Field of Classification Search
  CPC .................. G11C 11/1675; G11C 11/161
  USPC ........................................ 365/158
  See application file for complete search history.

(56) References Cited

U.S. PATENT DOCUMENTS

| | | | | |
|---|---|---|---|---|
| 6,236,590 B1* | 5/2001 | Bhattacharyya | ........ | G11C 11/15 257/E27.005 |
| 6,778,429 B1* | 8/2004 | Lu | ........... | G11C 11/16 365/158 |
| 7,342,822 B2* | 3/2008 | Ezaki | ...... | G11C 11/16 257/E27.005 |
| 7,505,306 B2* | 3/2009 | Fukuzumi | ............... | G11C 11/16 365/158 |
| 8,934,304 B2* | 1/2015 | Cho | ........ | G11C 11/406 365/185.03 |
| 9,218,864 B1* | 12/2015 | Yi | ......... | G11C 11/161 |
| 9,653,182 B1* | 5/2017 | Toko | ...... | G11C 29/12 |
| 2003/0174536 A1* | 9/2003 | Hidaka | ................... | G11C 11/15 365/158 |

(Continued)

FOREIGN PATENT DOCUMENTS

JP 2001338487 A 12/2001
WO 2015132997 A1 9/2015

*Primary Examiner* — Viet Q Nguyen
(74) *Attorney, Agent, or Firm* — Holtz, Holtz & Volek PC

(57) ABSTRACT

According to an embodiment, a magnetic storage device includes a first, second, and third magnetoresistive effect elements, and a controller. The second and third magnetoresistive effect elements are in proximity to the first magnetoresistive effect element. When the controller receives an command which is associated with an operation of writing a first data item to the first magnetoresistive effect element, the controller is configured to perform a first operation of writing the first data item to the first magnetoresistive effect element, and a second operation of writing a second data item different from the first data item to the second magnetoresistive effect element and the third magnetoresistive effect element.

20 Claims, 38 Drawing Sheets

(56) References Cited

U.S. PATENT DOCUMENTS

| | | | |
|---|---|---|---|
| 2004/0004856 A1 | 1/2004 | Sakimura et al. | |
| 2004/0228198 A1* | 11/2004 | Shimizu | G11C 11/15 |
| | | | 365/232 |
| 2005/0036362 A1* | 2/2005 | Iwata | G11C 11/15 |
| | | | 365/158 |
| 2005/0088878 A1* | 4/2005 | Eshel | G11C 16/28 |
| | | | 365/185.28 |
| 2005/0232001 A1* | 10/2005 | Tsuji | G11C 11/16 |
| | | | 365/158 |
| 2006/0083057 A1* | 4/2006 | Nakayama | G11C 11/16 |
| | | | 365/171 |
| 2006/0256461 A1* | 11/2006 | Ezaki | H01L 27/224 |
| | | | 360/1 |
| 2012/0051122 A1* | 3/2012 | Tsuji | H01L 27/228 |
| | | | 365/158 |
| 2012/0153414 A1 | 6/2012 | Shuto | |
| 2012/0286339 A1 | 11/2012 | Asao | |
| 2013/0094294 A1* | 4/2013 | Kwak | H01L 27/1157 |
| | | | 365/185.03 |
| 2014/0241076 A1* | 8/2014 | Kwon | G11C 29/12005 |
| | | | 365/189.09 |
| 2014/0355336 A1* | 12/2014 | Hoya | G11C 11/1675 |
| | | | 365/158 |
| 2015/0035099 A1 | 2/2015 | Apalkov et al. | |
| 2015/0179256 A1* | 6/2015 | Kitagawa | G11C 13/0069 |
| | | | 365/148 |
| 2017/0141157 A1* | 5/2017 | Sakai | H01L 27/226 |

* cited by examiner

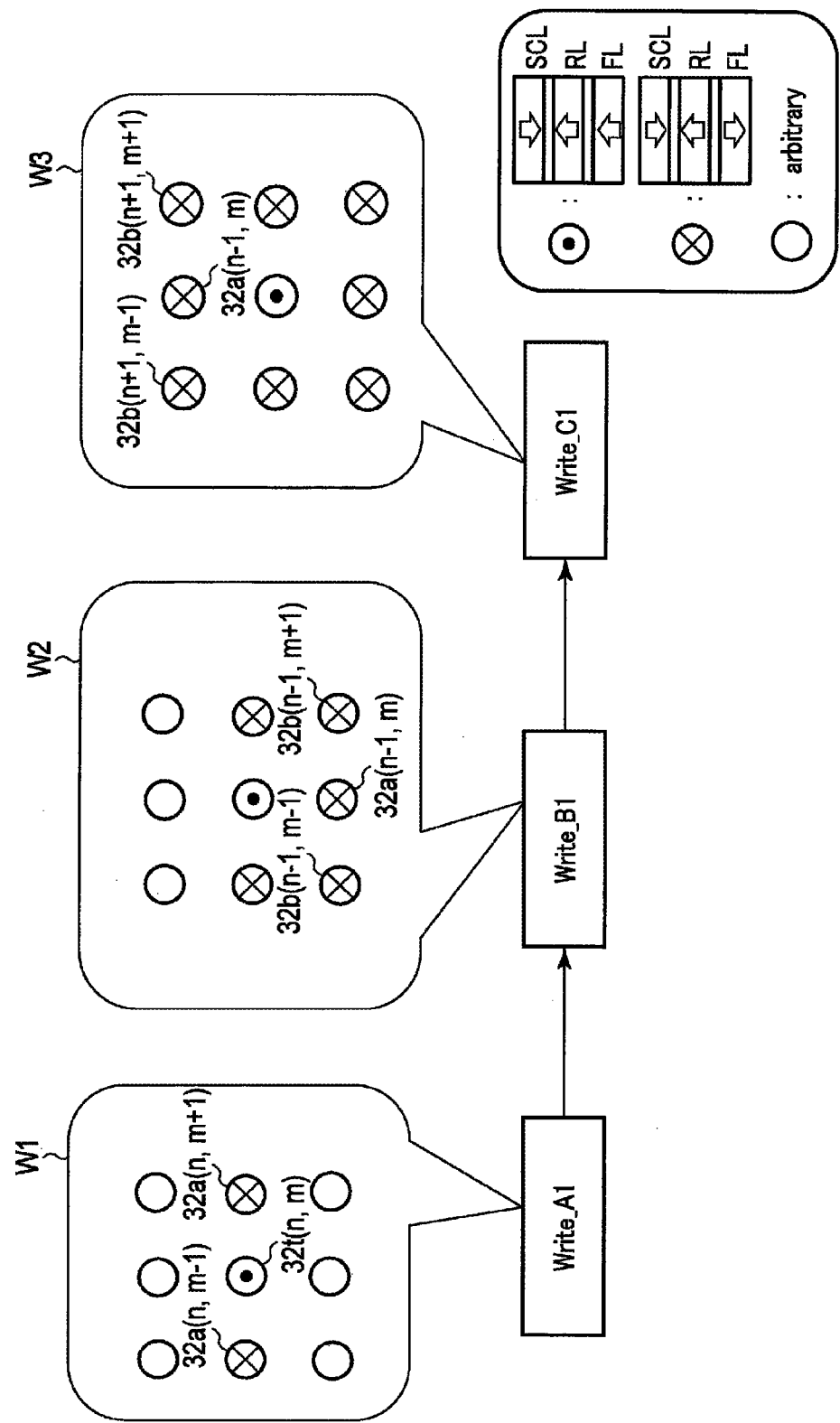
F I G. 11

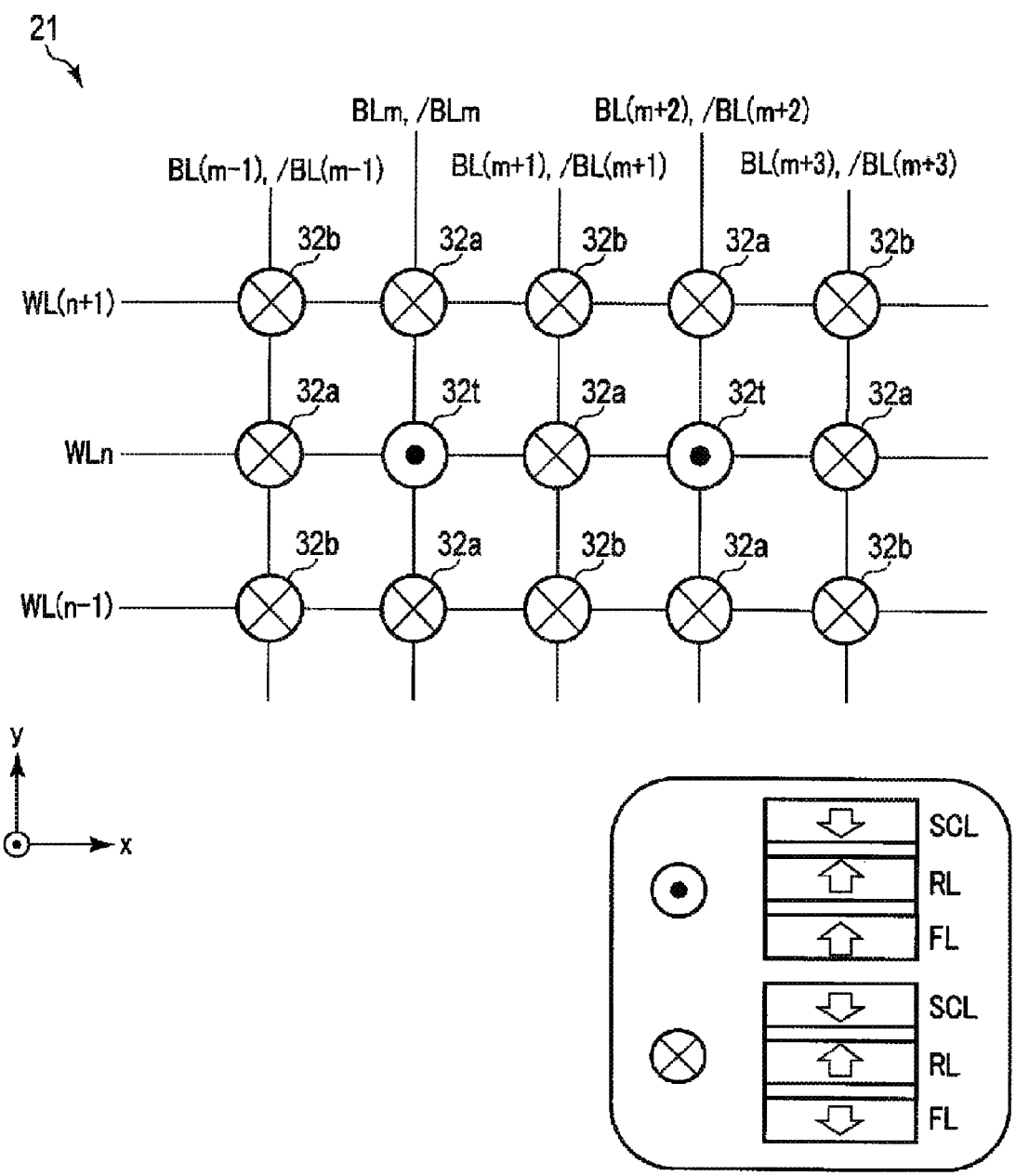
F I G. 13

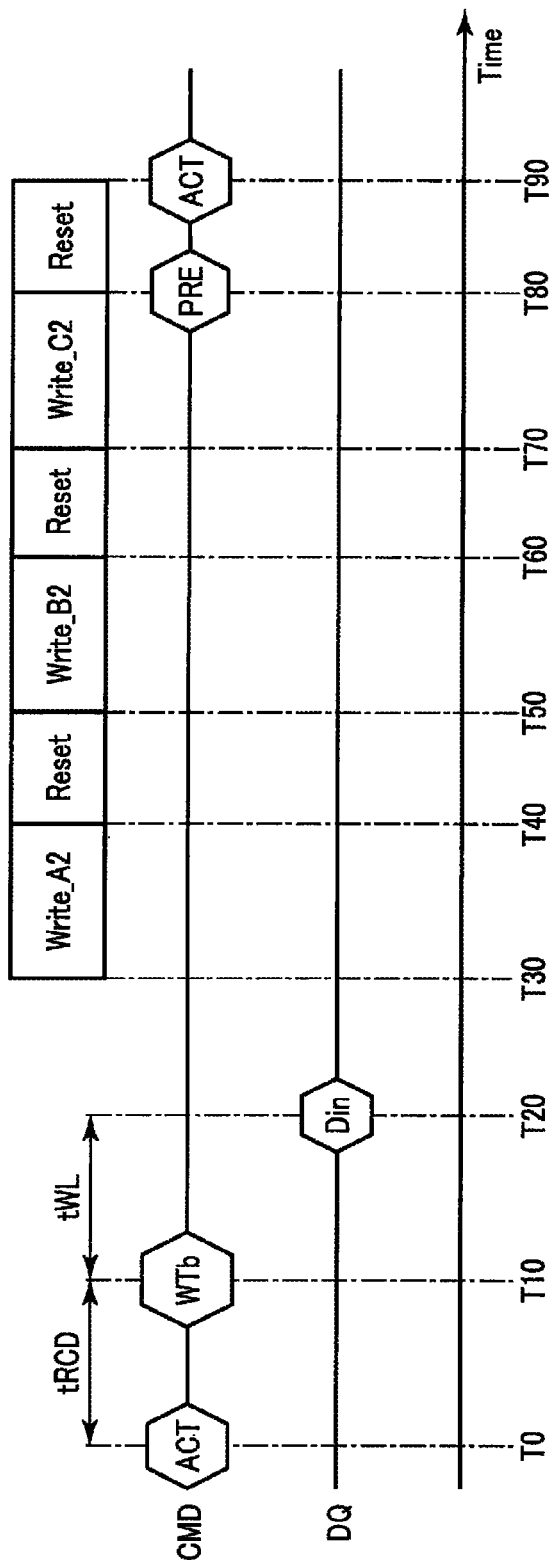
F I G. 16

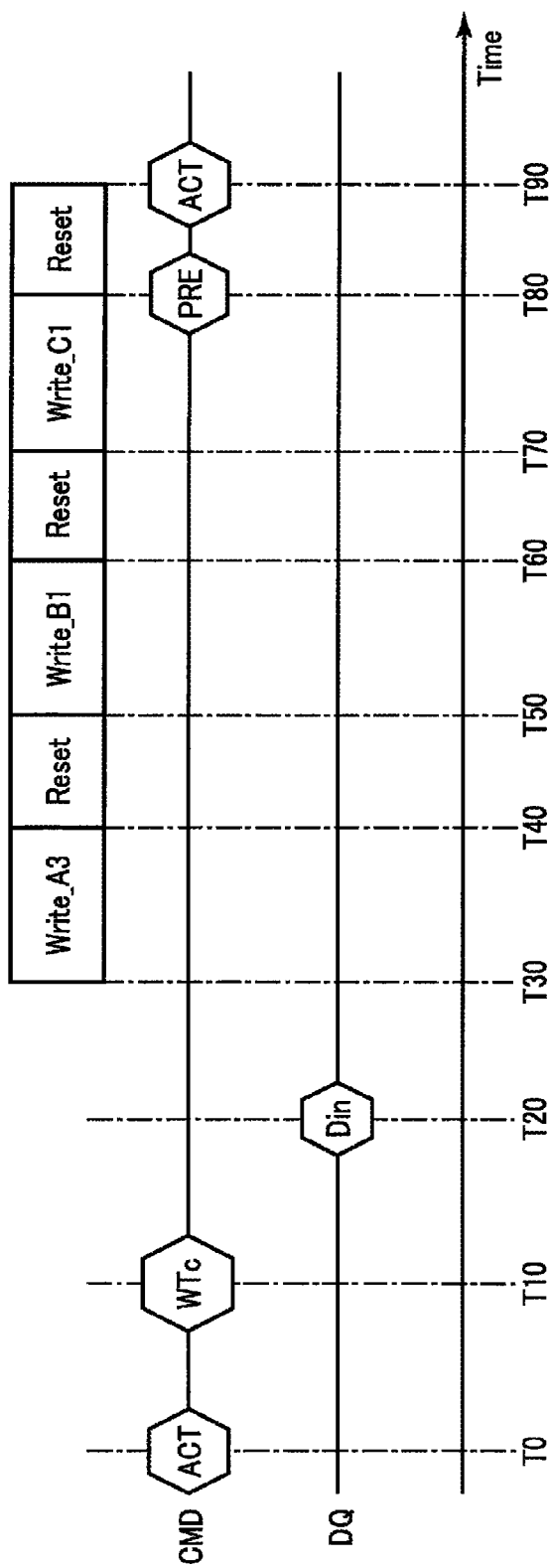
F I G. 19

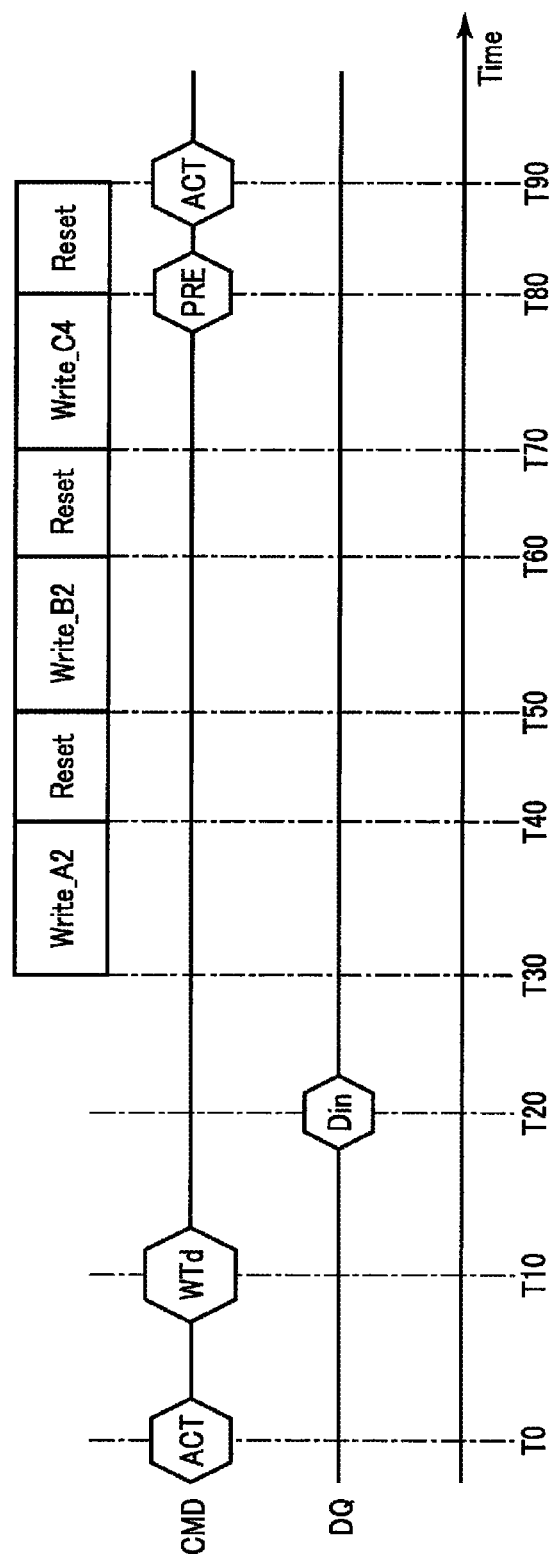
F I G. 21

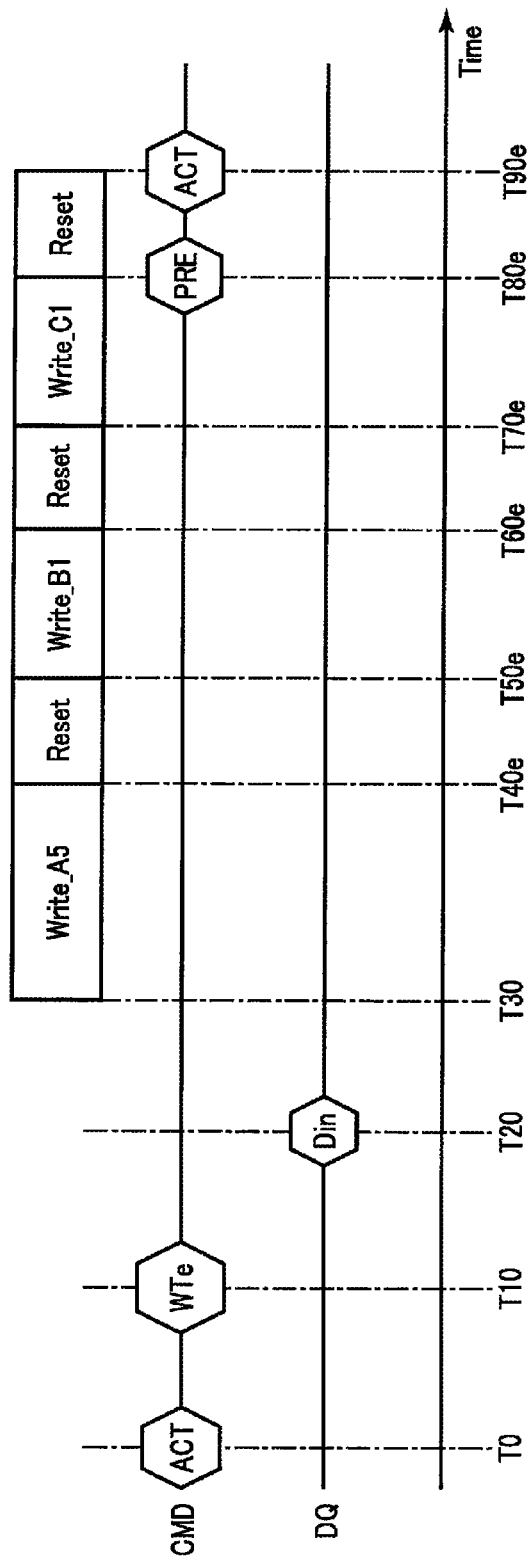
F I G. 23

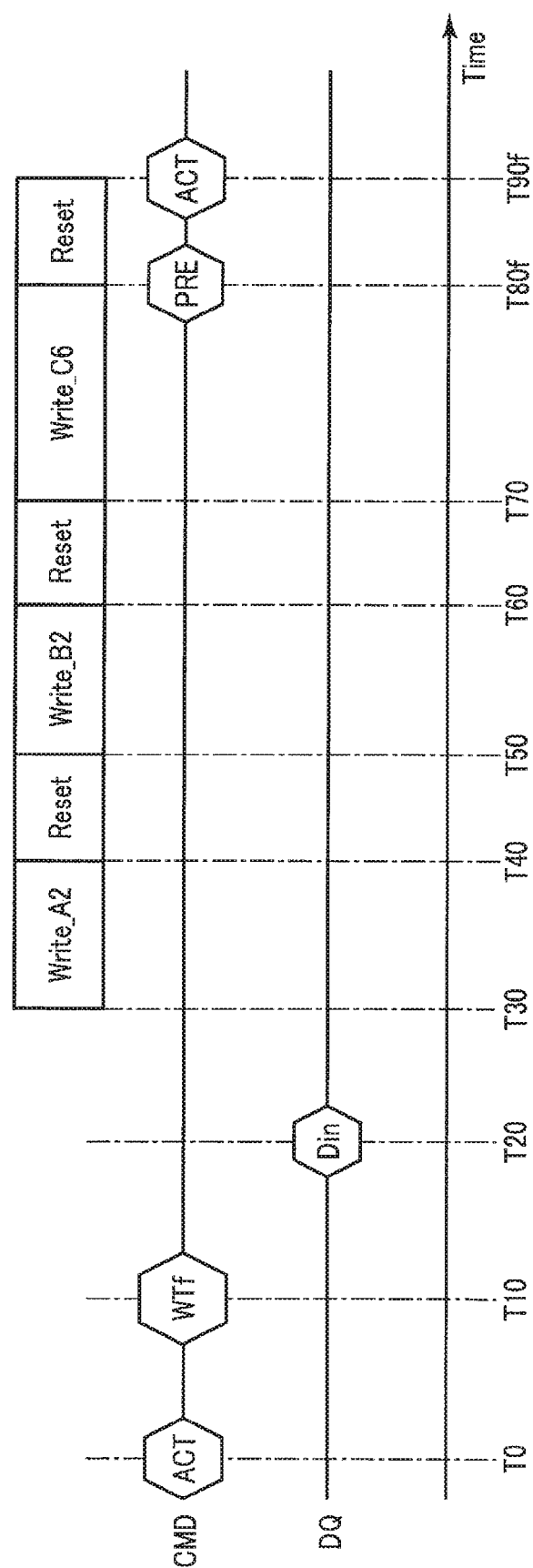
F I G. 25

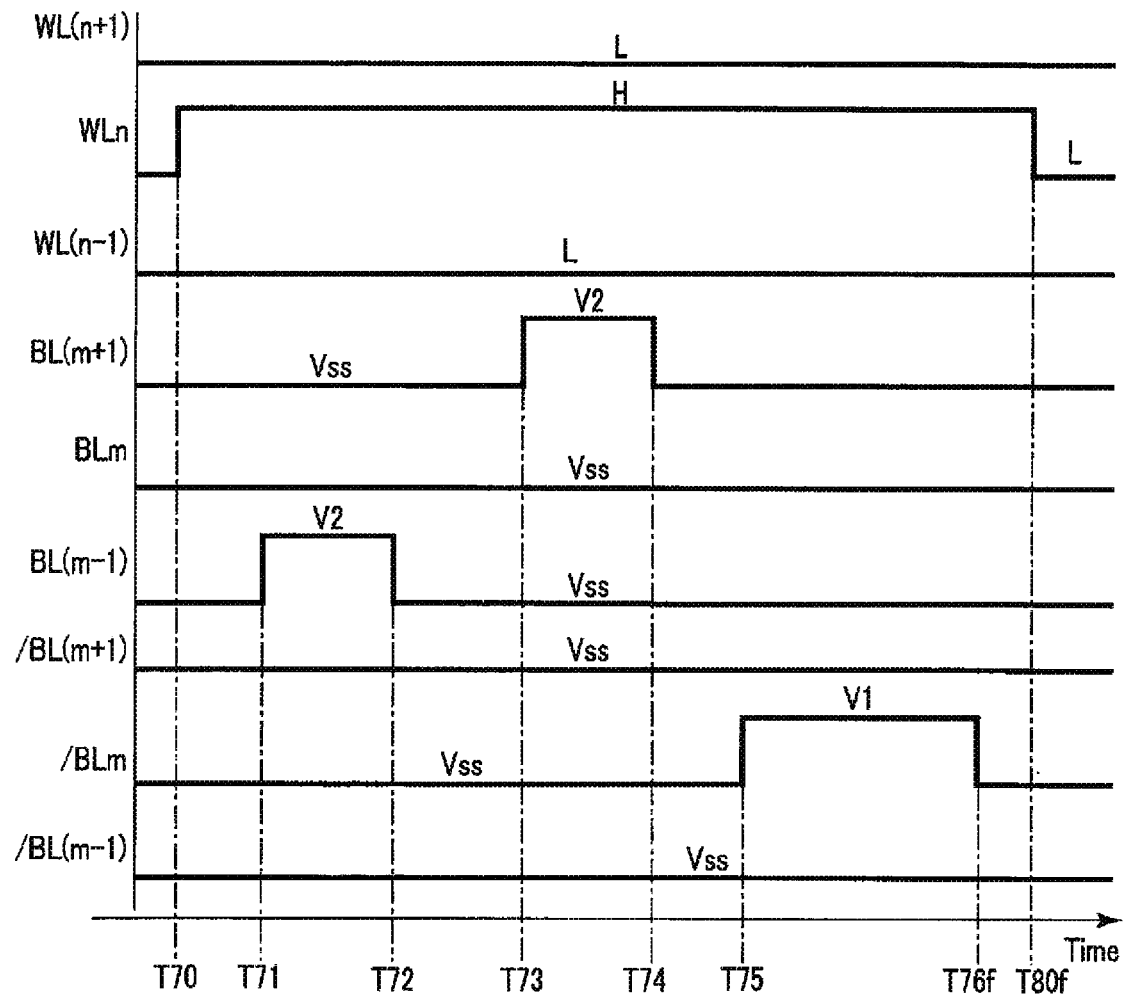
F I G. 26

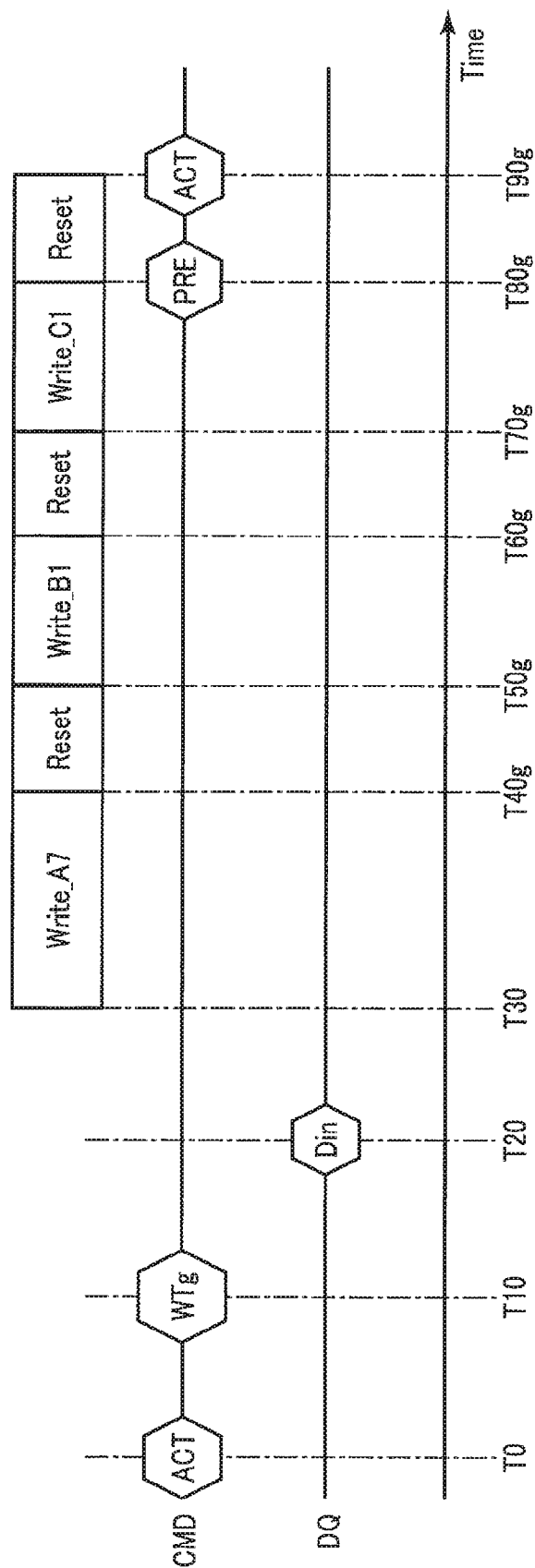
F I G. 27

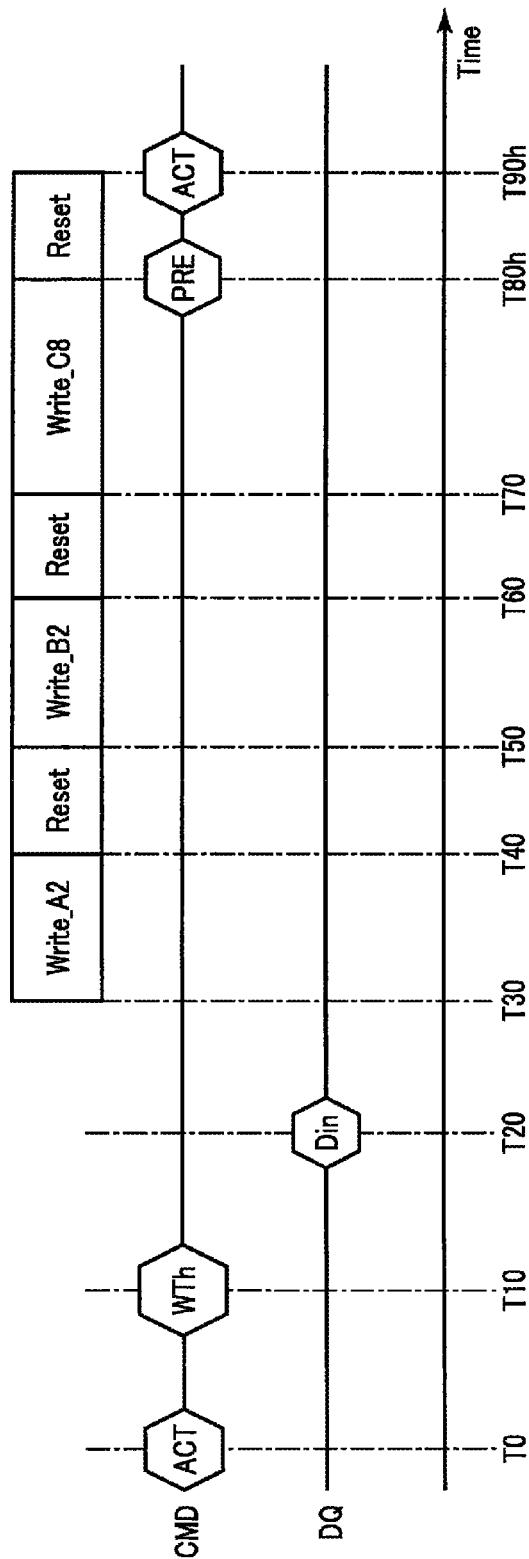
F I G. 29

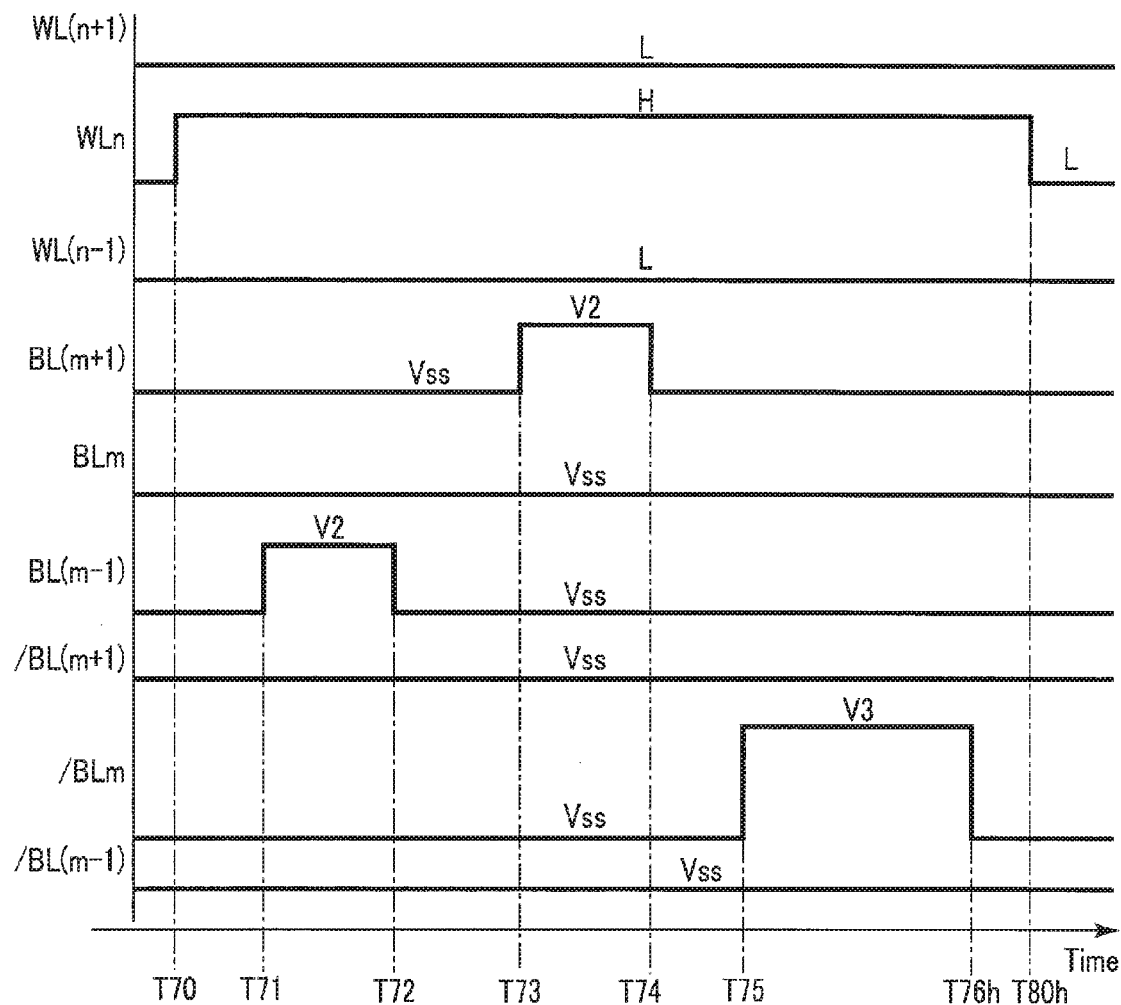
F I G. 30

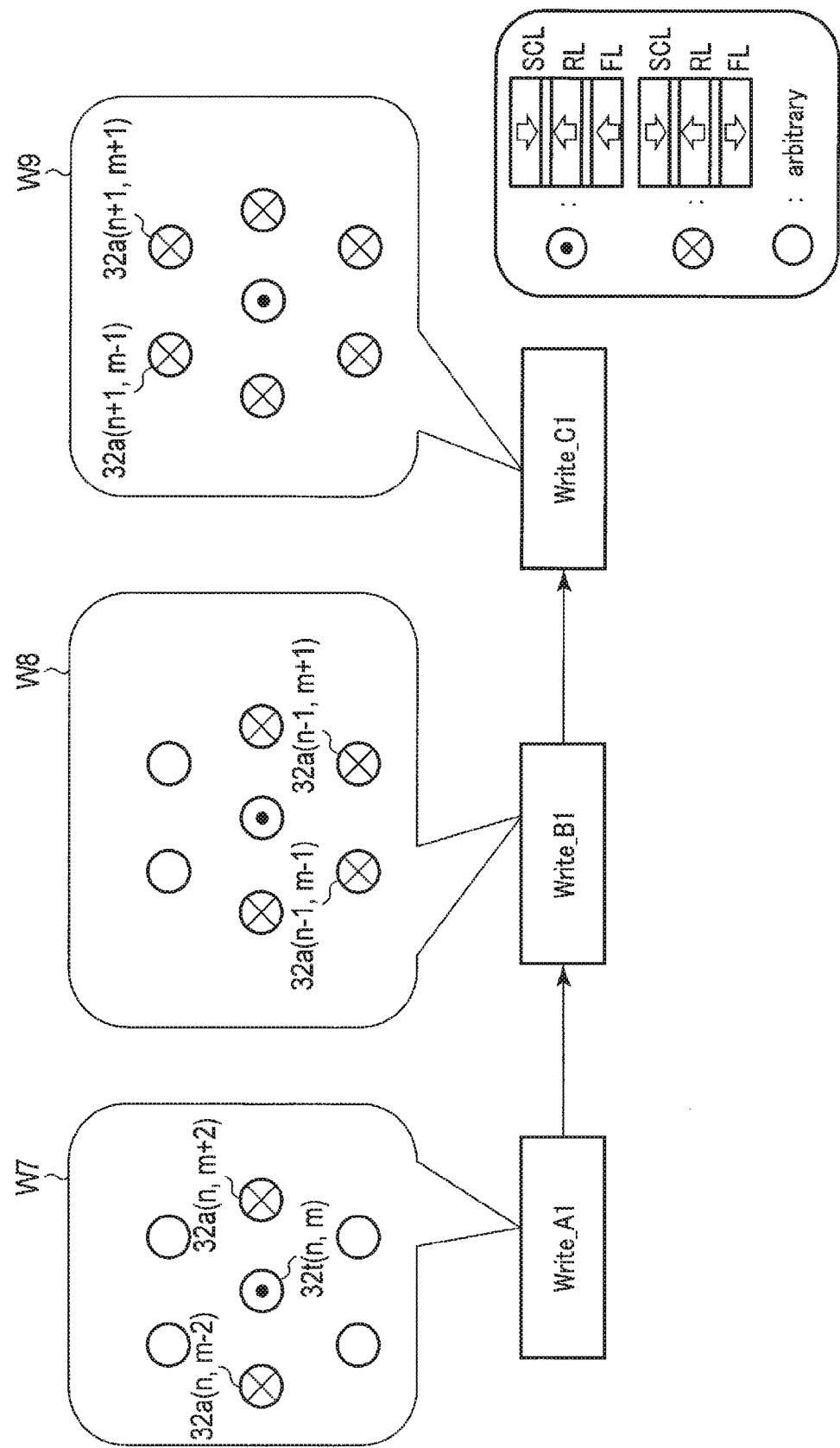
F I G. 33

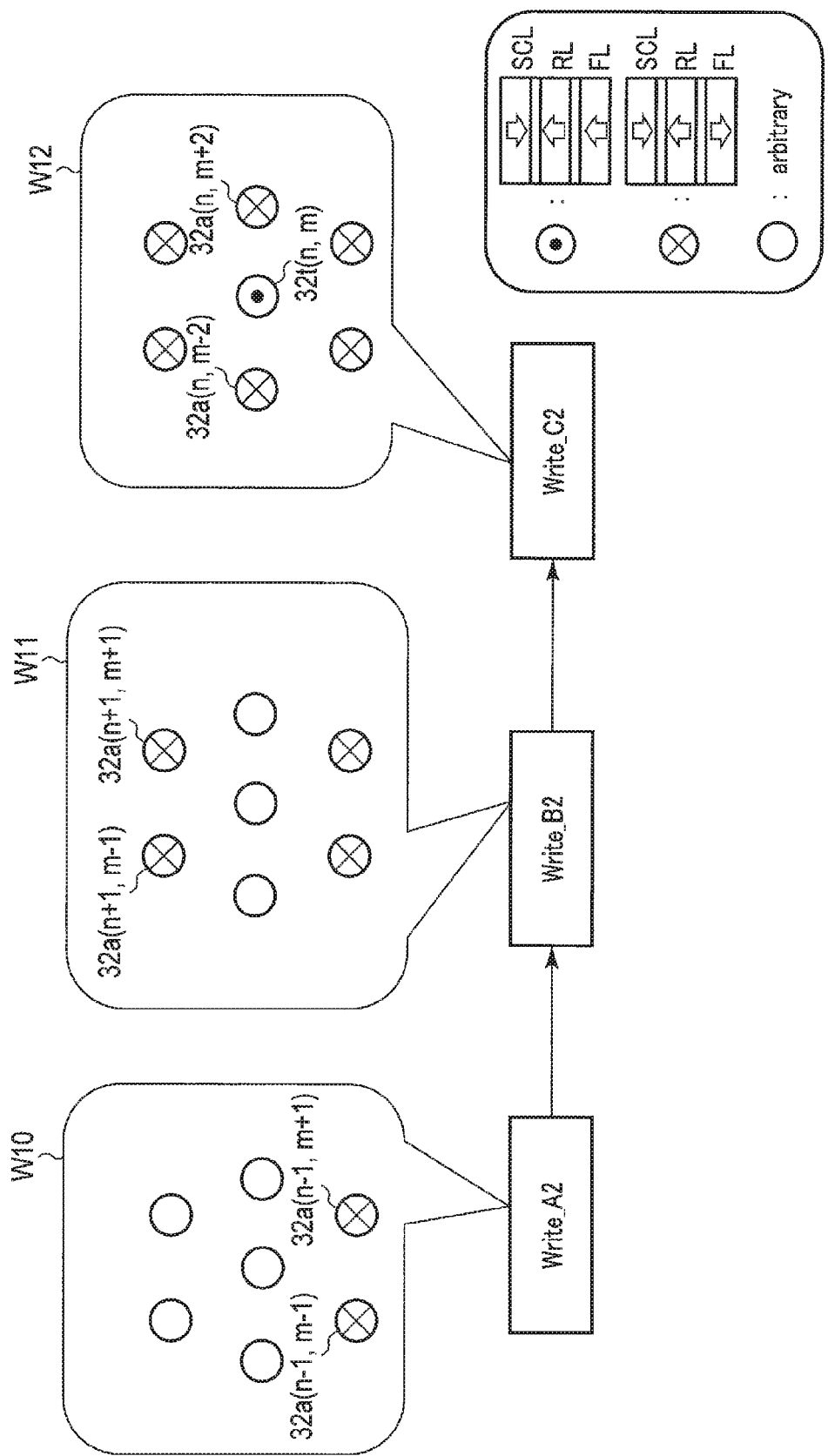
F I G. 34

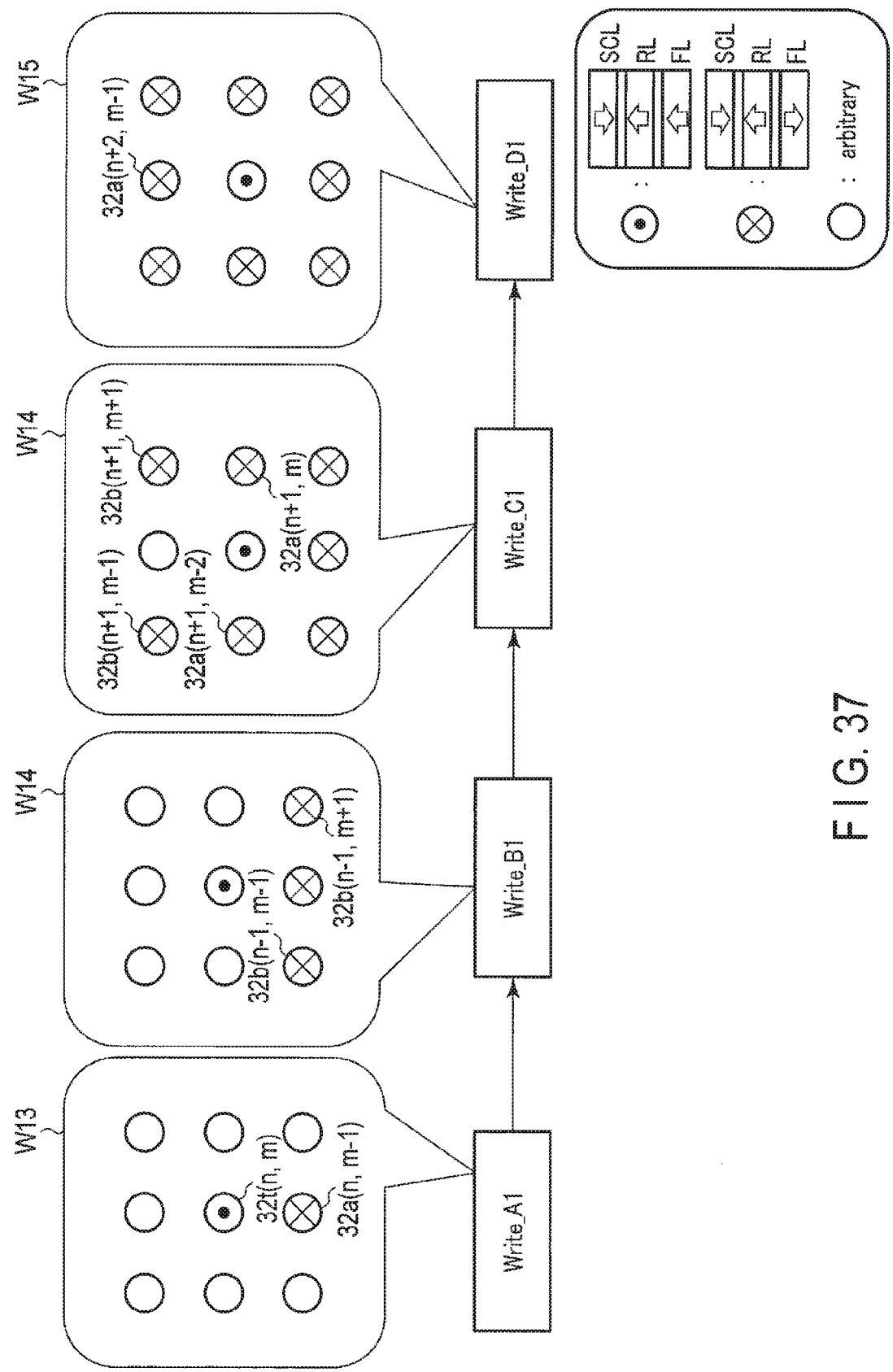
F I G. 37

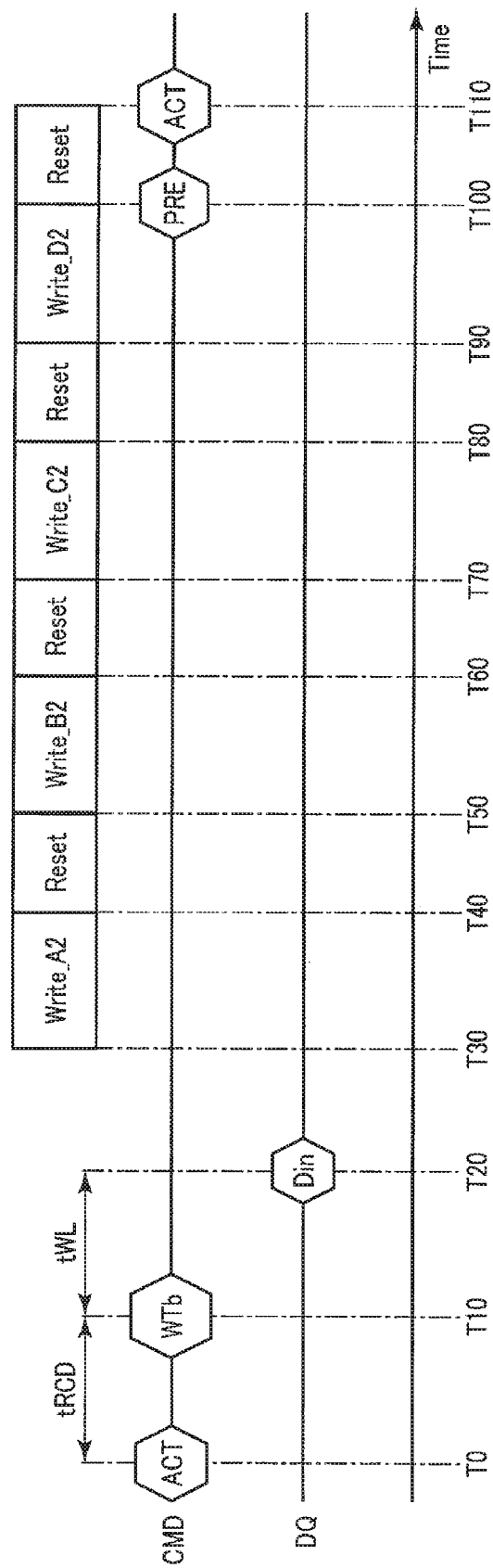
F I G. 38

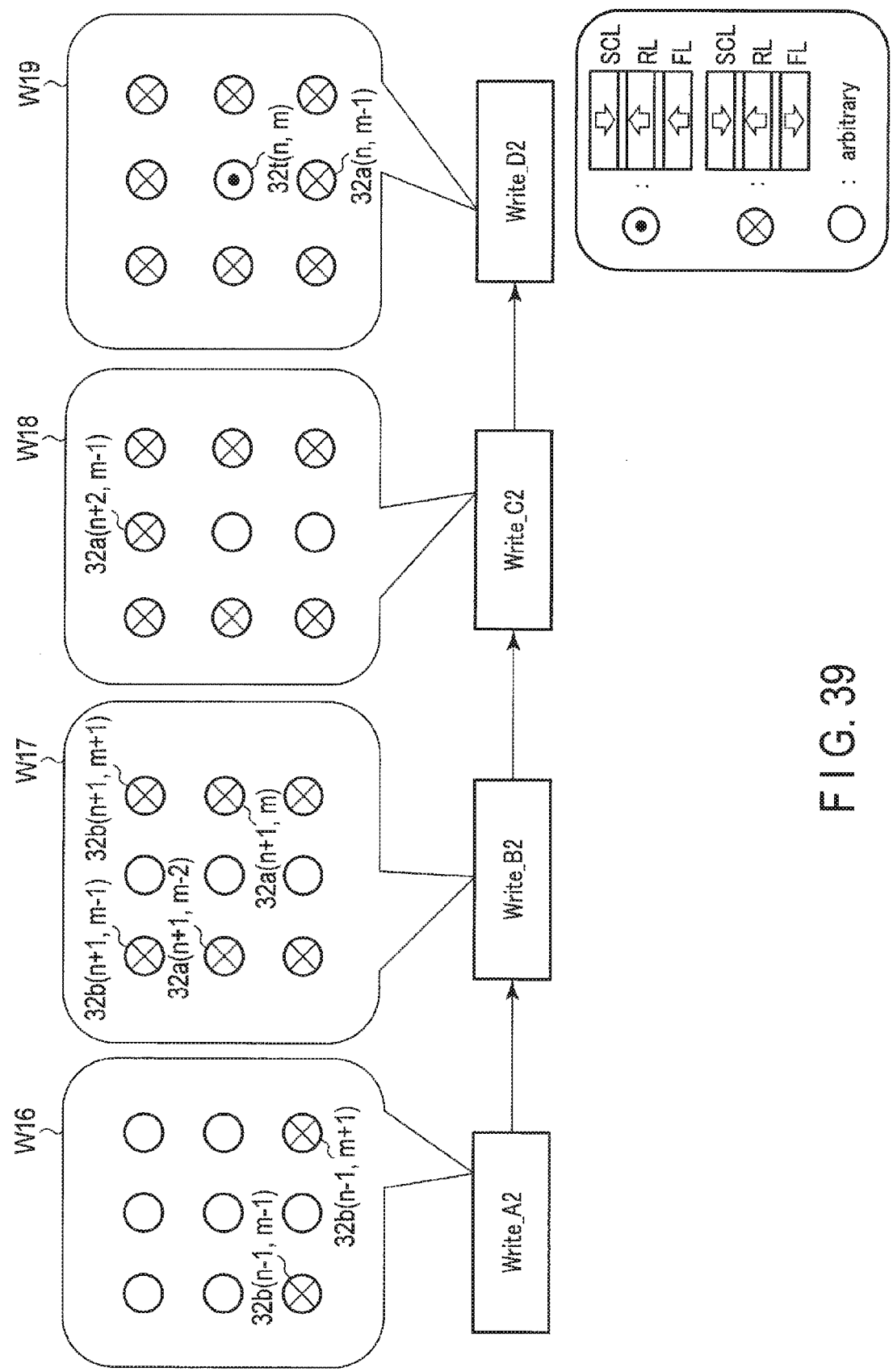
F I G. 39

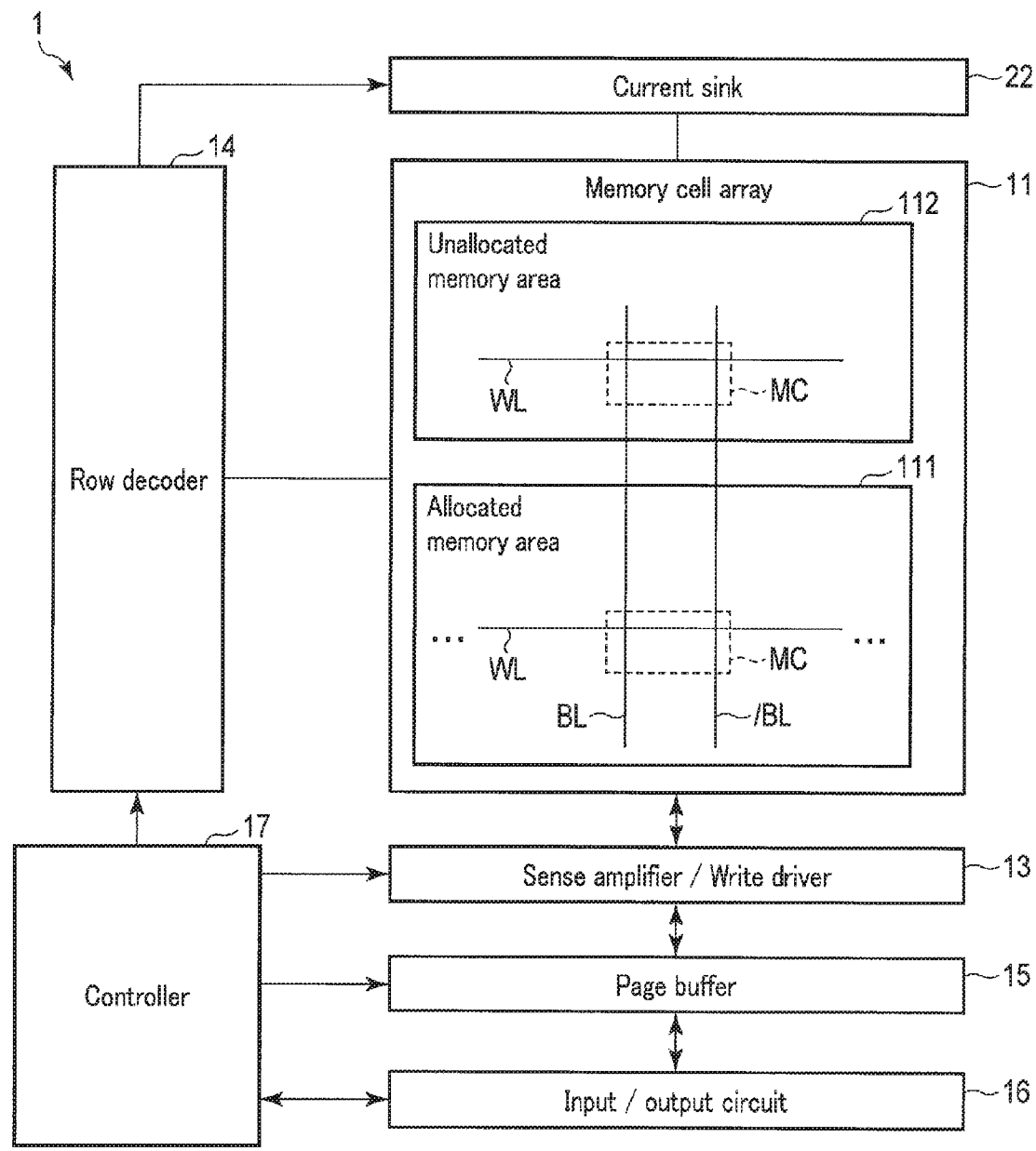
F I G. 41

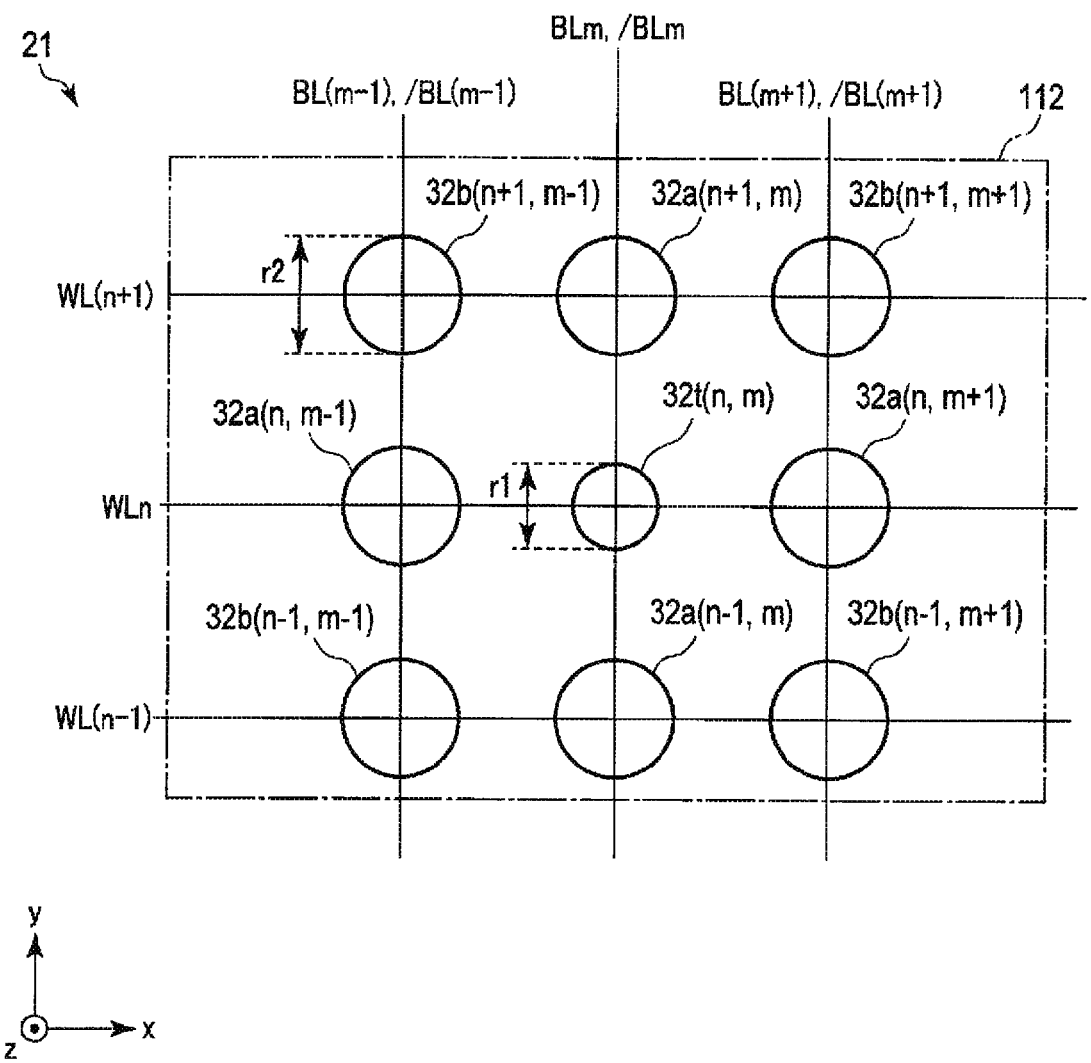
F I G. 42

MAGNETIC STORAGE DEVICE AND MEMORY SYSTEM

CROSS-REFERENCE TO RELATED APPLICATIONS

This application claims the benefit of U.S. Provisional Application No. 62/377,496, filed Aug. 19, 2016, the entire contents of which are incorporated herein by reference.

FIELD

Embodiments described herein relate generally to a magnetic storage device and a memory system.

BACKGROUND

As a storage device included in a memory system, a magnetic storage device (MRAM: Magnetoresistive Random Access Memory) using a magnetoresistive effect element as a storage element has been known.

The magnetic storage device is provided with a storage device such as a magnetoresistive effect element. The magnetoresistive effect element includes a free layer having a magnetization, a reference layer, and a tunnel barrier layer. The magnetoresistive effect element sets a magnetization orientation of the free layer such that the magnetization orientation is parallel or antiparallel to a magnetization orientation of the reference layer, for example, and thereby can hold data semipermanently. The magnetic storage device makes a magnetization reversal current flow through the magnetoresistive effect element, for example, and thereby sets a magnetization orientation of a free layer.

BRIEF DESCRIPTION OF THE DRAWINGS

FIG. 11 is a schematic view for explaining the write operation in the magnetic storage device according to the first embodiment;

FIG. 13 is a schematic view for explaining a state after the write operation for the magnetoresistive effect element of the magnetic storage device according to the first embodiment;

FIG. 16 is a command sequence showing the write operation in the magnetic storage device according to the second embodiment;

FIG. 19 is a command sequence showing a write operation in a magnetic storage device according to a third embodiment;

FIG. 21 is a command sequence showing a write operation in a magnetic storage device according to a fourth embodiment;

FIG. 23 is a command sequence showing a write operation in a magnetic storage device according to a fifth embodiment;

FIG. 25 is a command sequence showing a write operation in a magnetic storage device according to a sixth embodiment;

FIG. 26 is a timing chart showing the write operation in the magnetic storage device according to the sixth embodiment;

FIG. 27 is a command sequence showing a write operation in a magnetic storage device according to a seventh embodiment;

FIG. 29 is a command sequence showing a write operation in a magnetic storage device according to an eighth embodiment;

FIG. 30 is a timing chart showing the write operation in the magnetic storage device according to the eighth embodiment;

FIG. 33 is a schematic view for explaining the write operation in the magnetic storage device according to the second variation;

FIG. 34 is a schematic view for explaining the write operation in the magnetic storage device according to the second variation;

FIG. 37 is a schematic view for explaining the write operation in the magnetic storage device according to the third variation;

FIG. 38 is a command sequence showing the write operation in the magnetic storage device according to the third variation;

FIG. 39 is a schematic view for explaining the write operation in the magnetic storage device according to the third variation;

FIG. 41 is a block diagram showing a configuration of a magnetic storage device according to a fifth variation; and FIG. 42 is a top view showing a plane arrangement of a magnetoresistive effect element of the magnetic storage device according to the fifth variation.

DETAILED DESCRIPTION

Figure 1:
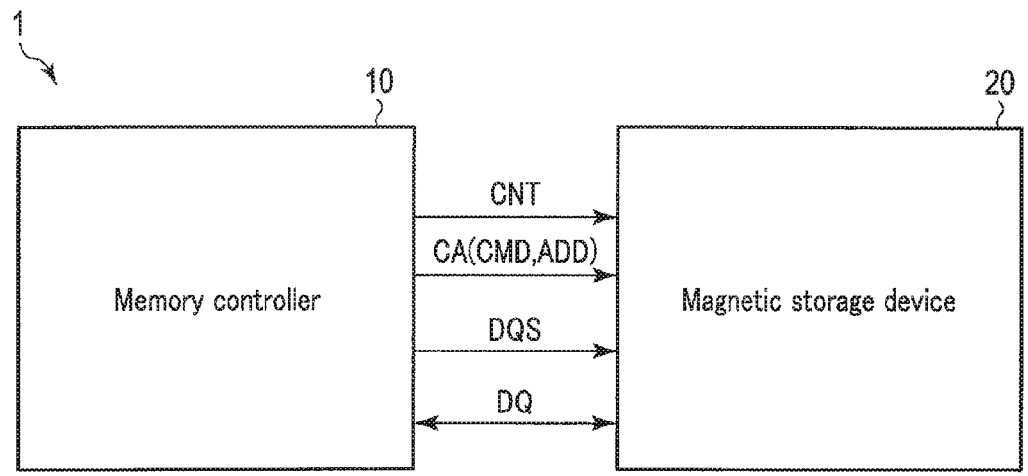
FIG. 1 is a block diagram showing a configuration of a memory system according to a first embodiment.

In general, according to an embodiment, a magnetic storage device includes a first magnetoresistive effect element, a second magnetoresistive effect element, a third magnetoresistive effect element, and a controller. The second magnetoresistive effect element and the third magnetoresistive effect element are in proximity to the first magnetoresistive effect element. When the controller receives a command which is associated with an operation of writing a first data item to the first magnetoresistive effect element, the controller is configured to perform a first operation of writing the first data item to the first magnetoresistive effect element, and a second operation of writing a second data item different from the first data item to the second magnetoresistive effect element and the third magnetoresistive effect element.

Hereinafter, embodiments will be described with reference to the drawings. Note that in the following description, the same reference numerals denote constituent elements having same functions and arrangements, and a repetitive description will be done only when needed. The embodiments to be described below merely exemplify devices and methods for embodying the technical concepts of the embodiments, and the materials, shapes, structures, layouts, and the like of the components are not limited to those to be described below. The technical concepts of the embodiments can variously be modified in the appended claims.

1. First Embodiment

A magnetic storage device according to a first embodiment will be described.
1.1 Configuration
1.1.1. Memory System
First, a configuration of a memory system according to a first embodiment will be described using FIG. 1. FIG. 1 is a block diagram showing a configuration of a memory system according to a first embodiment;

As shown in FIG. 1, a memory system 1 includes a memory controller 10 and a memory device (magnetic storage device) 20. The memory controller 10 and the magnetic storage device 20 are connected to each other, and various signals are transmitted and received therebetween. The various signals include, for example, a control signal CNT, a command address signal CA, a data strobe signal DQS, and a data signal DQ.

Specifically, for example, the control signal CNT is a signal allowing the memory controller 10 to control an operation of the magnetic storage device 20. The control signal CNT includes a clock signal, a clock enable signal, and a chip select signal (not shown), for example.

The command address signal CA includes a command CMD and an address ADD, for example. The command CMD shows a request for an operation with respect to the magnetic storage device 20. The command CMD is, for example, a signal allowing a magnetic storage device to shift to an active state or an idle state or a signal instructing data reading or data writing. The address ADD shows a memory cell to be operated and includes, for example, a row address and a column address.

The data strobe signal DQS is used for, for example, controlling an operation timing of the magnetic storage device 20 according to the data signal DQ. The data signal DQ includes write data written to the magnetic storage device 20 and read data read from the magnetic storage device 20.

1.1.2. Magnetic Storage Device

Next, a configuration of the magnetic storage device according to the first embodiment will be described. The magnetic storage device according to the first embodiment is a magnetic storage device of a perpendicular magnetization type using a magnetoresistive effect (MTJ: Magnetic Tunnel Junction) device as a storage device, for example.

Figure 2:
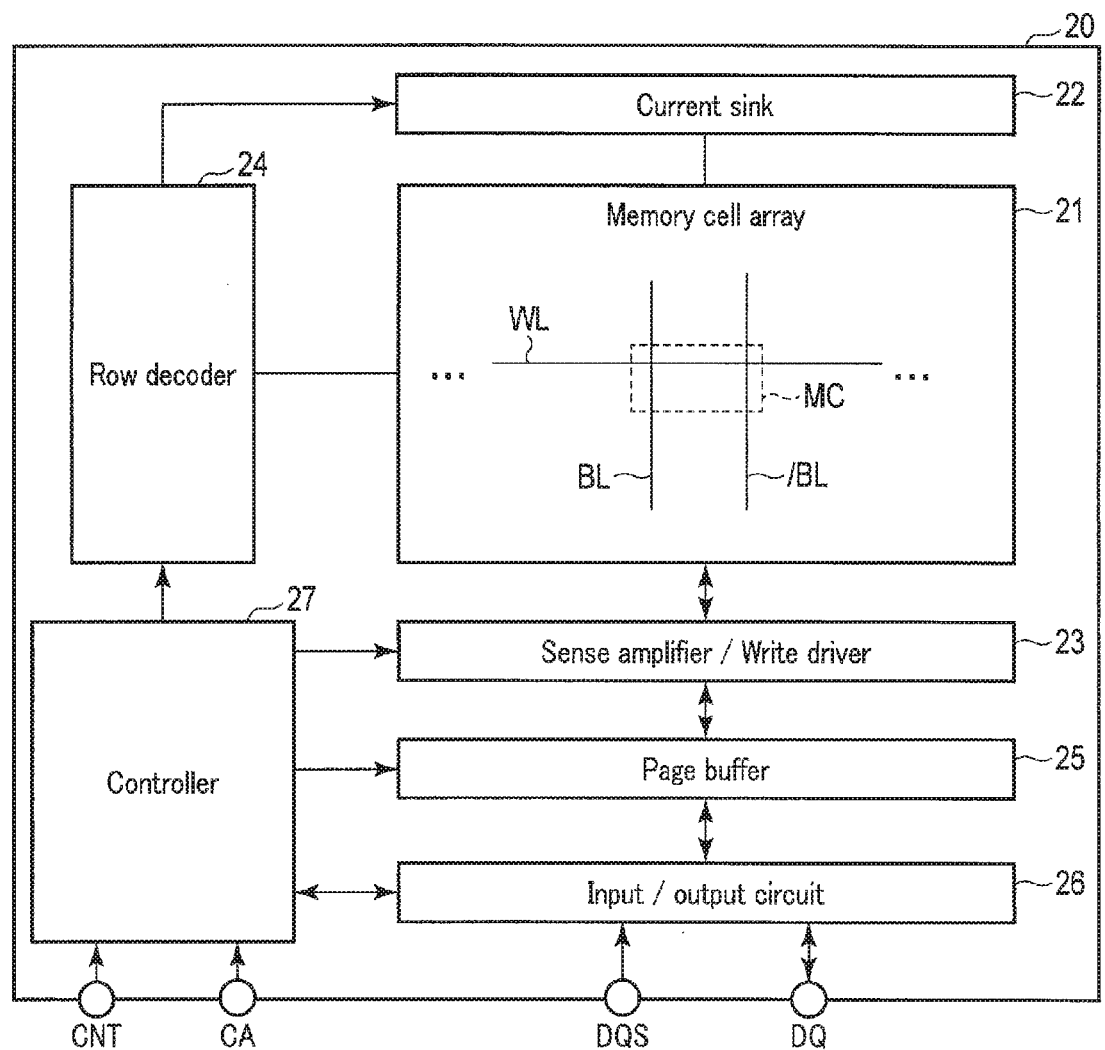
FIG. 2 is a block diagram showing a configuration of a magnetic storage device according to the first embodiment.

FIG. 2 is a block diagram showing a configuration of a magnetic storage device according to the first embodiment; As shown in FIG. 1, the magnetic storage device 20 is provided with a memory cell array 21, a current sink 22, a sense amplifier/write driver (SA/WD) 23, a row decoder 24, a page buffer 25, an input/output circuit 26, and a controller 27.

The memory cell array 21 is provided with a plurality of memory cells MC corresponding to rows and columns. For example, the memory cells MC on the same row are connected to the same word line WL, and both ends of the memory cell MC on the same column are connected to the same bit line BL and the same source line /BL.

The current sink 22 is connected to the bit line BL and the source line /BL. In the current sink 22, in operations such as data writing and data reading, the bit line BL or the source line /BL is fixed at the ground potential.

The SA/WD 23 is connected to the bit line BL and the source line /BL. The SA/WD 23 supplies a current to the memory cell MC to be operated through the bit line BL and the source line /BL and writes data to the memory cell MC. Further, the SA/WD 23 supplies a current to the memory cell MC to be operated through the bit line BL and the source line /BL and read data from the memory cell MC. More specifically, the write driver of the SA/WD 23 writes data to the memory cell MC, and the sense amplifier of the SA/WD 23 reads data from the memory cell MC.

The row decoder 24 is connected to the memory cell array 21 through the word line WL. The row decoder 24 decodes a row address designating the row direction of the memory cell array 21. Then, the row decoder 24 selects the word line WL in accordance with the decode result and applies a voltage required for operations, such as data writing and data reading, to the word line WL.

The page buffer 25 temporarily holds data written to the memory cell array 21 and data read from the memory cell array 21 in units of data called pages.

The input/output circuit 26 transmits the data strobe signal DQS and the data signal DQ received from the memory controller 10 to the controller 27 and the page buffer 25, respectively, and transmits various information from the controller 27 and the page buffer 25 to the memory controller 10 of the magnetic storage device 20.

The controller 27 is connected to the current sink 22, the SA/WD 23, the row decoder 24, the page buffer 25, and the input/output circuit 26. The controller 27 controls the current sink 22, the SA/WD 23, the row decoder 24, and the page buffer 25 in accordance with the control signal CNT and the command address signal CA received from the memory controller 10.

1.1.3. Configuration of Memory Cell

Figure 3:
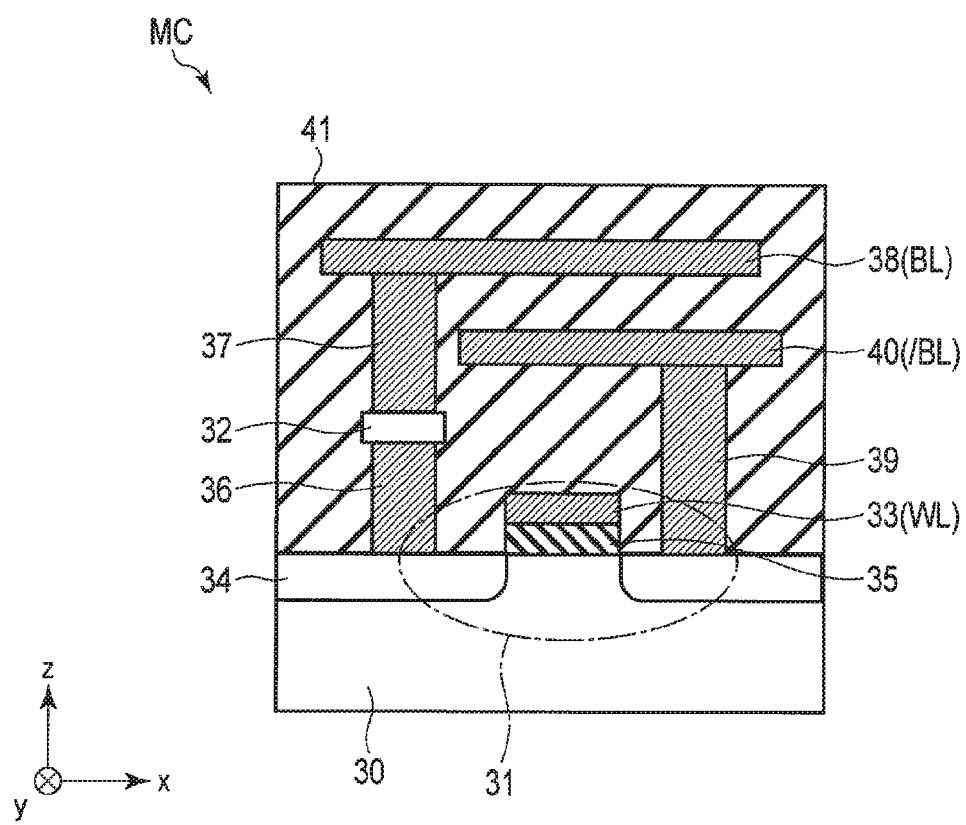
FIG. 3 is a cross-sectional view showing a configuration of a memory cell of the magnetic storage device according to the first embodiment.

Next, a configuration of the memory cell of the magnetic storage device according to the first embodiment will be described using FIG. 3. In the following description, a plane parallel to a semiconductor substrate 30 is defined as a xy plane, and an axis perpendicular to the xy plane is defined as a z axis. The x axis and the y axis are defined as axes vertical to each other in the xy plane. FIG. 3 shows an example of a cross-sectional view when the memory cell MC of the magnetic storage device 20 according to the first embodiment is cut in the xy plane.

As shown in FIG. 3, the memory cell MC is provided on the semiconductor substrate 30 and includes a select transistor 31 and a magnetoresistive effect element 32. The select transistor 31 is provided as a switch controlling supply of a current and stop of the supply of the current in data writing and reading to and from the magnetoresistive effect element 32. The magnetoresistive effect element 32 includes a plurality of stacked films and can switch a resistance value between a low resistance state and a high resistance state by making a current flow in a direction perpendicular to a film surface. The magnetoresistive effect element 32 can write data according to a change in the resistance state and functions as a storage device which holds written data in a nonvolatile manner and can read the written data.

The select transistor 31 includes a gate, connected to a wiring layer 33 functioning as the word line WL, and a pair of source regions or drain regions 34 provided on a surface of the semiconductor substrate 30 at both ends along the x direction of the gate. In the select transistor 31, a region included in the semiconductor substrate 30 is also referred as an active region. The active region is, for example, insulated from an active region of another memory cell MC by an element separation region (STI: Shallow trench isolation) (not shown) so as not to be electrically connected to the active region of another memory cell MC. The wiring layer 33 is provided along the y direction through an insulating film 35 on the semiconductor substrate 30 and is, for example, commonly connected to gates of the select transistors 31 (not shown) of other memory cells MC arranged along the y direction. The wiring layers 33 are arranged in the x direction, for example. One end of the select transistor 31 is connected onto a lower surface of the magnetoresistive effect element 32 through a contact plug 36 provided on the source region or drain region 34. A contact plug 37 is provided on a top surface of the magnetoresistive effect element 32. The magnetoresistive effect element 32 is connected to a wiring layer 38 functioning as the bit line BL through the contact plug 37. The wiring layer 38 extends in the x direction and is commonly connected to the other ends of the magnetoresistive effect elements 32 (not shown) of other memory cells MC arranged in the x direction, for example. The other end of the select transistor 31 is connected to a wiring layer 40 functioning as the source line /BL through a contact plug 39 provided on the source region or drain region 34. The wiring layer 40 extends in the x direction and is commonly connected to the other ends of the select transistors 31 (not shown) of other memory cells MC arranged in the x direction, for example. The wiring layers 38 and 40 are arranged in the y direction, for example. The wiring layer 38 is located above the wiring layer 40, for example. Although omitted in FIG. 3, the wiring layers 38 and 40 are arranged so as to avoid physical and electrical interference with each other. The select transistor 31, the magnetoresistive effect element 32, the wiring layers 33, 38, and 40, and the contact plugs 36, 37, and 39 are covered with an interlayer insulating film 41.

Other magnetoresistive effect elements 32 (not shown) arranged along the x direction or the y direction with respect to the magnetoresistive effect element 32 are provided on the same hierarchy, for example. Namely, in the memory cell array 21, the magnetoresistive effect elements 32 are arranged along a direction in which the semiconductor substrate 30 extends, for example.

1.1.4. Magnetoresistive Effect Element

Figure 4:
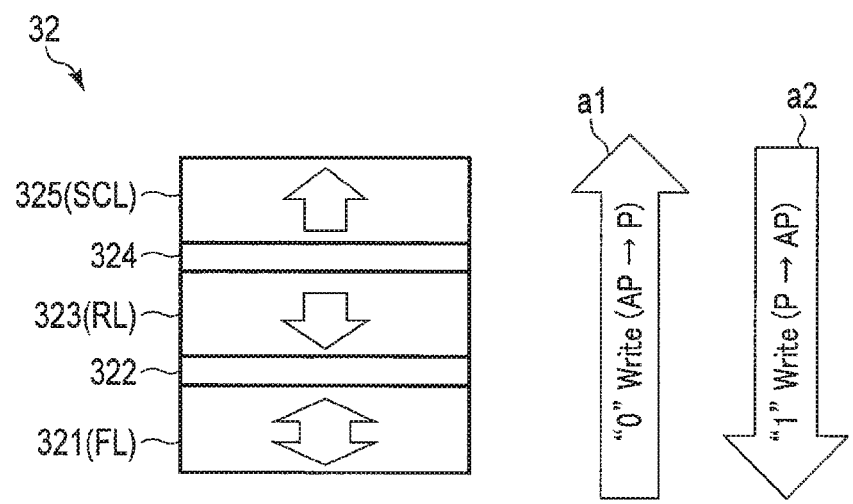
FIG. 4 is a cross-sectional view showing a configuration of a magnetoresistive effect element of the magnetic storage device according to the first embodiment.

Next, a configuration of the magnetoresistive effect element of the magnetic storage device according to the first embodiment will be described using FIG. 4. FIG. 4 is one example of a cross-sectional view showing a cross section where the magnetoresistive effect element of the magnetic storage device according to the first embodiment is taken along a plane perpendicular to the xy plane.

As shown in FIG. 4, the magnetoresistive effect element 32 includes a ferromagnetic layer 321 (FL) functioning as a free layer (storage layer), a non-magnetic layer 322 functioning as a tunnel barrier layer, a ferromagnetic layer 323 (RL) functioning as a reference layer, a non-magnetic layer 324 functioning as a middle layer, and a ferromagnetic layer 325 (SOL) functioning as a shift cancelling layer.

In the magnetoresistive effect element 32, a plurality of films are stacked in the z-axis direction in order of the ferromagnetic layer 321, the non-magnetic layer 322, the ferromagnetic layer 323, the non-magnetic layer 324, and the ferromagnetic layer 325 from the semiconductor substrate 30 side. The magnetoresistive effect element 32 is a perpendicular magnetization type MTJ element in which magnetization orientations of the ferromagnetic layers 321, 323, and 325 direct to the direction perpendicular to the film surface.

The ferromagnetic layer 321 is a ferromagnetic layer having an easy magnetization axis direction in a direction perpendicular to the film surface and contains, for example, cobalt iron boron (CoFeB) or iron boride (FeB). The ferromagnetic layer 321 has a magnetization orientation toward any of the semiconductor substrate 30 and the ferromagnetic layer 323. The magnetization orientation of the ferromagnetic layer 321 is set to be easily reversed as compared to the ferromagnetic layer 323.

The non-magnetic layer 322 is a non-magnetic insulating film and contains, for example, magnesium oxide (MgO).

The ferromagnetic layer 323 is a ferromagnetic layer having an easy magnetization axis direction in a direction perpendicular to the film surface and contains, for example, cobalt platinum (CoPt), cobalt-nickel (CoNi), or cobalt-palladium (CoPd). The magnetization orientation of the ferromagnetic layer 323 is fixed and directs toward the ferromagnetic layer 321, for example. The description that "the magnetization orientation is fixed" means that the magnetization orientation is not changed by a current having a magnitude capable of reversing the magnetization orientation of the ferromagnetic layer 321. The ferromagnetic layer 321, the non-magnetic layer 322, and the ferromagnetic layer 323 constitute a magnetic tunnel junction.

The non-magnetic layer 324 is a non-magnetic conductive film and contains, for example, ruthenium (Ru). The non-magnetic layer 324 antiferromagnetically bonds the ferromagnetic layer 323 and the ferromagnetic layer 325 such that the magnetization orientation of the ferromagnetic layer 323 and the magnetization orientation of the ferromagnetic layer 325 are stabilized in an antiparallel state. Such a connection structure among the ferromagnetic layer 323, the non-magnetic layer 324, and the ferromagnetic layer 325 is referred to as an SAF (Synthetic Anti-Ferromagnetic) structure.

The ferromagnetic layer 325 is a ferromagnetic layer having an easy magnetization axis direction in a direction perpendicular to the film surface and contains, for example, cobalt platinum (CoPt), cobalt-nickel (CoNi), or cobalt-palladium (CoPd). As described above, the ferromagnetic layer 325 is antiferromagnetically bonded to the ferromagnetic layer 323 under an environment in which a magnetic field is not applied from outside by the non-magnetic layer 324. Thus, the magnetization orientation of the ferromagnetic layer 325 is fixed to a direction antiparallel to the magnetization orientation of the ferromagnetic layer 223 and directs a direction opposite to the ferromagnetic layer 323 side, for example.

The first embodiment employs a spin injection write method in which a write current is directly applied to the magnetoresistive effect element 32, and the magnetization orientation of the ferromagnetic layer 321 is controlled by the write current. The magnetoresistive effect element 32 can take any of the low resistance state and the high resistance state according to whether a relative relationship between the magnetization orientations of the ferromagnetic layers 321 and 323 is parallel or antiparallel.

When a write current travelling in a direction of the arrow a1 in FIG. 4, that is, from the ferromagnetic layer 321 to the ferromagnetic layer 323 is applied to the magnetoresistive effect element 32, the relative relationship between the magnetization orientations of the ferromagnetic layers 321 and 323 becomes parallel. In this parallel state, the resistance value of the magnetoresistive effect element 32 is lowest, and the magnetoresistive effect element 32 is set to the low resistance state. The low resistance state is referred to as a "P (Parallel) state" and is prescribed as a state of data "0", for example.

When a write current travelling in a direction of the arrow a2 in FIG. 4, that is, from the ferromagnetic layer 323 to the ferromagnetic layer 321 is applied to the magnetoresistive effect element 32, the relative relationship between the magnetization orientations of the ferromagnetic layers 321 and 323 becomes antiparallel. In this antiparallel state, the resistance value of the magnetoresistive effect element 32 is highest, and the magnetoresistive effect element 32 is set to the high resistance state. The high resistance state is referred to as a "AP (Anti-Parallel) state" and is prescribed as a state of data "1", for example.

Although those resistance states of the magnetoresistive effect element 32 are held semipermanently, the resistance state may be reversed by external factors. Here, the difficulty of reversing the resistance state against external factors is referred to as "retention characteristics". The retention characteristics may be degraded or improved by the influence of a leakage magnetic field (stray field), for example.

1.1.5. Leakage Magnetic Field

Figure 5:
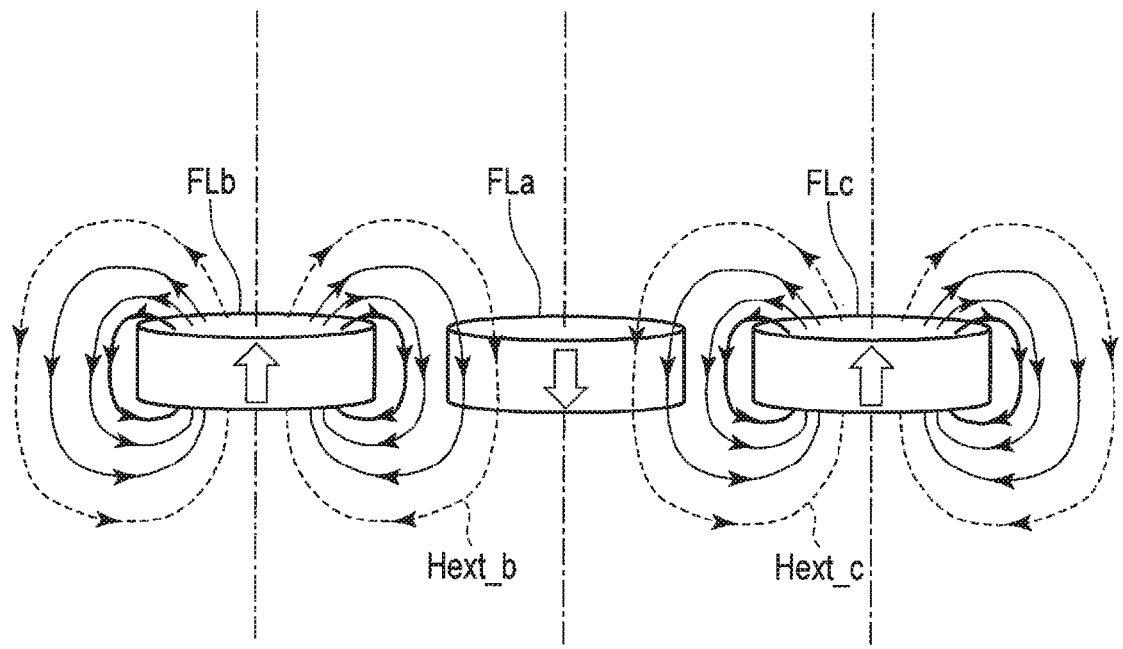
FIG. 5 is a schematic view for explaining a state of a leakage magnetic field acting on the magnetoresistive effect element of the magnetic storage device according to the first embodiment.
Figure 6:
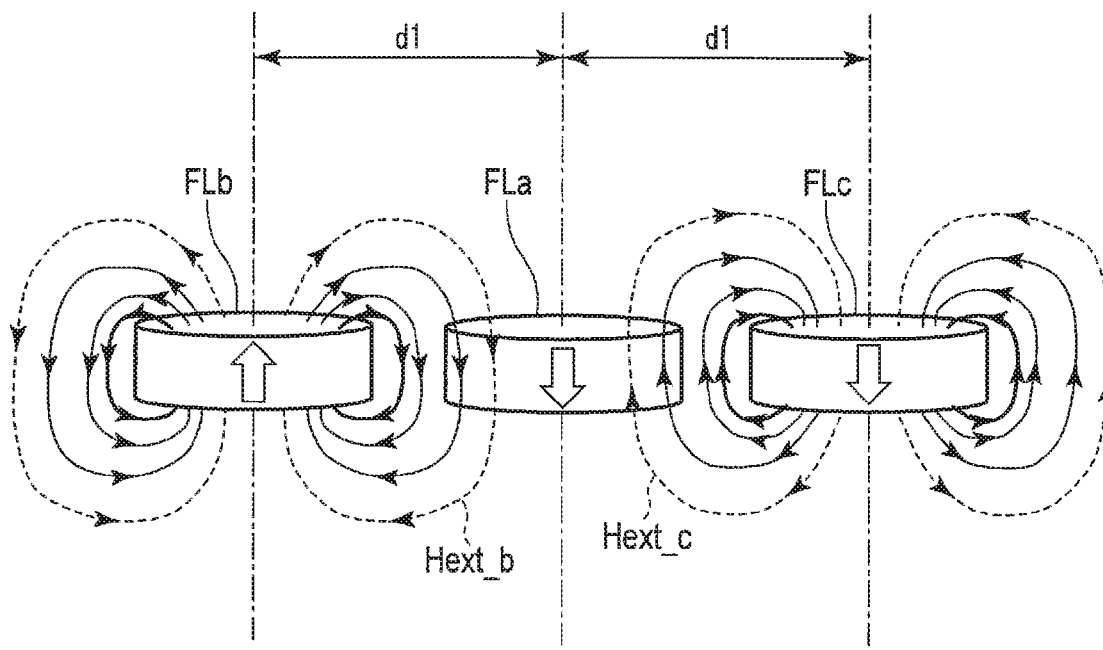
FIG. 6 is a schematic view for explaining a state of the leakage magnetic field acting on the magnetoresistive effect element of the magnetic storage device according to the first embodiment.
Figure 7:
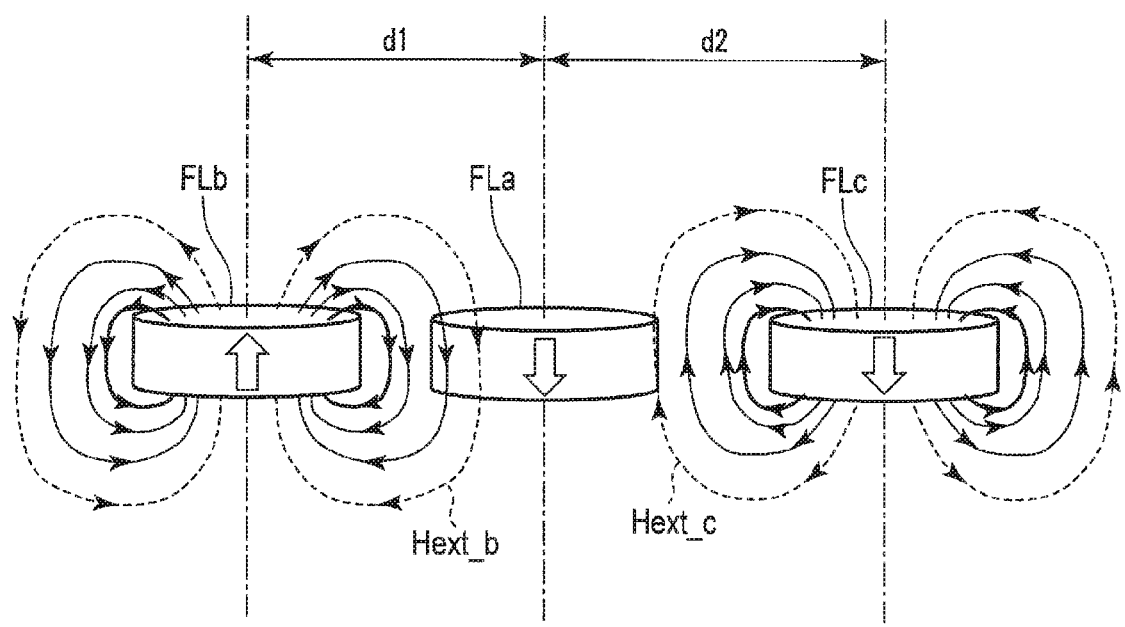
FIG. 7 is schematic view for explaining a state of the leakage magnetic field acting on the magnetoresistive effect element of the magnetic storage device according to the first embodiment.

FIGS. 5 to 7 are schematic views for explaining a state of the leakage magnetic field applied to a free layer of the magnetic storage device according to the first embodiment. FIGS. 5 to 7 show free layers FLa, FLb, and FLc provided in the respective three magnetoresistive effect elements 32. FIGS. 5 to 7 further show states of leakage magnetic fields Hext_b and Hext_c generated respectively from the free layers FLb and FLc. The free layer FLa adjacent to the free layers FLb and FLc. In FIGS. 5 to 7, other constituent elements of the magnetoresistive effect element 32 except for the free layers FLa, FLb, and FLc are omitted.

In the example of FIG. 5, the magnetization orientations of the free layers FLb and FLc are antiparallel to the magnetization orientation of the free layer FLa. In this case, the leakage magnetic fields Hext_b and Hext_c generated respectively from the free layers FLb and FLc act on the free layer FLa in a direction parallel to the magnetization orientation of the free layer FLa. Thus, the free layer FLa is strongly subjected to an influence in a direction in which the current magnetization orientation is maintained, from the leakage magnetic fields Hext_b and Hext_c. In this case, the leakage magnetic fields Hext_b and Hext_c may improve the retention characteristics of the free layer FLa.

In the example of FIG. 6, the magnetization orientation of the free layer FLb is antiparallel to the magnetization orientation of the free layer FLa. Thus, the leakage magnetic field Hext_b acts on the free layer FLa in the direction parallel to the magnetization orientation of the free layer FLa. On the other hand, the magnetization orientation of the free layer FLc is parallel to the magnetization orientation of the free layer FLa. Thus, the leakage magnetic field Hext_c acts on the free layer FLa in the direction antiparallel to the magnetization orientation of the free layer FLa. Namely, although the free layer FLa is subjected to an influence in a direction in which the retention characteristics of the free layer FLa are improved, from the leakage magnetic field Hext_b, the free layer FLa is subjected to an influence in a direction in which the retention characteristics of the free layer FLa are degraded, from the leakage magnetic field Hext_c.

The magnitude of the influence of the leakage magnetic field, generated from certain magnetization, on another magnetization depends on a distance from the certain magnetization to the another magnetization. Specifically, the closer the distance between magnetizations, the greater the influence of the leakage magnetic field.

In the example of FIG. 6, both of the free layers FLb and FLc are arranged on the same plane, away from the free layer FLa by the same distance d1. Thus, the magnitude of the influence of the leakage magnetic field Hext_b on the free layer FLa is substantially equal to the magnitude of the influence of the leakage magnetic field Hext_c on the free layer FLa. Accordingly, the influences of the leakage magnetic fields Hext_b and Hext_c on the free layer FLa are almost substantially cancelled. In this case, the influences of the leakage magnetic fields Hext_b and Hext_c on the retention characteristics of the free layer FLa are reduced to a negligible degree.

In the example of FIG. 7, the magnetization orientations of the free layers FLb and FLc are similar to those of the example of FIG. 6. However, the example of FIG. 7 differs from the example of FIG. 6 in that while the free layer FLb is disposed away from the free layer FLa by a distance d1, the free layer FLc is disposed away from the free layer FLa by a distance d2. Here, the distance d2 is larger than the distance d1. Namely, although the free layer FLa is subjected to influences in directions opposite to each other from the leakage magnetic fields Hext_b and Hext_c, the magnitude of the influence of the leakage magnetic field. Hext_c on the free layer FLa is smaller than the magnitude of the influence of the leakage magnetic field Hext_b on the free layer FLa. Thus, the free layer FLa may be more strongly subjected to the influence in the direction in which the current magnetization orientation is maintained, from the leakage magnetic fields Hext_b and Hext_c, as compared to an influence in a direction in which the current magnetization orientation is reversed. Namely, the free layer FLa is subjected to an influence in a direction in which the retention characteristics can be comprehensively improved, from the leakage magnetic fields Hext_b and Hext_c.

As described above, even in the magnetoresistive effect elements 32 are in proximity to each other, the magnitude of the influence of the leakage magnetic field may be different depending on the distance between the magnetoresistive effect elements 32. In the following description, the magnetoresistive effect element 32 which takes into account the influence of the leakage magnetic field on the magnetization orientation of the free layer FL is defined as a target magnetoresistive effect element 32t (not shown). The magnetoresistive effect element 32 in proximity to the target magnetoresistive effect element 32t is identified according to a distance from the target magnetoresistive effect element 32t. Specifically, the magnetoresistive effect element 32 located nearest to the target magnetoresistive effect element 32t is defined as a first nearest magnetoresistive effect element 32a (not shown). The magnetoresistive effect element 32 located nearest to the target magnetoresistive effect element 32t next to the first nearest magnetoresistive effect element 32a is defined as a second nearest magnetoresistive effect element 32b (not shown). The second nearest magnetoresistive effect element 32b and subsequent ones are similarly defined as a third nearest magnetoresistive effect element 32c (not shown) and a fourth nearest magnetoresistive effect element 32d (not shown), and the same applies to the following.

In the following description, as an example, a range of distances to the first nearest magnetoresistive effect element 32a and the second nearest magnetoresistive effect element 32b with respect to the target magnetoresistive effect element 32t is taken to be a "proximate" state. Further, in the following description, when the target magnetoresistive effect element 32t, the first nearest magnetoresistive effect element 32a, the second nearest magnetoresistive effect element 32b, and . . . are not particularly identified, they are merely described as the magnetoresistive effect elements 32.

1.1.6. Plane Arrangement of Magnetoresistive Effect Elements

Figure 8:
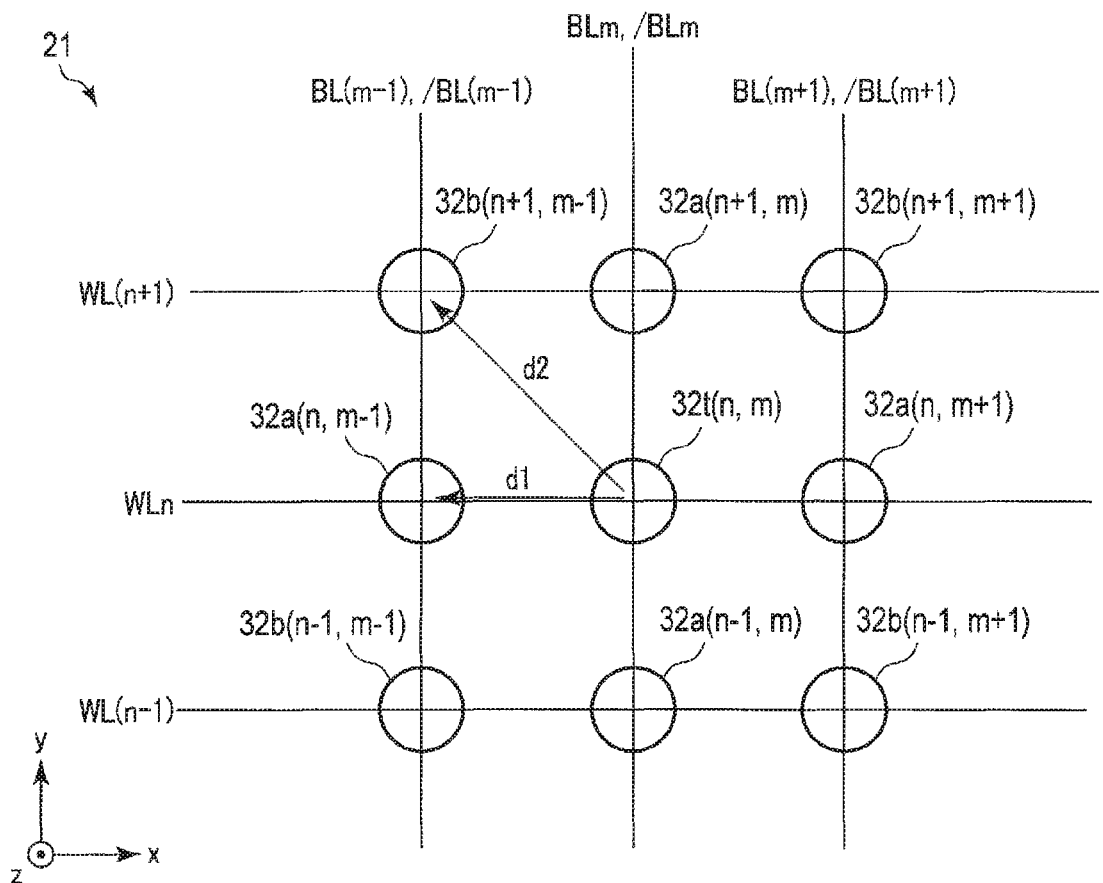
FIG. 8 is a top view showing a plane arrangement of the magnetoresistive effect element of the magnetic storage device according to the first embodiment.

Next, a plane arrangement of the magnetoresistive effect elements of the magnetic storage device according to the first embodiment will be described. FIG. 8 is a top view for explaining one example of the plane arrangement of the magnetoresistive effect elements of the magnetic storage device according to the first embodiment. FIG. 8 shows a state in which the memory cell array 21 is viewed down from above the semiconductor substrate 30. In FIG. 8, for ease of explanation, constituent elements other than the word lines WL, pairs of the bit lines BL and the source lines /BL, and the magnetoresistive effect elements 32 are omitted.

In the following description, the target magnetoresistive effect element 32t is assumed to be connected to the n-th word line WLn and a pair of the m-th bit line BLm and the m-th source line /BLm (n and m are natural numbers). The memory cell MC and the magnetoresistive effect element 32 connected to the n-th word line WLn and a pair of the m-th bit line BLm and the m-t source line /BLm are distinguished from others by assigning subscripts (n, m) according to need.

As shown in FIG. 8, the magnetoresistive effect elements 32 are rectangularly arranged on the xy plane. Namely, the magnetoresistive effect elements 32 are arranged at equal intervals d1 along the x-axis direction and the y-axis direction. The cross section in the xy plane of the magnetoresistive effect elements 32 has a circular shape, for example.

In the arrangement shown in FIG. 8, the target magnetoresistive effect element 32t(n, m) is in proximity to four first nearest magnetoresistive effect elements 32a(n, m−1), 32a(n, m+1), 32a(n−1, m), and 32a(n+1, m) and the four second nearest magnetoresistive effect elements 32b(n−1, m−1), 32b(n−1, m+1), 32b(n+1, m−1), and 32b(n+1, m+1). Specifically, a distance between the target magnetoresistive effect element 32t and the first nearest magnetoresistive effect element 32a is the distance d1. On the other hand, a distance between the target magnetoresistive effect element 32t and the second nearest magnetoresistive effect element 32b is the distance d2. The distance d2 corresponds to, for example, a length of a diagonal of a square whose one side is the distance d1.

The target magnetoresistive effect element 32t may be disposed at an edge or a corner of the above-described rectangular arrangement. When the magnetoresistive effect element 32 disposed at the edge of the arrangement is the target magnetoresistive effect element 32t, the target magnetoresistive effect element 32t is in proximity to the three first nearest magnetoresistive effect elements 32a and the two second nearest magnetoresistive effect elements 32b. When the magnetoresistive effect element 32 disposed at the corner of the arrangement is the target magnetoresistive effect element 32t, the target magnetoresistive effect element 32t is in proximity to the two first nearest magnetoresistive effect elements 32a and the second nearest magnetoresistive effect element 32b.

1.2 Write Operation

Next, a write operation in the magnetic storage device according to the first embodiment will be described.

1.2.1 Summary of Write Operation

Figure 9:
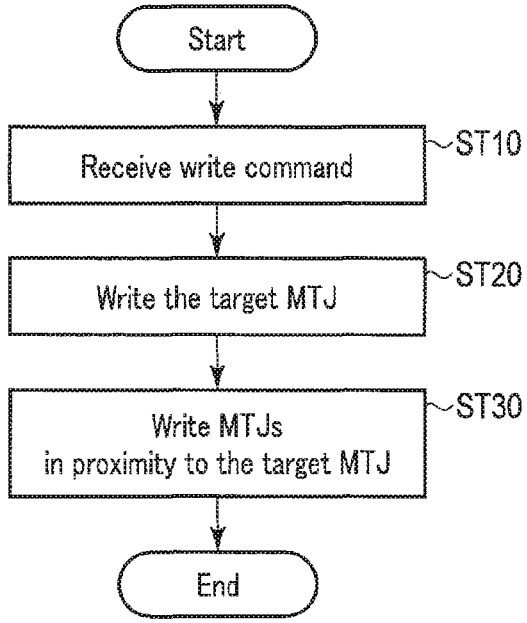
FIG. 9 is a flowchart showing a write operation in the magnetic storage device according to the first embodiment.

FIG. 9 is a flowchart for explaining a summary of the write operation in the magnetic storage device according to the first embodiment.

As shown in FIG. 9, the memory controller 10 issues a write command instructing the magnetic storage device 20 to write data. In step ST10, the input/output circuit 26 having received the write command transfers a write signal instructing data writing and an address of a write destination to the controller 27. Further, the input/output circuit 26 transmits data to be written to the page buffer 25.

The controller 27 executes the write operation for data transmitted to the page buffer 25 in accordance with the following steps ST20 and ST30, based on the write command and the address.

In step ST20, the controller 27 identifies the magnetoresistive effect element 32 of the memory cell MC, designated by the address, from the target magnetoresistive effect element 32t. The controller 27 executes data writing to the target magnetoresistive effect element 32t.

In step ST30, the controller 27 executes data writing to the magnetoresistive effect element 32 of the memory cell MC in proximity to the target magnetoresistive effect element 32t. Specifically, the controller 27 identifies the magnetoresistive effect element 32, which is in proximity to the target magnetoresistive effect element 32t, from the first nearest magnetoresistive effect element 32a or the second nearest magnetoresistive effect element 32b, for example. Then, the controller 27 executes data writing to the first nearest magnetoresistive effect element 32a and the second nearest magnetoresistive effect element 32b. The data written to the target magnetoresistive effect element 32t and inverted data are written to the first nearest magnetoresistive effect element 32a and the second nearest magnetoresistive effect element 32b.

Thus, the write operation is terminated.

1.2.2. Details of Write Operation

Next, details of the write operation in the magnetic storage device according to the first embodiment will be described using a command sequence.

Figure 10:
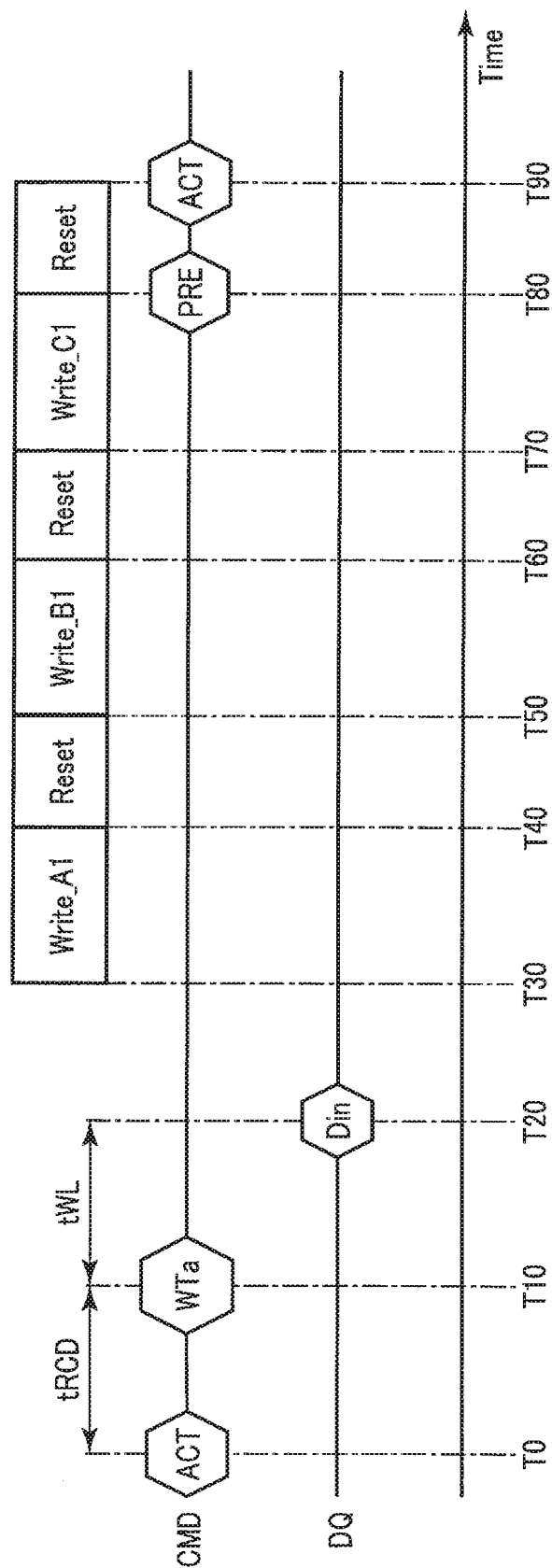
FIG. 10 is a command sequence showing the write operation in the magnetic storage device according to the first embodiment.

FIG. 10 is a command sequence for explaining the details of the write operation in the magnetic storage device according to the first embodiment. Hereinafter, there will be described a case where data "0" as write data is written to the target magnetoresistive effect element 32t, and data "1" as inverted data of the write data is written to the first nearest magnetoresistive effect element 32a and the second nearest magnetoresistive effect element 32b.

As shown in FIG. 10, the memory controller 10 issues an active command "ACT" at a time T0. The magnetic storage device 20 having received the active command "ACT" shifts to the active state. The row address is input from the memory controller 10 to the magnetic storage device 20 at a timing when the active command "ACT" is input, for example. The input row dress designates the row address of the target magnetoresistive effect element 32t, that is, an address of the word line WL connected to the target magnetoresistive effect element 32t. The controller 27 sets the input row address and transfers the row address to the row decoder 24.

The memory controller 10 issues a write command "WTa" at a time T10 after a lapse of a period tRCD (RAS to CAS delay) from the time T0. The write command "WTa" is a command for instructing execution of an operation of writing write data to a write target memory cell MC and then writing inverted data of the write data to the memory cell MC in proximity to the write target memory cell MC. The magnetic storage device 20 receives the write command "WTa" subsequent to the active command "ACT". The column address is input from the memory controller 10 to the magnetic storage device 20 at a timing when the write command "WTa" is input, for example. The input column address designates the column address of the target magnetoresistive effect element 32t, that is, addresses of the bit line BL and the source line /BL connected to the target magnetoresistive effect element 32t. The controller 27 sets the input column address and transfers the column address to the SA/WD 23.

Here, the period tRCD is a period from the reception of the active command "ACT" to the reception of the write command "WTa". RAS means a row address strobe, and CAS means a column address strobe.

The memory controller 10 outputs a data signal DQ (designated as Din in the figures subsequent to FIG. 10 and hereinafter referred to as a data signal Din) to the magnetic storage device 20 at a time T20 after a lapse of a period tWL (Write latency) from the time T10. The data signal Din designates data written to the target magnetoresistive effect element 32t, that is, the data. "0". The period tWL is a period from input of the write command "WTa" from the memory controller 10 to rising of the data strobe signal DQS (not shown) for outputting the data signal Din. The data signal Din is output to the memory controller 10 in accordance with a value of a predetermined burst length. In the example of FIG. 10, the case where the burst length is "1" is shown, and the data signal Din is output to the memory controller 10 throughout one cycle.

When the output of the data signal Din by the memory controller 10 is completed, the controller 27 starts a write operation of writing data to the memory cell array 21 at a time T30. The write operation includes, for example, a first write operation A1, a second write operation B1, and a third write operation C1 (in FIG. 10, the respective write operations are designated as Write_A1, Write_B1, and Write_C1).

The controller 27 starts the first write operation A1 at the time T30. In the first write operation A1, writing to the memory cell MC connected to the same word line WLn as the write target memory cell MC(n, m) is executed.

When data writing to the memory cell MC connected to the word line WLn is completed, the controller 27 makes setting of the row address invalid at a time T40 and terminates the first write operation A1. Subsequently, the controller 27 performs setting of the row address for starting a data write operation to the memory cell MC connected to a word line WL(n−1) and transfers the set row address to the row decoder 24.

The controller 27 starts the second write operation B1 at the time T50. In the second write operation B1, writing to the memory cell MC connected to the word line WL(n−1) adjacent to the word line WLn is executed.

When the data writing to the memory cell MC connected to the word line WL(n−1) is completed, the controller 27 makes the setting of the row address invalid at a time T60 and terminates the second write operation B1. Subsequently, the controller 27 performs setting of the row address for starting the data write operation to the memory cell MC connected to a word line WL(n+1) and transfers the set row address to the row decoder 24.

The controller 27 starts the third write operation C1 at a time T70. In the third write operation C1, writing to the memory cell MC connected to the word line WL(n+1) adjacent to the word line WLn is executed.

When the data writing to the memory cell MC connected to the word line WL(n+1) is completed, the memory controller 10 issues a precharge command "PRE" at a time T80 in the case of writing data to the target magnetoresistive effect element 32t connected to the word line WL other than the word line WLn. The controller 27 having received the precharge command "PRE" shifts from the active state to the idle state. Further, the controller 27 makes the setting of the row address invalid and terminates the third write operation C1.

The controller 27 may inhibit subsequent data writing to the target magnetoresistive effect element 32t to prevent further data writing to the target magnetoresistive effect element 32t. Further, the controller 27 may inhibit subsequent data writing to the first nearest magnetoresistive effect element 32a and the second nearest magnetoresistive effect element 32b to prevent further data writing to the first nearest magnetoresistive effect element 32a and the second nearest magnetoresistive effect element 32b.

The memory controller 10 can issue the active command "ACT" after a time T90 at which a precharge operation is completed.

Next, details of the first write operation A1, the second write operation B1, and the third write operation C1 will be described using FIG. 11. FIG. 11 is a schematic view for explaining details of the write operation in the magnetic storage device according to the first embodiment. FIG. 11 shows states of the target magnetoresistive effect element 32$t$, the first nearest magnetoresistive effect element 32$a$, and the second nearest magnetoresistive effect element 32$b$ to which data is written in each of the write operations A1 to C1.

As shown in FIG. 11, in the first write operation A1, the controller 27 identifies the magnetoresistive effect element 32($n$, $m$) in the write target memory cell MC from the target magnetoresistive effect element 32$t$. The controller 27 then executes writing of the data "0" to the target magnetoresistive effect element 32$t$($n$, $m$). Further, the controller 27 identifies magnetoresistive effect elements 32($n$, $m-1$) and 32($n$, $m+1$) in the memory cell MC, which are connected to the same word line WLn as the write target memory cell MC and are in proximity to the write target memory cell MC, from the first nearest magnetoresistive effect element 32$a$. The controller 27 then executes writing of the data "1" to first nearest magnetoresistive effect elements 32$a$($n$, $m-1$) and 32$a$($n$, $m+1$).

In the second write operation B1, the controller 27 identifies a magnetoresistive effect element 32($n-1$, $m$) in the memory cell MC, which is connected to the word line WL($n-1$) adjacent to the word line WLn and is in most proximity to the write target memory cell MC($n$, $m$), from the first nearest magnetoresistive effect element 32$a$. The controller 27 identifies magnetoresistive effect elements 32($n-1$, $m-1$) and 32($n-1$, $m+1$) in the memory cell MC, which are in most proximity to the target magnetoresistive effect element 32$t$ next to the first nearest magnetoresistive effect element 32$a$, from the second nearest magnetoresistive effect element 32$b$. The controller 27 then executes writing of the data "1" to the first nearest magnetoresistive effect element 32$a$($n-1$, $m$) and the second nearest magnetoresistive effect elements 32$b$($n-1$, $m-1$) and 32$b$($n-1$, $m+1$).

In the third write operation C1, the controller 27 identifies a magnetoresistive effect element 32($n+1$, $m$) in the memory cell MC, which is connected to the word line WL($n+1$) adjacent to the word line WLn and is in most proximity to the write target memory cell MC($n$, $m$), from the first nearest magnetoresistive effect element 32$a$. The controller 27 identifies magnetoresistive effect elements 32($n+1$, $m-1$) and 32($n+1$, $m+1$) in the memory cell MC, which are in most proximity to the target magnetoresistive effect element 32$t$ next to the first nearest magnetoresistive effect element 32$a$, from the second nearest magnetoresistive effect element 32$b$. The controller 27 then executes writing of the data "1" to the first nearest magnetoresistive effect element 32$a$($n+1$, $m$) and the second nearest magnetoresistive effect elements 32$b$($n+1$, $m-1$) and 32$b$($n+1$, $m+1$).

Figure 12:
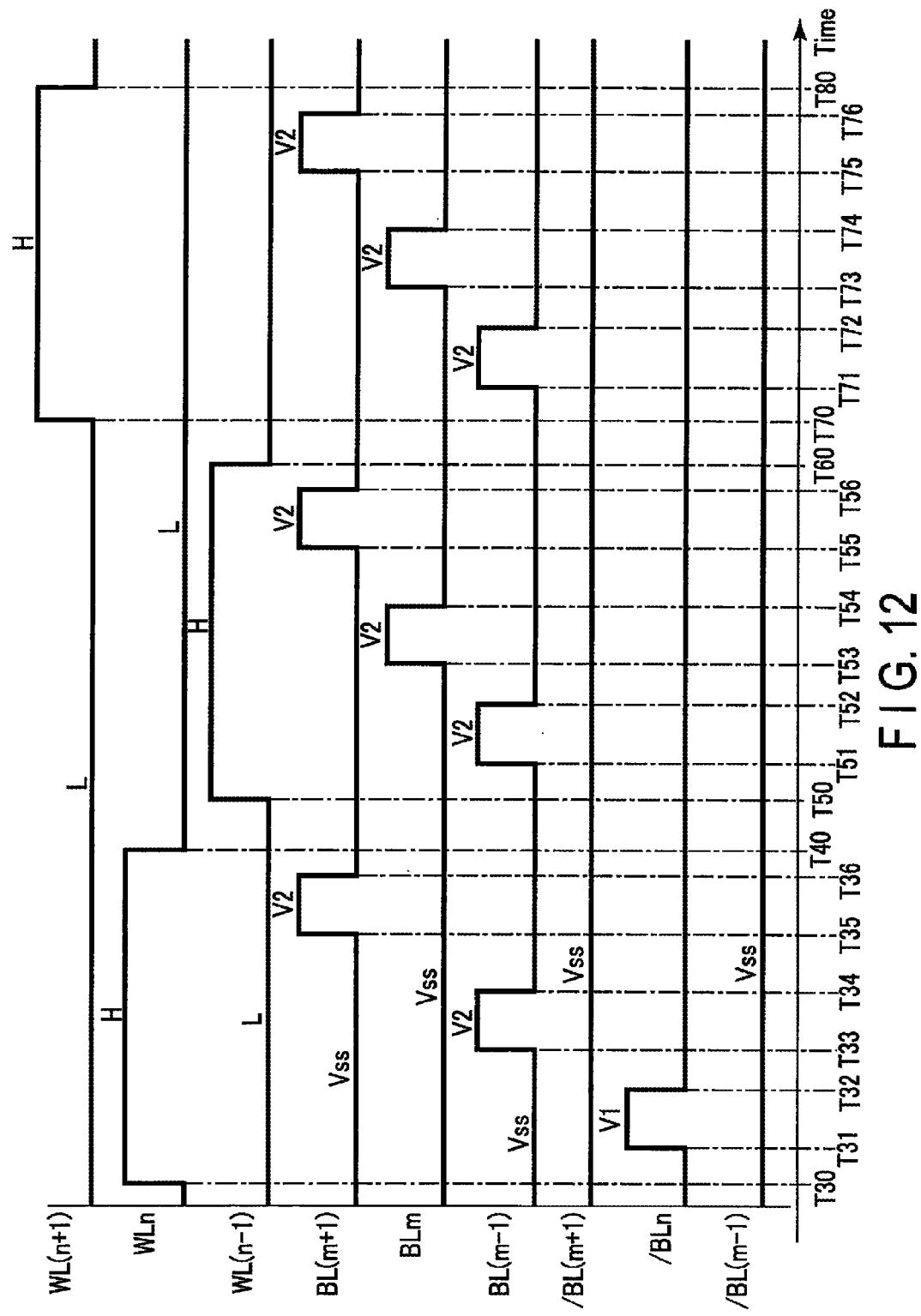
FIG. 12 is a timing chart showing the write operation in the magnetic storage device according to the first embodiment.

Next, details of the write operation in the magnetic storage device according to the first embodiment will be described using FIG. 12. FIG. 12 is a timing chart for explaining the details of the write operation in the magnetic storage device according to the first embodiment.

As shown in FIG. 12, the row decoder 24 selects the word line WLn in a write target row in accordance with the decode result of the row address at the time T30 and transfers a high potential ("H (High)" level) voltage required for the data write operation. Accordingly, the select transistor 31 of the memory cell MC connected to the word line WLn is switched to an on state. The row decoder 24 transfers a low potential ("L (Low)" level) voltage to the unselected word lines WL (such as the word lines WL($n-1$) and WL($n+1$)). Accordingly, the select transistor 31 of the memory cell MC connected to the word lines WL($n-1$) and WL($n+1$) is switched to an off state. The voltage of the "H" level has a value at which a current for thus switching the select transistor 31 to the on state is applied, and the voltage of the "L" level has a value at which a current for switching the select transistor 31 to the off state is applied.

At a time T31, the SA/WD 23 selects the bit line BLm and the source line /BLm in a write target column in accordance with the decode result of the column address. The SA/WD 23 writes data, held in the page buffer 25, to the memory cell MC($n$, $m$), based on the write signal. Specifically, the SA/WD 23 transfers the voltage V1 to the source line /BLm connected to the memory cell MC($n$, $m$) and transfers a grounded voltage Vss to the bit line BLm. The voltage Vss is transferred to an unselected pair of the bit line BL and the source line /BL (such as a pair of a bit line BL($m-1$) and a source line /BL($m-1$) and a pair of a bit line BL($m+1$) and a source line /BL($m+1$)). Consequently, a current flows from the source line /BLm to the bit line BLm, and the data "0" is written to the selected memory cell MC($n$, $m$). The voltage V1 has a value at which a current for thus writing the data "0" to the memory cell MC is applied. The voltage V1 is a voltage level transferred when a current for writing the data "0" to the magnetoresistive effect element 32 is applied in a usual ite operation in a case where the write command "WTa" is not received.

After completion of the writing of the data "0" to the memory cell MC($n$, $m$), the SA/WD 23 transfers the voltage Vss to the source line /BLm at a time T32.

At a time T33, the SA/WD 23 selects the bit line BL($m-1$) and the source line /BL($m-1$) and selects a memory cell MC($n$, $m-1$). The SA/WD 23 writes inverted data of data, held in the page buffer 25, to the memory cell MC($n$, $m-1$). Specifically, the SA/WD 23 transfers a voltage V2 to the bit line BA ($m-1$) connected to the memory cell MC($n$, $m-1$) and transfers the voltage Vss to the source line /BL($m-1$). The voltage Vss is transferred to an unselected pair of the bit line BL and the source line /BL (such as a pair of the bit line BLm and the source line /BLm and a pair of the bit line BL($m+1$) and the source line /BL($m+1$)). Consequently, a current flows from the bit line BL($m-1$) to the source line /BL($m-1$), and the data "1" is written to the selected memory cell MC($n$, $m-1$). The voltage V2 has a value at which a current for thus writing the data "1" to the memory cell MC is applied. The voltage V2 is a voltage level transferred when a current for writing the data "1" to the magnetoresistive effect element 32 is applied in a usual write operation in the case where the write command "WTa" is not received.

After completion of the writing of the data "1" to the memory cell MC($n$, $m-1$), the SA/WD 23 transfers the voltage Vss to the bit line BL($m-1$) at a time T34.

At a time T35, the SA/WD 23 selects the bit line BL($m+1$) and the source line /BL($m+1$) and selects a memory cell MC($n$, $m+1$). The SA/WD 23 writes inverted data of data, held in the page buffer 25, to the memory cell MC($n$, $m+1$). Specifically, the SA/WD 23 transfers the voltage V2 to the bit line BL($m+1$) connected to the memory cell MC($n$, $m+1$) and transfers the voltage Vss to the source line /BL($m+1$). The voltage Vss is transferred to an unselected pair of the bit line BL and the source line /BL(such as a pair of the bit line BL($m-1$) and the source line /BL($m-1$) and a pair of the bit line BLm and the source line /BLm). Consequently, a current flows from the bit line BL(m+1) to the source line /BL(m+1), and the data "1" is written to the selected memory cell MC(n, m+1).

After completion of the writing of the data "1" to the memory cell MC(n, m+1), the SA/WD 23 transfers the voltage Vss to the bit line BL(m+1) at a time T36.

The order of writing to the memory cells MC(n, m−1) and MC(n, m+1) is not limited thereto, and writing may be performed in an opposite order.

After completion of the writing of the data "0" to the memory cell MC(n, m) and the writing of the data "1" to the memory cells MC(n, m−1) and MC(n, m+1), the row decoder 24 transfers the voltage of the "L" level to the word line WLn at the time T40. Accordingly, the select transistor 31 of the memory cell MC connected to the word line WLn is switched to the off state.

At a time T50, the row decoder 24 selects the word line WL(n−1) adjacent to the word line WLn and transfers the voltage of the "H" level. Accordingly, the select transistor 31 of the memory cell MC connected to the word line WL(n−1) is switched to the on state. The row decoder 24 transfers the voltage of the "L" level to the unselected word lines WL (such as the word lines WLn and WL(n+1)). Accordingly, the select transistor 31 of the memory cell MC connected to the word lines WLn and WL(n+1) switched to the off state.

At a time T51, the SA/WD 23 selects a pair of the bit line BL(m−1) and the source line /BL(m−1) and selects a memory cell M (n−1, m+1). The SA/WD 23 writes inverted data of data, held in the page buffer 25, to the memory cell MC(n−1, m−1). Specifically, the SA/WD 23 transfers the voltage V2 to the bit line BL(m−1) connected to the memory cell MC(n−1, m−1) and transfers the voltage Vss to the source line /BL(m−1). The voltage Vss is transferred to an unselected pair of the bit line BL and the source line /BL (such as a pair of the bit line BLm and the source line /BLm and a pair of the bit line BL(m+1) and the source line /BL(m+1)). Consequently, a current flows from the bit line BL(m−1) to the source line /BL(m−1), and the data "1" is written to the selected memory cell MC(n−1, m−1).

After completion of the writing of the data "1" to the memory cell MC(n−1, m−1), the SA/WD 23 transfers the voltage Vss to the bit line BL(m−1) at a time T52.

At a time T53, the SA/WD 23 selects a pair of the bit line BLm and the source line /BLm and selects a memory cell MC(n−1, m). The SA/WD 23 writes inverted data of data, held in the page buffer 25, to the memory cell MC(n−1, m). Specifically, the SA/WD 23 transfers the voltage V2 to the bit line BLm connected to the memory cell MC(n−1, m) and transfers the voltage Vss to the source line /BLm. The voltage Vss is transferred to an unselected pair of the bit line BL and the source line /BL (such as a pair of a bit line BL(m−1) and a source line /BL(m−1) and a pair of a bit line BL(m+1) and a source line /BL(m+1)). Consequently, a current flows from the bit line BLm to the source line /BLm, and the data "1" is written to the selected memory cell MC(n−1, m).

After completion of the writing of the data "1" to the memory cell MC(n−1, m), the SA/WD 23 transfers the voltage Vss to the bit line BLm at a time T54.

At a time T55, the SA/WD 23 selects the pair of the bit line BL(m+1) and the source line /BL(m+1) and selects a memory cell MC(n−1, m−1). The SA/WD 23 writes inverted data of data, held in the page buffer 25, to the memory cell MC(n−1, m+1). Specifically, the SA/WD 23 transfers the voltage V2 to the bit line BL(m+1) connected to the memory cell MC(n−1, m+1) and transfers the voltage Vss to the source line /BL(m+1). The voltage Vss is transferred to an unselected pair of the bit line BL and the source line /BL (such as the pair of the bit line BL(m−1) and the source line /BL(m−1) and the pair of the bit line BLm and the source line /BLm). Consequently, a current flows from the bit line BL(m+1) to the source line /BL(m+1), and the data "1" is written to the selected memory cell MC(n−1, m+1).

After completion of the writing of the data "1" to the memory cell MC(n−1, m+1), the SA/WD 23 transfers the voltage Vss to the bit line BL(m+1) at a time T56.

The order of writing to the memory cells MC(n−1, m−1), MC(n−1, m), and MC(n−1, m−+1) is not limited thereto, and writing may be performed in any order.

After completion of the writing of the data "1" to the memory cells MC(n−1, m−1), MC(n−1, m), and MC(n−1, m−+1), the row decoder 24 transfers the voltage of the "L" level to the word line WL(n−1) at a time T60. Accordingly, the select transistor 31 of the memory cell MC connected to the word line WL(n−1) is switched to the off state.

At a time T70, the row decoder 24 selects the word line WL(n+1) adjacent to the word line WLn and transfers the voltage of the "H" level. Accordingly, the select transistor 31 of the memory cell MC connected to the word line WL(n+1) is switched to the on state. The row decoder 24 transfers the voltage of the "L" level to the unselected word lines WL (such as the word lines WL(n−1) and WLn). Accordingly, the select transistor 31 of the memory cell MC connected to the word lines WL(n−1) and WLn is switched to the off state.

At a time T71, the SA/WD 23 selects the pair of the bit line BL(m−1) and the source line /BL(m−1) and selects a memory cell MC(n+1, m−1). The SA/WD 23 writes inverted data of data, held in the page buffer 25, to the memory cell MC(n+1, m−1). Specifically, the SA/WD 23 transfers the voltage V2 to the bit line BL(m−1) connected to the memory cell MC(n+1, m−1) and transfers the voltage Vss to the source line /BL(m−1). The voltage Vss is transferred to an unselected pair of the bit line BL and the source line /BL (such as the pair of the bit line BLm and the source line /BLm and the pair of the bit line BL(m+1) and the source line /BL(m+1)). Consequently, a current flows from the bit line BL(m−1) to the source line /BL(m−1), and the data "1" is written to the selected memory cell MC(n+1, m−1).

After completion of the writing of the data "1" to the memory cell MC(n+1, m−1), the SA/WD 23 transfers the voltage Vss to the bit line BL(m−1) at a time T72.

At a time T73, the SA/WD 23 selects a pair of the bit line BLm and the source line /BLm and selects a memory cell MC(n+1, m). The SA/WD 23 writes inverted data of data, held in the page buffer 25, to the memory cell MC(n+1, m). Specifically, the SA/WD 23 transfers the voltage V2 to the bit line BLm connected to the memory cell MC(n+1, m) and transfers the voltage Vss to the source line /BLm. The voltage Vss is transferred to an unselected pair of the bit line BL and the source line /BL (such as the pair of the bit line BL(m−1) and the source line /BL(m−1) and the pair of the bit line BL(m+1) and the source line /BL(m+1)). Consequently, a current flows from the bit line BLm to the source line /BLm, and the data "1" is written to the selected memory cell MC(n+1, m).

After completion of the writing of the data "1" to the memory cell FDIC (n+1, m), the SA/WD 23 transfers the voltage Vss to the bit line BLm at a time T74.

At a time T75, the SA/WD 23 selects the pair of the bit line BL(m+1) and the source line /BL(m+1) and selects a memory cell MC(n+1, m+1). The SA/WD 23 writes inverted data of data, held in the page buffer 25, to the memory cell MC(n+1, m+1). Specifically, the SA/WD 23 transfers the voltage V2 to the bit line BL(m+1) connected to the memory cell MC(n+1, m+1) and transfers the voltage Vss to the source line /BL(m+1). The voltage Vss is transferred to an unselected pair of the bit line BL and the source line /BL (such as a pair of the bit line BL(m−1) and the source line /BL(m−1) and a pair of the bit line BLm and the source line /BLm). Consequently, a current flows from the bit line BL(m+1) to the source line /BL(m+1), and the data "1" is written to the selected memory cell MC(n+1, m+1).

After completion of the writing of the data "1" to the memory cell MC(n+1, m+1), the SA/WD 23 transfers the voltage Vss to the bit line BL(m+1) at a time T76.

The order of writing to the memory cells MC(n+1, m−1), MC(n+1, m), and MC(n+1, m+1) is not limited thereto, and writing may be performed in any order.

After completion of the writing of the data "1" to the memory cells MC(n+1, m−1), MC(n+1, m), and MC(n+1, m+1), the row decoder 24 transfers the voltage of the "L" level to the word line WL(n+1) at a time T80. Accordingly, the select transistor 31 of the memory cell MC connected to the word line WL(n+1) is switched to the off state.

The order of writing to the memory cell MC connected to the word line WL(n−1) and the memory cell MC connected to the word line WL(n+1) is not limited thereto, and writing may be performed in an opposite order.

According to the above operations, data inverted from each other can be written to the target magnetoresistive effect element 32t and the first nearest magnetoresistive effect element 32a and the second nearest magnetoresistive effect element 32b, which are in proximity to the target magnetoresistive effect element 32t, by a one-time write operation.

Although FIGS. 10 to 12 show the case where the burst length is "1", the burst length can be set to any value. When the burst length is not less than "2", write data may be continuously written to the same word line WLn, for example.

FIG. 13 is a schematic view for explaining a state of the memory cell array after data writing in the magnetic storage device according to the first embodiment. FIG. 13 shows a state in which the magnetization orientation of the free layer FL after the data write operation in which the burst length is "2" is viewed from the z-axis direction.

As shown in FIG. 13, the data "0" as write data is written to the target magnetoresistive effect elements 32t(n, m) and 32t(n, m+2) in the two memory cells MC. The data "1" as inverted data of the write data is written to the first nearest magnetoresistive effect elements 32a(n, m−1), 32a(n, m+1), 32a(n, m+3), 32a(n−1, m), 32a(n−1, m+2), 32a(n+1, m), and 32a(n+1, m+2) in proximity to the two target magnetoresistive effect elements 32t and the second nearest magnetoresistive effect elements 32b(n−1, m−1), 32b(n−1, m+1), 32b (n−1, m+3), 32b(n+1, m−1), 32b(n+1, m+1), and 32b(n+1, m+3).

As described above, when the two magnetoresistive effect elements 32 have the same data, the leakage magnetic field from the free layer FL in one of the magnetoresistive effect elements degrades the retention characteristics of data held by the other magnetoresistive effect element. Thus, when the two target magnetoresistive effect elements 32t have the same data, it is desirable that the two target magnetoresistive effect elements 32t are arranged so as not to be in proximity to each other. Namely, it is desirable that the two target magnetoresistive effect elements 32t hold at least one the first nearest magnetoresistive effect element 32a or the second nearest magnetoresistive effect element 32b.

When the two target magnetoresistive effect elements 32t have the same data, the first nearest magnetoresistive effect element 32a or the second nearest magnetoresistive effect element may be shared by the two target magnetoresistive effect elements 32t. In the example of FIG. 12, the first nearest magnetoresistive effect element 32a(n, m+1) and the second nearest magnetoresistive effect elements 32b(n−1, m+1) and 32b(n+1, m+1) are shared by the target magnetoresistive effect elements 32t(n, m) and 32t(n, m+2).

1.3 Effects According to the Present Embodiment

Various kinds of data are stored in the magnetic storage device. The magnetic storage device stores management information required for manufacturers' management of the magnetic storage device before shipment, for example. Examples of the management information include security information regarding the magnetic storage device and information regarding assignment of functions and/or roles in the memory cell array. Further, the magnetic storage device stores setting information required for managing and controlling other connection devices and an interface with them after shipment and before provision to users. Examples of the setting information include BIOS (Basic Input Output System). Furthermore, after provision to users, the magnetic storage device stores particularly user information that a user does not want to lose. Examples of the user information include motion pictures and images. In the memory cell to which the management information, the setting information, and the user information are written, writing is inhibited to prevent data from being overwritten, or although writing is not inhibited, data is protected from loss. In either case, the memory cell to which the management information, the setting information, and the user information are written requires high retention characteristics.

The retention characteristics of the magnetoresistive effect element can be evaluated by a thermal stability factor Δ shown by the following formula (1).

$$\Delta = \frac{\Delta E}{k_B T} = \frac{M_S H_k^{eff} V}{2 k_B T} \tag{1}$$

Here, $k_B$ is a Boltzmann constant, T is a temperature, and ΔE is an energy barrier. $M_s$ is saturation magnetization of the free layer, $H_k^{eff}$ is an effective anisotropy energy, and V is a volume of the free layer.

As shown in the formula (1), the thermal stability factor Δ is, for example, proportional to the volume, V of the free layer and inversely proportional to the temperature T. As described above, it is known that the thermal stability factor Δ tends to be degraded as the temperature T becomes higher and as the volume V of the free layer becomes smaller.

On the other hand, since the temperature T depends on operation environments, it is difficult to control the temperature T. Miniaturization of the magnetic storage device progresses with increase in the degree of integration, and the volume V tends to be reduced. As described above, since the thermal stability factor Δ tends to be degraded with miniaturization, it is desirable that the thermal stability factor Δ and, furthermore, the retention characteristics are improved by adjusting other coefficients (for example, the energy barrier ΔE).

Figure 14:
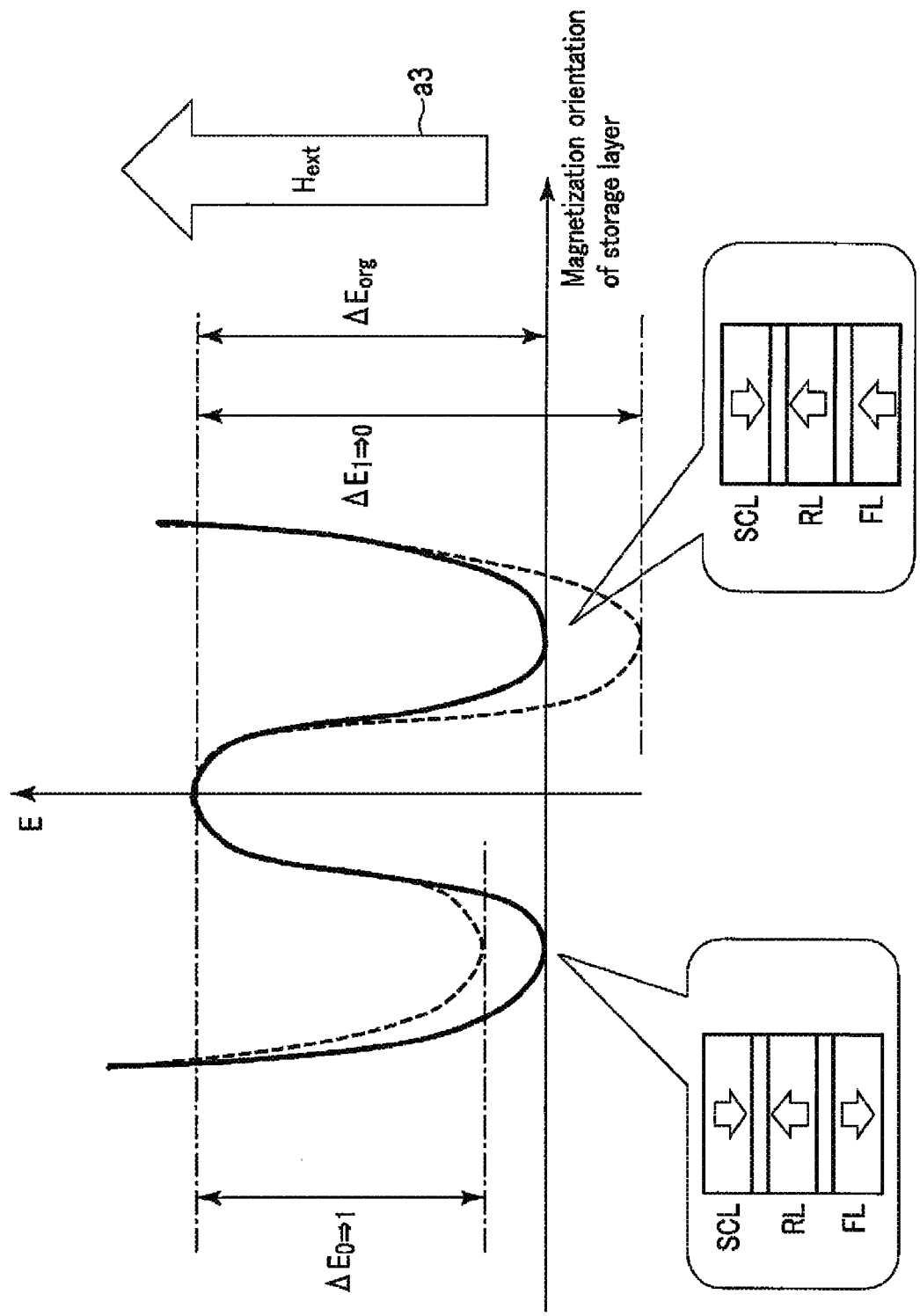
FIG. 14 is a schematic view for explaining an effect of the magnetic storage device according to the first embodiment.

FIG. 14 is a schematic view for explaining an effect of the magnetic storage device according to the first embodiment; FIG. 14 shows a relationship between a data holding state of the magnetoresistive effect element 32 and an energy state.

As shown in FIG. 14, the energy barrier ΔE of the magnetoresistive effect element includes an energy barrier ΔE(1→0) required for shifting from the state of the data "1"

to the state of the data "0" and an energy barrier ΔE(0→1) required for shifting from the state of the data "0" to the state of the data "1". The energy barriers ΔE(1→0) and ΔE (1→0) have the same magnitude (ΔEorg) unless a magnetic field Hext is applied from outside to the magnetoresistive effect element.

On the other hand, when the magnetic field Hext is applied from outside, the energy barriers ΔE (1→0) and ΔE (1→0) change from the energy barrier ΔE org. For example, as shown by the arrow a3 in FIG. 14, when the magnetic field Hext is applied in a direction in which the state of the data "1" is changed to the state of the data "0", the energy barrier ΔE(1→0) is reduced, and the energy barrier ΔE (0→1) increases. More specifically, the energy barriers ΔE (1→0) and ΔE (0→1) follow the following formulae (2) and (3), for example.

$$\Delta E_{(1\to 0)} = \Delta E_{org}\left(1 - \frac{H_{ext}}{H_k}\right)^2 \quad (2)$$

$$\Delta E_{(0\to 1)} = \Delta E_{org}\left(1 + \frac{H_{ext}}{H_k}\right)^2 \quad (3)$$

As described above, when the magnetic field Hext from outside is applied, instead of degrading the retention characteristics provided when any one of the data "1" and the data "0" (the data "1" in the example of FIG. 14) is held, the retention characteristics provided when the other (the data "0" in the example of FIG. 14) is held can be improved. Examples of the magnetic field Hext from outside include a leakage magnetic field from a proximate magnetoresistive effect element. The closer to each other the magnetoresistive effect elements are, the greater the influence of the leakage magnetic field on the energy barrier ΔE.

According to the first embodiment, a certain magnetoresistive effect element 32 of the magnetic storage device 20 has the first nearest magnetoresistive effect element 32a and the second nearest magnetoresistive effect element 32b as the magnetoresistive effect elements 32 in proximity to each other. The controller 27 having received the write command "WTa", instructing the writing of the data "0" to the target magnetoresistive effect element 32t, from, the memory controller 10 executes the operation of writing the data "1" to the first nearest magnetoresistive effect element 32a and the second nearest magnetoresistive effect element 32b of the target magnetoresistive effect element 32t. Thus, the data held by the target magnetoresistive effect element 32t and inverted data are written to the first nearest magnetoresistive effect element 32a and the second nearest magnetoresistive effect element 32b. Consequently, the leakage magnetic field from the first nearest magnetoresistive effect element 32a and the second nearest magnetoresistive effect element 32b acts on the target magnetoresistive effect element 32t in a direction in which written data is protected. Accordingly, it is possible to improve the retention characteristics of data written to the target magnetoresistive effect element 32t and, furthermore, improve reliability of the written data.

According to the first aspect of the first embodiment, the controller 27 first writes data to the target magnetoresistive effect element 32t and then executes the writing to the first nearest magnetoresistive effect element 32a and the second nearest magnetoresistive effect element 32b. Consequently, a write operation period according to the write command "WTa" can be divided into two periods including a period during which the data "0" is written (time T30 to time T32) and a period during which the data "1" is written (time T33 to time T80). Thus, a voltage transferred to the pair of the bit line BL and the source line /BL can be changed a less number of times.

According to the second aspect of the first embodiment, the target magnetoresistive effect element 32t, the first nearest magnetoresistive effect element 32a, and the second nearest magnetoresistive effect element 32b are connected to the different word lines WL(n−1), WLn, and WL(n+1). Among them, data is continuously written to the magnetoresistive effect elements 32 connected to the same word line WL. Consequently, the write operation period according to the write command "WTa" can be divided into three periods including a period during which the memory cell MC connected to the word line WLn is written (time T30 to time T40), a period during which the memory cell MC connected to the word line WL(n−1) is written (time T70 to time T60), and a period during which the memory cell MC connected to the word line WL(n+1) is written (time T70 to time T80). Thus, a voltage transferred to the word line WL can be changed a less number of times.

2. Second Embodiment

Next, a magnetic storage device according to a second embodiment will be described. The second embodiment differs from the first embodiment in that after data is written to a first nearest magnetoresistive effect element 32a and a second nearest magnetoresistive effect element 32b, data is written to a target magnetoresistive effect element 32t. Hereinafter, only different points from the first embodiment will be described.

2.1 Write Operation

A write operation in the magnetic storage device according to the second embodiment will be described.

2.1.1. Summary of Write Operation

Figure 15:
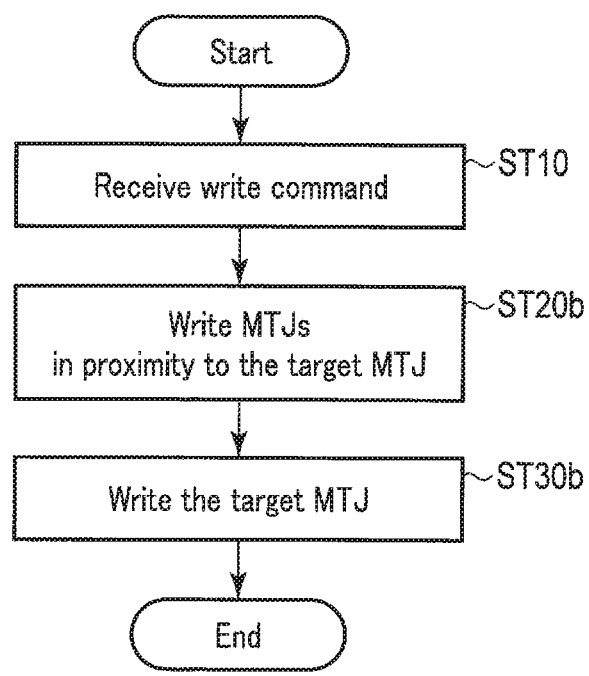
FIG. 15 is a flowchart showing a write operation in the magnetic storage device according to a second embodiment.

FIG. 15 is a flowchart for explaining a summary of the write operation in the magnetic storage device according to the second embodiment. FIG. 15 corresponds to FIG. 9 shown in the first embodiment.

As shown in FIG. 15, a memory controller 10 issues a write command instructing a magnetic storage device 20 to write data. In step ST10, an input/output circuit 26 having received the write command transfers a write signal instructing data writing and an address of a write destination to a controller 27. Further, the input/output circuit 26 transmits data to be written to a page buffer 25.

The controller 27 executes the write operation for data transmitted to the page buffer 25 in accordance with the following steps ST20b and ST30b, based on the write command and the address.

In step ST20b, the controller 27 executes data writing to a magnetoresistive effect element 32 of a memory cell MC in proximity to the target magnetoresistive effect element 32t. Specifically, the controller 27 identifies the magnetoresistive effect element 32 of the memory cell MC, designated by the address, from the target magnetoresistive effect element 32t. Then, the controller 27 identifies the magnetoresistive effect element 32, which is in proximity to the target magnetoresistive effect element 32t, from the first nearest magnetoresistive effect element 32a or the second nearest magnetoresistive effect element 32b, for example. The controller 27 executes data writing to the first nearest magnetoresistive effect element 32a and the second nearest magnetoresistive effect element 32b. The data to be written to the target magnetoresistive effect element 32t and inverted data are written to the first nearest magnetoresistive effect element 32a and the second nearest magnetoresistive effect element 32b.

In step ST30b, the controller 27 executes data writing to the target magnetoresistive effect element 32t.

Thus, the write operation is completed.

2.1.2. Details of Write Operation

Next, details of the write operation in the magnetic storage device according to the second embodiment will be described using a command sequence.

FIG. 16 is a command sequence for explaining the details of the write operation in the magnetic storage device according to the second embodiment. FIG. 16 corresponds to FIG. 10 shown in the first embodiment.

As shown in FIG. 16, the memory controller 10 issues an active command "ACT" at a time T0. The magnetic storage device 20 having received the active command "ACT" shifts to the active state.

The memory controller 10 issues a write command "WTb" at a time T10 after a lapse of a period tRCD from the time T0. The write command "WTb" is a command for instructing execution of an operation of writing inverted data of write data to the memory cell MC in proximity to a write target memory cell MC(n, m) and then writing the write data to the memory cell MC(n, m). The magnetic storage device 20 receives the write command "WTb" subsequent to the active command "ACT".

At a time T20 after a lapse of a period tWL from the time T20, the memory controller 10 outputs a data signal Din to the magnetic storage device 20.

When the output of the data signal Din by the memory controller 10 is completed, the controller 27 starts a write operation of writing data to the memory cell array 21 at a time T30. The write operation includes, for example, a first write operation A2, a second write operation B2, and a third write operation C2 (in FIG. 16, the respective write operations are designated as Write_A2, Write_B2, and Write_C2).

The controller 27 starts the first write operation A2 at the time T30. In the first write operation A2, writing to the memory cell MC connected to a word line WL(n−1) adjacent to a word line WLn connected to the write target memory cell MC(n, m) is executed.

When the data writing to the memory cell MC connected to the word line WL(n−1) is completed, the controller 27 makes setting of a row address invalid at a time T40 and terminates the first write operation A2. Subsequently, the controller 27 performs setting of the row address for starting the data write operation to the memory cell MC connected to a word line WL(n+1) and transfers the set row address to the row decoder 24.

The controller 27 starts the second write operation B2 at a time T50. In the second write operation B2, writing to the memory cell MC connected to the word line WL(n+1) adjacent to the word line WLn is executed.

When the data writing to the memory cell MC connected to the word line WL(n+1) is completed, the controller 27 makes the setting of the row address invalid at a time T60 and terminates the second write operation B2. Subsequently, the controller 27 performs setting of the row address for starting the data write operation to the memory cell MC connected to the word line WLn and transfers the set row address to the row decoder 24.

The controller 27 starts the third write operation C2 at a time T70. In the third write operation C2, writing to the memory cell MC connected to the word line WLn is executed.

When the data writing to the memory cell MC connected to the word line WLn is completed, the memory controller 10 issues a precharge command "PRE" at a time T80. The controller 27 having received the precharge command "PRE" shifts from an active state to an idle state. Further, the controller 27 makes the setting of the row address invalid and terminates the third write operation C2.

The memory controller 10 can issue the active command "ACT" after a time T90 at which a precharge operation is completed.

Figure 17:
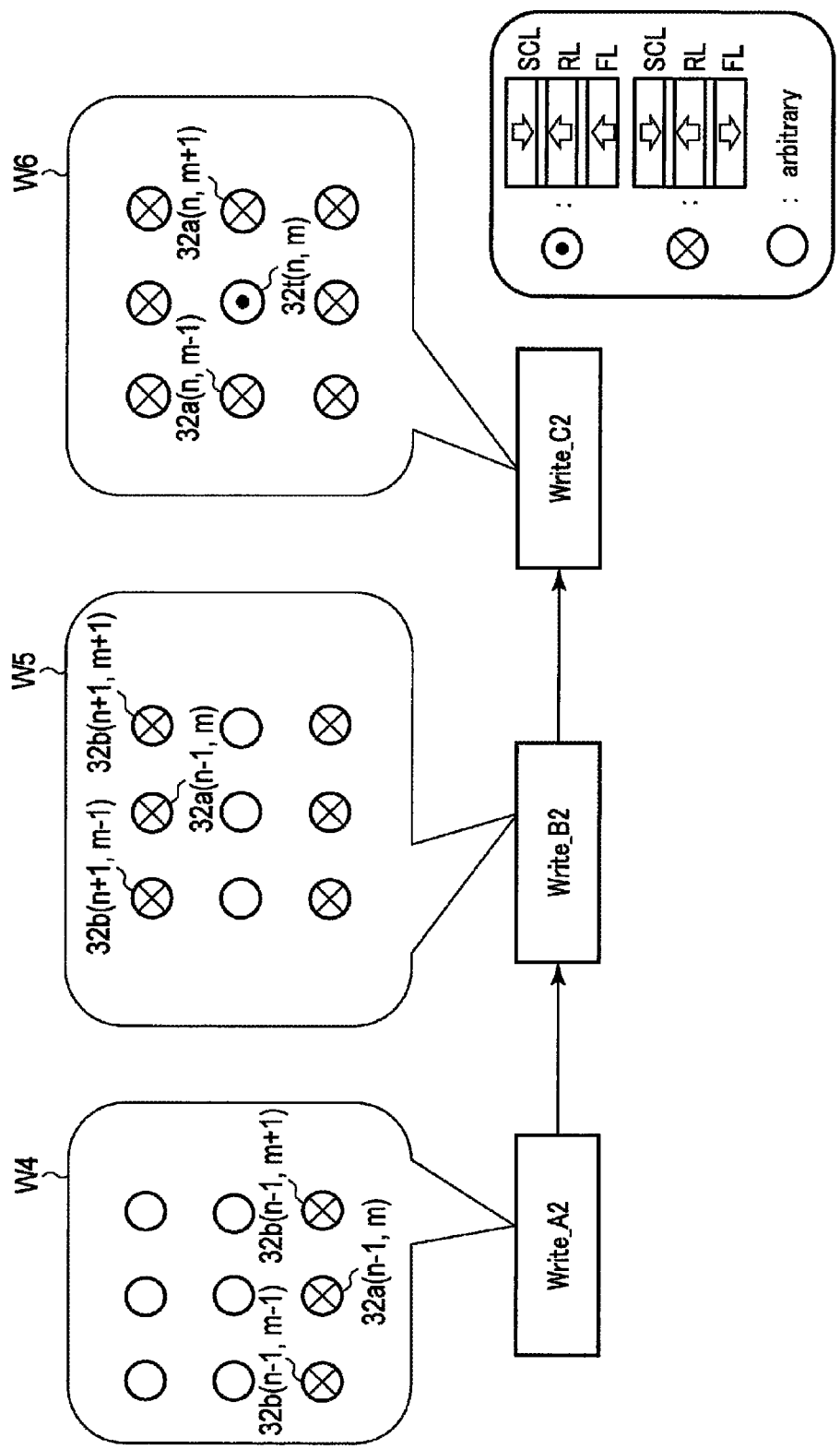
FIG. 17 is a schematic view for explaining a state after the write operation of a magnetoresistive effect element of the magnetic storage device according to the second embodiment.

Next, details of the first write operation A2, the second write operation B2, and the third write operation C2 will be described using FIG. 17. FIG. 17 is a schematic view for explaining details of the write operation in the magnetic storage device according to the second embodiment. FIG. 17 shows states of the target magnetoresistive effect element 32t, the first nearest magnetoresistive effect element 32a, and the second nearest magnetoresistive effect element 32b to which data is written in each of the write operations A2 to C2. FIG. 17 corresponds to FIG. 11 shown in the first embodiment.

As shown in FIG. 17, in the first write operation A2, the controller 27 identifies a magnetoresistive effect element 32(n, m) in the write target memory cell MC, connected to the word line WLn, from the target magnetoresistive effect element 32t. The controller 27 identifies a magnetoresistive effect element 32(n−1, m) in the memory cell MC, which is connected to the word line WL(n−1) adjacent to the word line WLn and is in most proximity to the memory cell MC(n, m), from the first nearest magnetoresistive effect element 32a. The controller 27 identifies magnetoresistive effect elements 32(n−1, m−1) and 32(n−1, m+1), which are in most proximity to the target magnetoresistive effect element 32t next to the first nearest magnetoresistive effect element 32a, from the second nearest magnetoresistive effect element 32b. The controller 27 then executes writing of the data "1" to a first nearest magnetoresistive effect element 32a(n−1, m) and second nearest magnetoresistive effect elements 32b(n−1, m−1) and 32b(n−1, m+1).

In the second write operation B2, the controller 27 identifies a magnetoresistive effect element 32(n+1, m) in the memory cell MC, which is connected to the word line WL(n+1) adjacent to the word line WLn and is in most proximity to the memory cell MC(n, m), from the first nearest magnetoresistive effect element 32a. The controller 27 identifies magnetoresistive effect elements 32(n+1, m−1) and 32(n+1, m+1), which are in most proximity to the target magnetoresistive effect element 32t next to the first nearest magnetoresistive effect element 32a, from the second nearest magnetoresistive effect element 32b. The controller 27 then executes writing of the data "1" to a first nearest magnetoresistive effect element 32a(n+1, m) and second nearest magnetoresistive effect elements 32b(n+1, m−1) and 32b(n+1, m+1).

In the third write operation C2, the controller 27 identifies magnetoresistive effect elements 32(n, m−1) and 32(n, m+1) in the memory cell MC, which are connected to the same word line WLn as the memory cell MC(n, m) and are in proximity to the memory cell MC(n, m), from the first nearest magnetoresistive effect element 32a. The controller 27 then executes writing of the data "1" to first nearest magnetoresistive effect elements 32a(n, m−1) and 32a(n, m+1) connected to the word line WLn. Further, the controller 27 executes writing of the data "0" to a target magnetoresistive effect element 32t(n, m).

Figure 18:
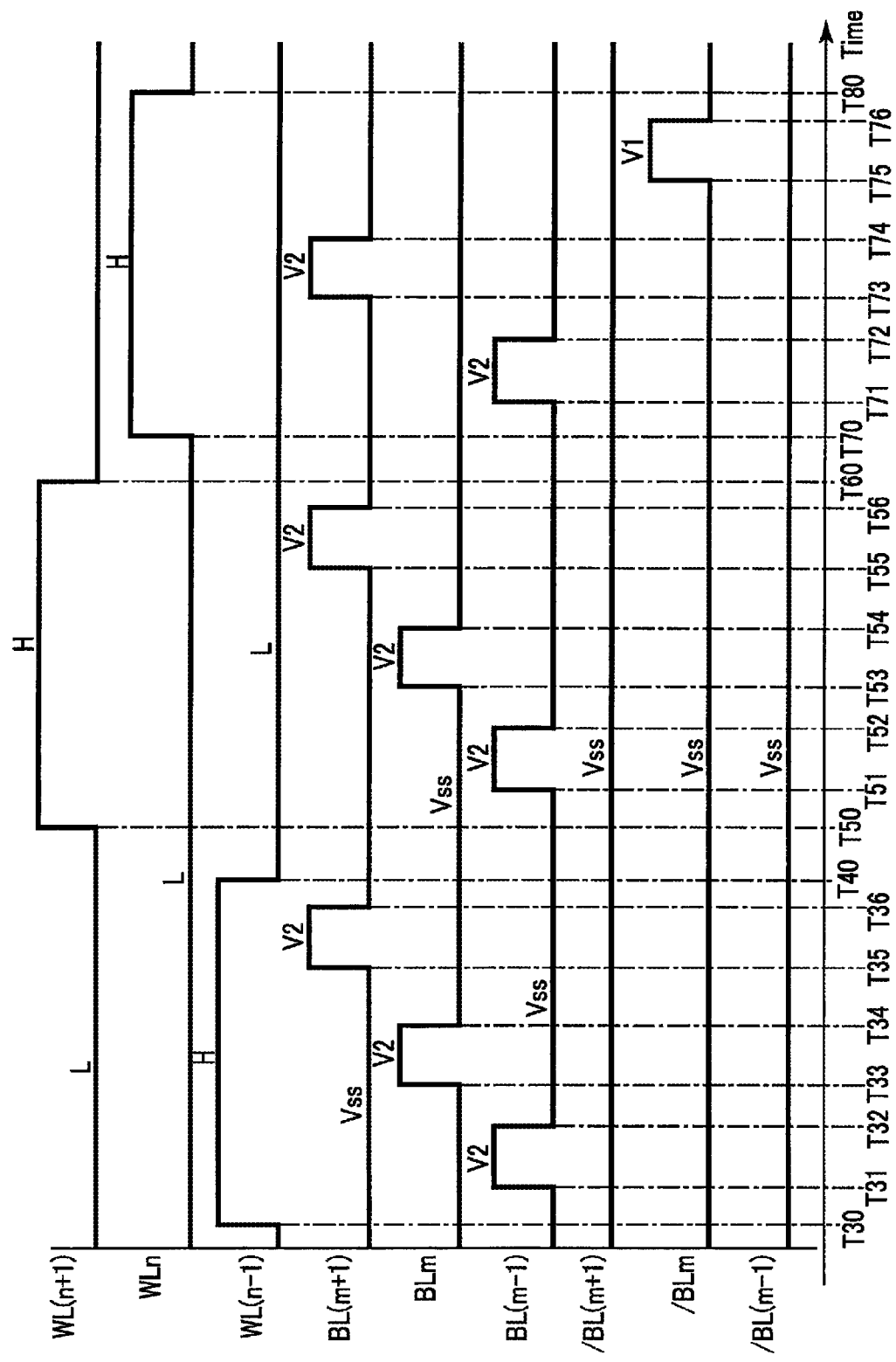
FIG. 18 is a timing chart showing the write operation in the magnetic storage device according to the second embodiment.

Next, details of the write operation in the magnetic storage device according to the second embodiment will be described using FIG. 18. FIG. 18 is a timing chart for explaining the details of the write operation in the magnetic storage device according to the second embodiment. FIG. 18 corresponds to FIG. 12 shown in the first embodiment.

As shown in FIG. 18, the controller 27 executes the writing of the data "1" to memory cells MC(n−1, m−1), MC(n−1, m), and MC(n−1, m+1) from the time T50 to the time T40. Since the operation from the time T30 to the time T40 is the same as the operation from the time T50 to the time T60 in FIG. 11 shown in the first embodiment, the description will be omitted.

The controller 27 executes the writing of the data "1" to memory cells MC(n+1, m−1), MC(n+1, m), and MC(n+1, m+1) from the time T50 to the time T60. Since the operation from the time T50 to the time T60 is the same as the operation from the time T70 to the time T80 in FIG. 11 shown in the first embodiment, the description will be omitted.

The controller 27 executes the writing of the data "1" to memory cells MC(n, m−1) and MC(n, m+1) and then executes the writing of the data "0" to the memory cell MC(n, m) from the time T70 to the time T80.

Specifically, the row decoder 24 selects the word line WLn in a write target row in accordance with the decode result of the row address at the time T70 and transfers a voltage of an "H" level. Accordingly, a select transistor 31 of the memory cell MC connected to the word line WLn is switched to an on state. The row decoder 24 transfers a voltage of an "L" level to the unselected word lines WL (such as the word lines WL(n−1) and WL(n+1)). Accordingly, the select transistor 31 of the memory cell MC connected to the word lines WL(n−1) and WL(n+1) is switched to an off state.

At a time T71, an SA/WD 23 selects a pair of a bit line BL(m−1) and a source line /BL(m−1). The SA/WD 23 writes inverted data of data, held in the page buffer 25, to the memory cell MC(n, m−1). Specifically, the SA/WD 23 transfers a voltage V2 to the bit line BL(m−1) connected to the memory cell MC(n, m−1) and transfers the voltage Vss to the source line /BL(m−1). The voltage Vss is transferred to an unselected pair of the bit line BL and the source line /BL (such as a pair of the bit line BLm and the source line /BLm and a pair of a bit line BL(m+1) and a source line /BL(m+1)). Consequently, a current flows from the bit line BL(m−1) to the source line /BL(m−1), and the data "1" is written to the selected memory cell MC(n, m−1).

After completion of the writing of the data "1" to the memory cell MC(n, m−1), the SA/WD 23 transfers the voltage Vss to the bit line BL(m−1) at a time T72.

At a time T73, the SA/WD 23 selects the pair of the bit line BL(m+1) and the source line /BL(m+1). The SA/WD 23 writes inverted data of data, held in the page buffer 25, to the memory cell MC(n, m+1). Specifically, the SA/WD 23 transfers the voltage V2 to the bit line BL(m+1) connected to the memory cell MC(n, m+1) and transfers the voltage Vss to the source line /BL(m+1). The voltage Vss is transferred to an unselected pair of the bit line BL and the source line /BL (such as a pair of the bit line BL(m−1) and the source line /BL(m−1) and a pair of the bit line BLm and the source line /BLm). Consequently, a current flows from the bit line BL(m+1) to the source line /BL(m+1), and the data "1" is written to the selected memory cell MC(n, m+1).

After completion of the writing of the data "1" to the memory cell MC(n, m+1), the SA/WD 23 transfers the voltage Vss to the bit line BL(m+1) at a time T74.

After completion of the writing of the data "1" to the memory cells MC(n, m−1) and MC(n. m+1), the SA/WD 23 selects the bit line BLm and the source line /BLm at a time T75. The SA/WD 23 writes data, held in the page buffer 25, to the memory cell MC(n, m), based on the write signal. Specifically, the SA/WD 23 transfers the voltage V1 to the source line /BLm connected to the memory cell MC(n, m) and transfers a grounded voltage Vss to the bit line BLm. The voltage Vss is transferred to an unselected pair of the bit line BL and the source line /BL (such as the pair of the bit line BL(m−1) and the source line /BL(m−1) and the pair of the bit line BL(m+1) and the source line /BL(m+1)). Consequently, a current flows from the source line /BLm to the bit line BLm, and the data "0" is written to the selected memory cell MC(n, m).

After completion of the writing of the data "0" to the memory cell MC(n, m), the SA/WD 23 transfers the voltage Vss to the source line /BLm at a time T76.

After completion of the writing of the data "1" to the memory cells MC(n, m−1) and MC(n, m+1) and the writing of the data "0" to the memory cell MC(n, m), the row decoder 24 transfers the voltage of the "L" level to the word line WLn at the time T80. Accordingly, the select transistor 31 of the memory cell MC connected to the word line WLn is switched to the off state.

According to the above operations, data inverted from each other can be written to the target magnetoresistive effect element 32t and the first nearest magnetoresistive effect element 32a and the second nearest magnetoresistive effect element 32b, which are in proximity to the target magnetoresistive effect element 32t, by a one-time write operation.

2.2 Effects According to the Present Embodiment

According to the second embodiment, the controller 27 first writes data to the first nearest magnetoresistive effect element 32a and the second nearest magnetoresistive effect element 32b and then executes the writing to the target magnetoresistive effect element 32t. Consequently, a write operation period executed by the write command "WTb" can be divided into two periods including a period during which the data "1" is written (time T30 to time T74) and a period during which the data "0" is written (time T75 to time T80). Thus, a voltage transferred to the pair of the bit line BL and the source line /BL can be changed a less number of times. In the writing to the target magnetoresistive effect element 32t, the influence of the leakage magnetic field due to inverted data written to the first nearest magnetoresistive effect element 32a and the second nearest magnetoresistive effect element 32b can be applied. Consequently, the writing to the target magnetoresistive effect element 32t can be executed with an energy barrier ΔE (1→0) smaller than a usual energy barrier ΔEorg. Thus, the write data can be more reliably written to the target magnetoresistive effect element 32t. Accordingly, reliability of written data can be improved.

The second embodiment can provide similar effects to the first and second aspects of the first embodiment.

3. Third Embodiment

Next, a magnetic storage device according to a third embodiment will be described. The third embodiment differs from the first embodiment in that a write voltage transferred when data is written to a target magnetoresistive effect element 32t is higher than a write voltage transferred when data is written to a magnetoresistive effect element 32 other than the target magnetoresistive effect element 32t. Hereinafter, only different points from the first embodiment will be described.

3.1 Details of Write Operation

Details of write operation in the magnetic storage device according to the third embodiment will be described.

First, details of the write operation in the magnetic storage device according to the third embodiment will be described using a command sequence.

FIG. 19 is a command sequence for explaining the details of the write operation in the magnetic storage device according to the third embodiment. FIG. 19 corresponds to FIG. 10 shown in the first embodiment.

As shown in FIG. 19, a memory controller 10 issues an active command "ACT" at a time T0. A magnetic storage device 20 having received the active command "ACT" shifts to an active state.

The memory controller 10 issues a write command "WTc" at a time T10 after a lapse of a period tRCD from the time T0. The write command "WTc" is similar to the write command "WTa" in that the write command "WTc" is a command for instructing execution of an operation of writing write data to a write target memory cell MC and then writing inverted data of the write data to the memory cell MC in proximity to the write target memory cell MC. In the write operation executed by the write command "WTc", a higher write voltage as compared to other memory cells MC is transferred to the write target memory cell MC. The magnetic storage device 20 receives the write command "WTc" subsequent to the active command "ACT".

At a time T20 after a lapse of a period tWL from the time T20, the memory controller 10 outputs a data signal Din to the magnetic storage device 20.

When the output of the data signal Din by the memory controller 10 is completed, the controller 27 starts a write operation of writing data to the memory cell array 21 at a time T30. The write operation includes, for example, a first write operation A3 (designated as Write_A3 in FIG. 19), a second write operation B1, and a third write operation C1.

The controller 27 starts the first write operation A3 at the time T30. The third write operation A3 corresponds to the first write operation A1 of FIG. 10 shown in the first embodiment. In the third write operation A3, when data "0" is written to the target magnetoresistive effect element 32t, the controller 27 transfers a voltage higher than a write voltage V1 transferred when the data "0" is written to other magnetoresistive effect elements 32. In the first write operation A3, an operation similar to the first write operation A1 is executed except for the above point.

Since the operation in the time T40 and the subsequent times is the same as the operation in the time T40 and the subsequent times in FIG. 10 shown in the first embodiment, the description will be omitted.

Next, details of the write operation in the magnetic storage device according to the third embodiment will be described using a timing chart.

Figure 20:
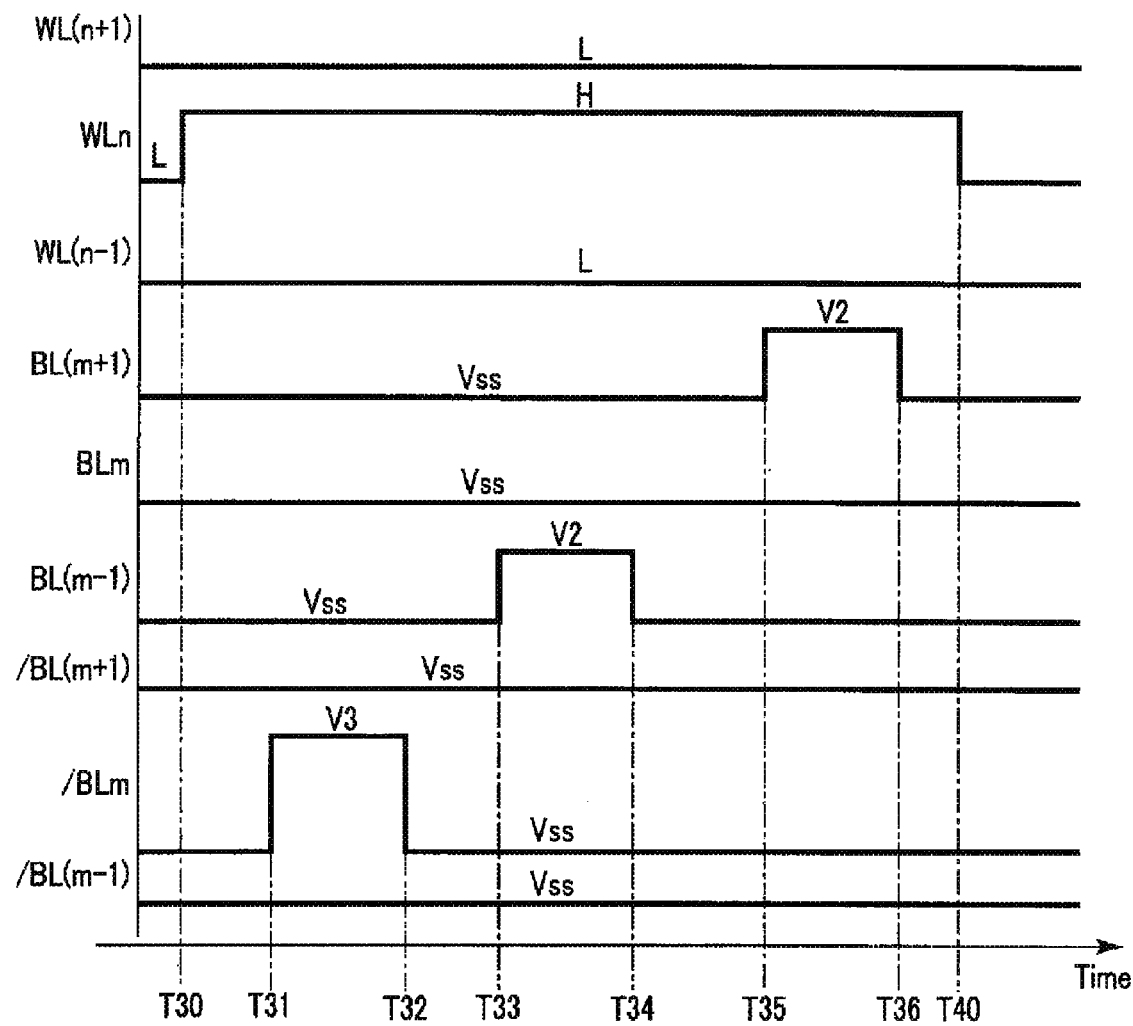
FIG. 20 is a timing chart showing the write operation in the magnetic storage device according to the third embodiment.

FIG. 20 is a timing chart for explaining the details of the write operation in the magnetic storage device according to the third embodiment. FIG. 20 corresponds to the time T30 to the time T40 in FIG. 12 shown in the first embodiment. Namely, FIG. 20 shows a timing chart regarding the first write operation A3.

As shown in FIG. 20, the controller 27 executes the writing of the data "0" to a memory cell MC(n, m) and then executes writing of data "1" to memory cells MC(n, m−1) and MC(n, m+1) from the time T30 to the time T40.

Specifically, a row decoder 24 selects a word line WLn in a write target row in accordance with a decode result of a row address at the time T30 and transfers a voltage of an "H" level. Accordingly, the select transistor 31 of the memory cell MC connected to the word line WLn is switched to an on state. The row decoder 24 transfers a voltage of an "L" level to the unselected word lines WL (such as word lines WL(n−1) and WL(n+1)). Accordingly, the select transistor 31 of the memory cell MC connected to the word lines WL(n−1) and WL(n+1) is switched to an off state.

At a time T31, the SA/WD 23 selects the bit line BLm and the source line /BLm in a write target column in accordance with the decode result of the column address. The SA/WD 23 writes data, held in the page buffer 25, to the memory cell MC(n, m), based on the write signal. Specifically, the SA/WD 23 transfers a voltage V3 to the source line /BLm connected to the memory cell MC(n, m) and transfers a voltage Vss to the bit line BLm. The voltage Vss is transferred to an unselected pair of the bit line BL and the source line /BL (such as a pair of a bit line BL(m−1) and a source line /BL(m−1) and a pair of a bit line BL(m+1) and a source line /BL(m+1)). Consequently, a current flows from the source line /BLm to the bit line BLm, and the data "0" is written to the selected memory cell MC(n, m). The voltage V3 has a value at which a current for thus writing the data "0" to the memory cell MC is applied. The voltage V3 is higher than the voltage V1.

After completion of the writing of the data "0" to the memory cell MC(n, m), the SA/WD 23 transfers the voltage Vss to the source line /BLm at a time T32.

The controller 27 executes the writing of the data "1" to the memory cells MC(n, m−1) and MC(n, m+1) from the time T33 to the time T36. Since the operation from the time T33 to the time T36 is the same as the operation from the time T33 to the time T36 in FIG. 11 shown in the first embodiment, the description will be omitted.

After completion of the writing of the data "0" to the memory cell MC(n, m) and the writing of the data "1" to the memory cells MC(n, m−1) and MC(n, m+1), the row decoder 24 transfers the voltage of the "L" level to the word line WLn at the time T40. Accordingly, the select transistor 31 of the memory cell MC connected to the word line WLn is switched to the off state.

According to the above operations, data inverted from each other can be written to the target magnetoresistive effect element 32t and the first nearest magnetoresistive effect element 32a and the second nearest magnetoresistive effect element 32b, which are in proximity to the target magnetoresistive effect element 32t, by a one-time write operation.

3.2 Effects According to the Present Embodiment

In the magnetic storage device, a plurality of layers are simultaneously stacked on a semiconductor substrate, and a plurality of magnetoresistive effect elements are produced in parallel. Thus, each of the magnetoresistive effect elements is affected by variations due to manufacturing error, so that a difference in characteristic value may occur. In each of the magnetoresistive effect elements, a magnitude of a current required for switching the magnetoresistive effect element to a high resistance state or a low resistance state may be different for each magnetoresistive effect element, for example.

According to the third embodiment, when data is written to the target magnetoresistive effect element 32t(n, m), the controller 27 transfers the voltage Vss and the voltage V3 to the pair of the bit line BL and the source line /BL. Here, as described above, the voltage V3 is higher than the voltage V1 as a voltage level transferred when a current for writing the data "0" to the magnetoresistive effect element 32 is applied in a usual write operation. Thus, in the third embodiment, a write current higher than a usual write current for the data "0" is applied to the target magnetoresistive effect element 32t. Consequently, due to an influence of manufacturing error, for example, even if there is the magnetoresistive effect element 32 in which a current does not reach the magnitude of the current required for writing the data "0" at the voltage V1, the data "0" can be reliably written.

In the third embodiment, although there has been described the case where the data "0" is written to the target magnetoresistive effect element 32t, and the data "1" is written to the first nearest magnetoresistive effect element 32a and the second nearest magnetoresistive effect element 32b, the data to be written may be opposite to each other. Namely, the data "1" may be written to the target magnetoresistive effect element 32t, and the data "0" may be written to the first nearest magnetoresistive effect element 32a and the second nearest magnetoresistive effect element 32b. In this case, in the third embodiment, a voltage V4 (not shown) is transferred to the target magnetoresistive effect element 32t(n, m), for example. The voltage V4 has a value at which a current for writing the data "1" to the memory cell MC is applied and is higher than the voltage V2.

The third embodiment can provide similar effects to the first and second aspects of the first embodiment.

4. Fourth Embodiment

Next, a magnetic storage device according to a fourth embodiment will be described. The fourth embodiment differs from the second embodiment in that a write voltage transferred when data is written to a target magnetoresistive effect element 32t is higher than a write voltage transferred when data is written to other magnetoresistive effect elements 32. Hereinafter, only different points from the second embodiment will be described.

4.1 Details of Write Operation

Details of a write operation in the magnetic storage device according to the fourth embodiment will be described.

First, details of the write operation in the magnetic storage device according to the fourth embodiment will be described using a command sequence.

FIG. 21 is a command sequence for explaining the details of the write operation in the magnetic storage device according to the fourth embodiment. FIG. 21 corresponds to FIG. 16 shown in the second embodiment.

As shown in FIG. 21, a memory controller 10 issues an active command "ACT" at a time T0. The magnetic storage device 20 having received the active command "ACT" shifts to the active state.

The memory controller 10 issues a write command "WTd" at a time T10 after a lapse of a period tRCD from the time T0. The write command "WTd" is similar to the write command "WTb" in that the write command "WTd" is a command for instructing execution of an operation of writing inverted data of write data to a memory cell MC in proximity to a write target memory cell MC and then writing the write data to the write target memory cell MC. In the write operation executed by the write command "WTd", a higher write voltage as compared to other memory cells MC is transferred to the write target memory cell MC. The magnetic storage device 20 receives the write command "WTd" subsequent to the active command "ACT".

At a time T20 after a lapse of a period tWL from the time T20, the memory controller 10 outputs a data signal Din to the magnetic storage device 20.

When the output of the data signal Din by the memory controller 10 is completed, the controller 27 starts a write operation of writing data to the memory cell array 21 at a time T30. The write operation includes, for example, a first write operation A2, a second write operation B2, and a third write operation C4 (designated as Write_C4 in FIG. 21).

Since the operation from the time T30 to a time T70 is the same as the operation from the time T30 to the time T70 in FIG. 16 shown in the second embodiment, the description will be omitted.

The controller 27 starts the third write operation C4 at the time T70. The third write operation C4 corresponds to the third write operation C2 of FIG. 16 shown in the second embodiment. In the third write operation C4, when data "0" is written to the target magnetoresistive effect element 32t, the controller 27 transfers a voltage higher than a write voltage V1 transferred when the data "0" is written to other magnetoresistive effect elements 32. In the third write operation C4, an operation similar to the third write operation C2 is executed except for the above point.

Next, details of the write operation in the magnetic storage device according to the fourth embodiment will be described using a timing chart.

Figure 22:
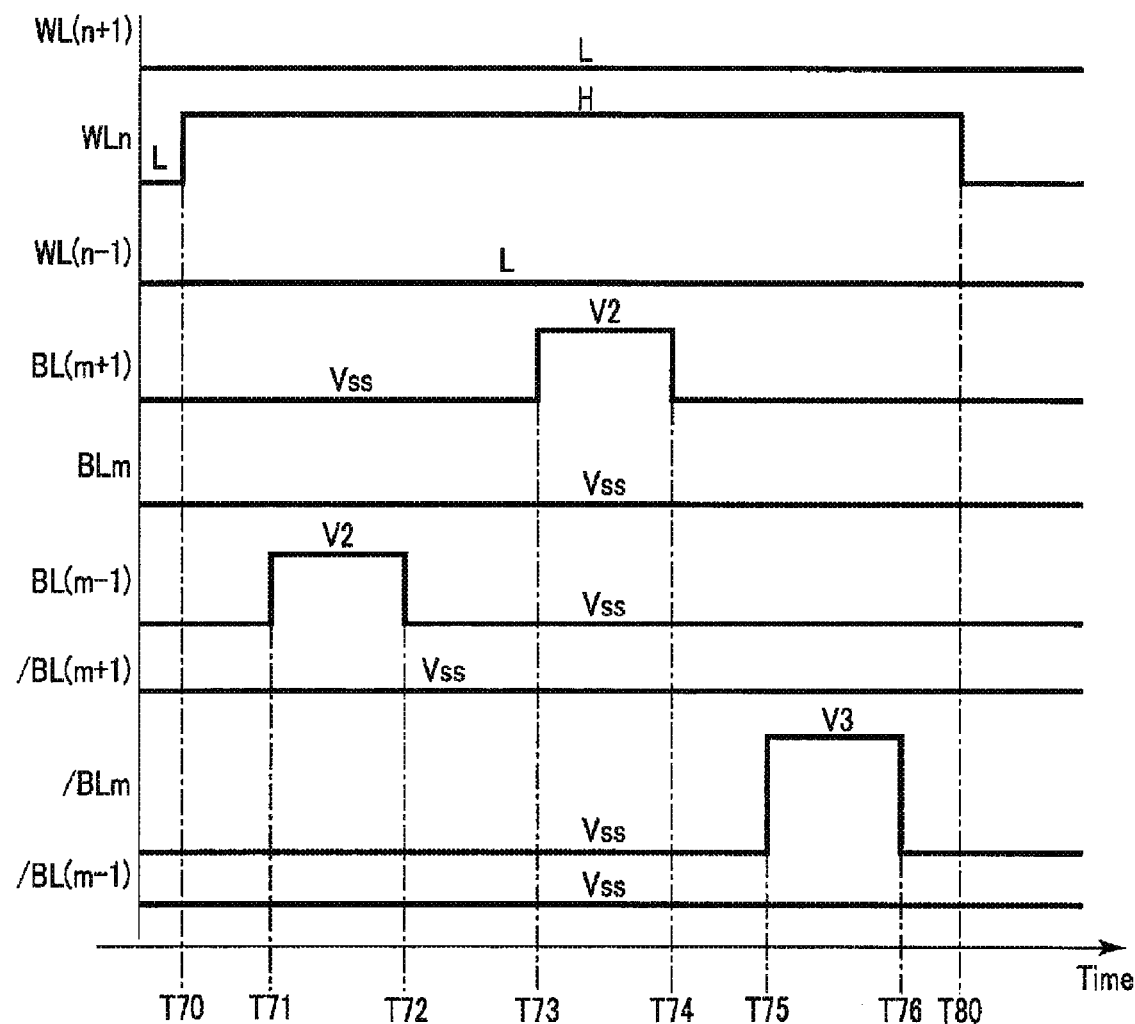
FIG. 22 is a timing chart showing the write operation in the magnetic storage device according to the fourth embodiment.

FIG. 22 is a timing chart for explaining the details of the write operation in the magnetic storage device according to the fourth embodiment. FIG. 22 corresponds to the time T70 to the time T80 in FIG. 18 shown in the second embodiment. Namely, FIG. 22 shows a timing chart regarding the third write operation C4.

As shown in FIG. 22, the controller 27 executes the writing of data "1" to memory cells MC(n, m−1) and MC(n, m+1) and then executes writing of the data "0" to a memory cell MC(n, m) from the time T70 to the time T80.

Specifically, a row decoder 24 selects a word line WLn in a write target row in at with a decode result of a row address at the time T70 and transfers a voltage of an "H" level. Accordingly, the select transistor 31 of the memory cell MC connected to the word line WLn is switched to an on state. The row decoder 24 transfers a voltage of an "L" level to unselected word lines WL (such as word lines WL(n−1) and WL(n+1)). Accordingly, the select transistor 31 of the memory cell MC connected to the word lines WL(n−1) and WL(n+1) is switched to an off state.

The controller 27 executes the writing of the data "1" to the memory cells MC(n, m−1) and MC(n, m+1) from a time T71 to a time T74. Since the operation from the time T71 to the time T74 is the same as the operation from the time T71 to the time T74 in FIG. 18 shown in the second embodiment, the description will be omitted.

At a time T75, an SA/WD 23 selects a bit line BLm and a source line /BLm in a write target column in accordance with a decode result of a column address. The SA/WD 23 writes data, held in the page buffer 25, to the memory cell MC(n, m), based on the write signal. Specifically, the SA/WD 23 transfers a voltage V3 to the source line /BLm connected to the memory cell MC(n, m) and transfers a grounded voltage Vss to the bit line BLm. The voltage Vss is transferred to an unselected pair of the bit line BL and the source line /BL (such as a pair of a bit line BL(m−1) and a source line /BL(m−1) and a pair of a bit line BL(m+1) and a source line /BL(m+1)). Consequently, a current flows from the source line /BLm to the bit line BLm, and the data "0" is written to the selected memory cell MC(n, m).

After completion of the writing of the data "0" to the memory cell MC(n, m), the SA/WD 23 transfers the voltage Vss to the source line /BLm at a time T76.

After completion of the writing of the data "1" to the memory cells MC(n, m−1) and MC(n, m+1) and the writing of the data "0" to the memory cell MC(n, m), the row decoder 24 transfers the voltage of the "L" level to the word line WLn at the time T80. Accordingly, the select transistor 31 of the memory cell MC connected to the word line WLn is switched to the off state.

According to the above operations, data inverted from each other can be written to the target magnetoresistive effect element 32t and the first nearest magnetoresistive effect element 32a and the second nearest magnetoresistive effect element 32b, which are in proximity to the target magnetoresistive effect element 32t, by a one-time write operation.

4.2 Effects According to the Present Embodiment

According to the fourth embodiment, when data is written to a target magnetoresistive effect element 32t(n, m), the controller 27 transfers the voltage Vss and the voltage V3 to the pair of the bit line BL and the source line /BL. Here, as described above, the voltage V3 is higher than the voltage V1 as a voltage level transferred when a current for writing the data "0" to the magnetoresistive effect element 32 is applied in a usual write operation. Thus, in the fourth embodiment, a write current higher than a usual write current for the data "0" is applied to the target magnetoresistive effect element 32t. Consequently, due to an influence of manufacturing error, for example, even if there is the magnetoresistive effect element 32 in which a current does not reach the magnitude of the current required for writing the data "0" at the voltage V1, the data "0" can be reliably written.

The fourth embodiment can provide similar effects to the second embodiment.

5. Fifth Embodiment

Next, a magnetic storage device according to a fifth embodiment will be described. The fifth embodiment differs from the first embodiment in that a pulse width of a write voltage transferred when data is written to a target magnetoresistive effect element 32t is larger than a pulse width of a write voltage transferred when data is written to other magnetoresistive effect elements 32. Hereinafter, only different points from the first embodiment will be described.

5.1 Details of Write Operation

Details of a write operation in the magnetic storage device according to the fifth embodiment will be described.

First, details of the write operation in the magnetic storage device according to the fifth embodiment will be described using a command sequence.

FIG. 23 is a command sequence for explaining the details of the write operation in the magnetic storage device according to the fifth embodiment. FIG. 23 corresponds to FIG. 10 shown in the first embodiment.

As shown in FIG. 23, a memory controller 10 issues an active command "ACT" at a time T0. The magnetic storage device 20 having received the active command "ACT" shifts to the active state.

The memory controller 10 issues a write command "WTe" at a time T10 after a lapse of a period tRCD from the time T0. The write command "WTe" is similar to the write command "WTa" in that the write command "WTe" is a command for instructing execution of an operation of writing write data to a write target memory cell MC and then writing inverted data of the write data to the memory cell MC in proximity to the write target memory cell MC. In the write operation executed by the write command "WTe", a write voltage having a larger pulse width is transferred to the write target memory cell MC as compared to other memory cells MC. The magnetic storage device 20 receives the write command "WTe" subsequent to the active command "ACT".

At a time T20 after a lapse of a period tWL from the time T20, the memory controller 10 outputs a data signal Din to the magnetic storage device 20.

When the output of the data signal Din by the memory controller 10 is completed, the controller 27 starts a write operation of writing data to a memory cell array 21 at a time T30. The write operation includes, for example, a first write operation A5 (designated as Write_A5 in FIG. 23), a second write operation B1, and a third write operation C1.

The controller 27 starts the first write operation A5 at the time T30. The first write operation A5 corresponds to the first write operation A1 of FIG. 10 shown in the first embodiment. In the first write operation A5, when data "1" is written to the target magnetoresistive effect element 32t, the controller 27 transfers a voltage having a pulse width larger than a pulse width of a write voltage transferred when the data "0" is written to other magnetoresistive effect elements 32. In the first write operation A5, an operation similar to the first write operation A1 is executed except for the above point. Thus, a period (T40e-T30) during which the first write operation A5 is executed is longer than a period (T40-T30) during which the first write operation A1 is executed. A period (T60e-T50e) during which the second write operation B1 is executed and a period (T80e-T70e) during which the third write operation C1 is executed are equal respectively to the period (T60-T50) and the period (T80-T70) in FIG. 10 shown in the first embodiment. Similarly, a period (T90e-T80e) from issuance of a precharge command "PRE" to issuance of a new active command "ACT" is equal to the period (T90-T80) in FIG. 10 shown in the first embodiment.

Since the operation in the time T40e and the subsequent times is the same as the operation in the time T40 and the subsequent times in FIG. 10 shown in the first embodiment, the description will be omitted.

Next, details of the write operation in the magnetic storage device according to the fifth embodiment will be described using a timing chart.

Figure 24:
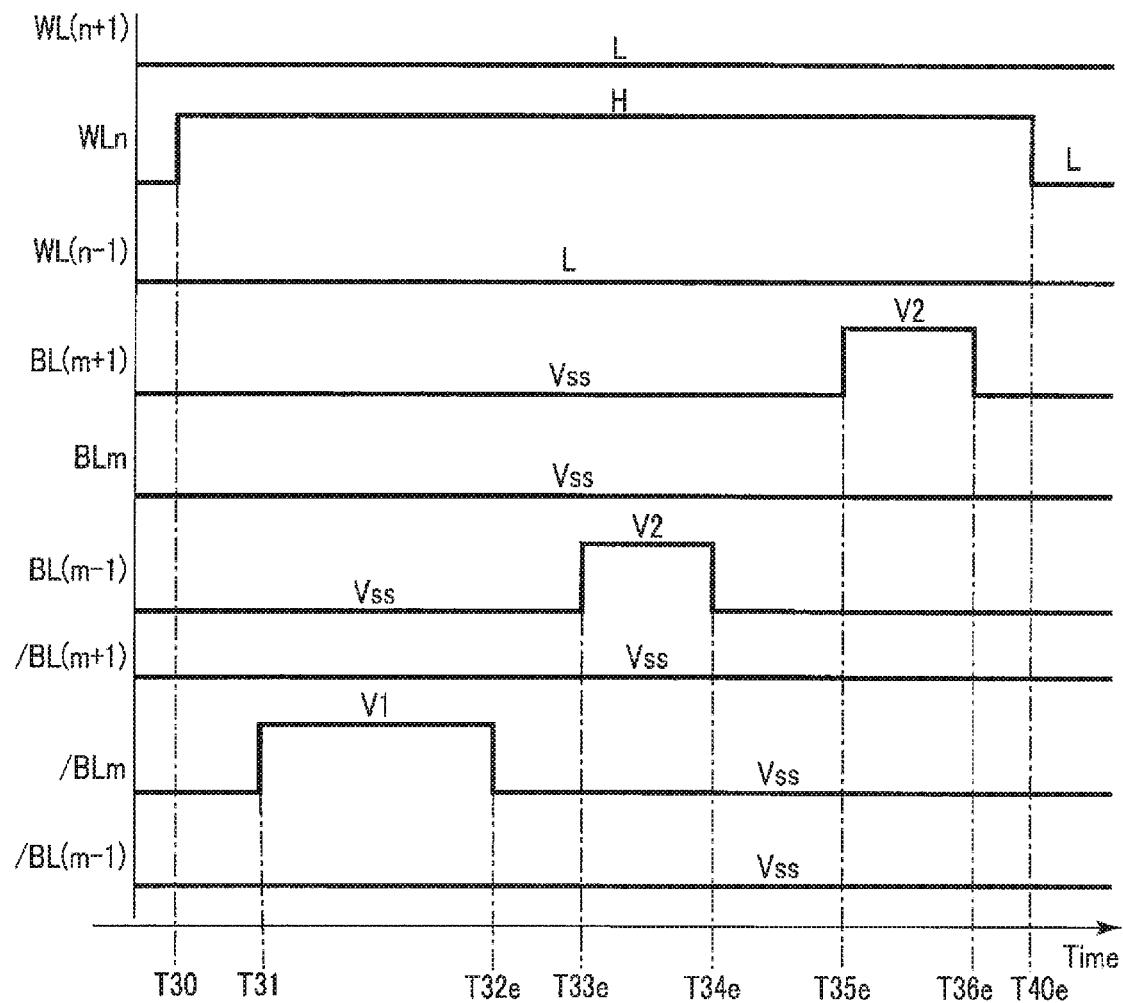
FIG. 24 is a timing chart showing the write operation in the magnetic storage device according to the fifth embodiment.

FIG. 24 is a timing chart for explaining the details of the write operation in the magnetic storage device according to the fifth embodiment. FIG. 24 corresponds to the time T30 to the time T40 in FIG. 12 shown in the first embodiment. Namely, FIG. 24 shows a timing chart regarding the first write operation A5.

As shown in FIG. 24, the controller 27 executes the writing of the data "0" to a memory cell MC(n, m) and then executes writing of data "1" to memory cells MC(n, m−1) and MC(n, m+1) from the time T30 to the time T40e.

Specifically, a row decoder 24 selects a word line WLn in a write target row in accordance with a decode result of a row address at the time T30 and transfers a voltage of an "H" level. Accordingly, the select transistor 31 of the memory cell MC connected to the word line WLn is switched to an on state. The row decoder 24 transfers a voltage of an "L" level to the unselected word lines WL (such as the word lines WL(n−1) and WL(n+1)). Accordingly, the select transistor 31 of the memory cell MC connected to the word lines WL(n−1) and WL(n+1) is switched to an off state.

At a time T31, the SA/WD 23 selects the bit line BLm and the source line /BLm in a write target column in accordance with the decode result of the column address. The SA/WD 23 writes data, held in the page buffer 25, to the memory cell MC(n, m), based on the write signal. Specifically, the SA/WD 23 transfers the voltage V1 to the source line /BLm connected to the memory cell MC(n, m) and transfers a grounded voltage Vss to the bit line BLm. The voltage Vss is transferred to an unselected pair of the bit line BL and the source line /BL (such as a pair of a bit line BL(m−1) and a source line /BL(m−1) and a pair of a bit line BL(m+1) and a source line /BL(m+1)). Consequently, a current flows from the source line /BLm to the bit line BLm, and the data "0" is written to the selected memory cell MC(n, m).

After completion of the writing of the data "0" to the memory cell MC(n, SA/WD 23 transfers the voltage Vss to the source line /BLm at a time T32e. Namely, the voltage V1 is transferred to the source line /BLm during a period (T32e-T31). The period (T32e-T31) is longer than the period (for example, the period (T32-T31) in FIG. 12 shown in the first embodiment) during which the voltage V1 is transferred when the data "0" is written to other magnetoresistive effect elements 32.

The controller 27 executes the writing of the data "1" to the memory cells MC(n, m−1) and MC(n, m+1) from a time T33e to a time T36e. Since the operation from the time T33e to the time T36e is the same as the operation from the time T33 to the time T36 in FIG. 12 shown in the first embodiment, the description will be omitted.

After completion of the writing of the data "0" to the memory cell MC(n, m) and the writing of the data "1" to the memory cells MC(n, m−1) and MC(n, m+1), the row decoder 24 transfers the voltage of the "L" level to the word line WLn at the time T40e. Accordingly, the select transistor 31 of the memory cell MC connected to the word line WLn is switched to the off state.

According to the above operations, data inverted from each other can be written to the target magnetoresistive effect element 32t and the first nearest magnetoresistive effect element 32a and the second nearest magnetoresistive effect element 32b, which are in proximity to the target magnetoresistive effect element 32t, by a one-time write operation.

5.2 Effects According to the Present Embodiment

According to the fifth embodiment, when data is written to a target magnetoresistive effect element 32t(n, m), the controller 27 transfers the voltage V1 to the pair of the bit line BL and the source line /BL during the period (T32e-T31). Here, as described above, the period (T32e-T31) is longer than the period (T32-T31) during which a voltage for writing the data "0" to the magnetoresistive effect element 32 is transferred in a usual write operation. Thus, in the fifth embodiment, a write current is applied to the target magnetoresistive effect element during a longer period as compared to during usual writing of the data "0". Consequently, due to an influence of manufacturing error, for example, even if there is the magnetoresistive effect element 32 to which the data "0" is not written during the period (T32-T31), the data "0" can be reliably written.

The fifth embodiment can provide similar effects to the first and second aspects of the first embodiment.

6. Sixth Embodiment

Next, a magnetic storage device according to a sixth embodiment will be described. The sixth embodiment differs from the second embodiment in that a pulse width of a write voltage transferred when data is written to a target magnetoresistive effect element 32t is larger than a pulse width of a write voltage transferred when data is written to other magnetoresistive effect elements 32. Hereinafter, only different points from the second embodiment will be described.

6.1 Details of Write Operation

Details of a write operation in the magnetic storage device according to the sixth embodiment will be described.

First, details of the write operation in the magnetic storage device according to the sixth embodiment will be described using a command sequence.

FIG. 25 is a command sequence for explaining the details of the write operation in the magnetic storage device according to the sixth embodiment. FIG. 25 corresponds to FIG. 16 shown in the second embodiment.

As shown in FIG. 25, a memory controller 10 issues an active command "ACT" at a time T0. The magnetic storage device 20 having received the active command "ACT" shifts to the active state.

The memory controller 10 issues a write command "WTf" at a time T10 after a lapse of a period tRCD from the time T0. The write command "WTf" is similar to the write command "WTb" in that the write command "WTf" is a command for instructing execution of an operation of writing inverted data of write data to a memory cell MC in proximity to a write target memory cell MC and then writing the write data to the write target memory cell MC. In the write operation executed by the write command "WTf", a write voltage having a larger pulse width is transferred to the write target memory cell MC as compared to other memory cells MC. The magnetic storage device 20 receives the write command "WTf" subsequent to the active command "ACT".

At a time T20 after a lapse of a period tWL from the time T20, the memory controller 10 outputs a data signal Din to the magnetic storage device 20.

When the output of the data signal Din by the memory controller 10 is completed, a controller 27 starts a write operation of writing data to a memory cell array 21 at a time T30. The write operation includes, for example, a first write operation A2, a second write operation B2, and a third write operation C6 (designated as Write_C6 in FIG. 25).

Since the operation from the time T30 to a time T70 is the same as the operation from the time T30 to the time T70 in FIG. 16 shown in the second embodiment, the description will be omitted.

The controller 27 starts the third write operation C6 at the time T70. The third write operation C6 corresponds to the third write operation C2 of FIG. 16 shown in the second embodiment. In the third write operation C6, when data "0" is written to the target magnetoresistive effect element 32t, the controller 27 transfers a voltage having a pulse width larger than a pulse width of a write voltage transferred when the data "0" is written to other magnetoresistive effect elements 32. In the third write operation C6, an operation similar to the third write operation C2 is executed except for the above point. Thus, a period (T80f-T70) during which the third write operation C6 is executed is longer than a period (T80-T70) during which the third write operation C2 is executed. Similarly, a period (T90f-T80f) from issuance of a precharge command "PRE" to issuance of a new active command "ACT" is equal to the period (T90-T80) in FIG. 16 shown in the second embodiment.

Next, details of the write operation in the magnetic storage device according to the sixth embodiment will be described using a timing chart.

FIG. 26 is a timing chart for explaining the details of the write operation in the magnetic storage device according to the sixth embodiment. FIG. 26 corresponds to the time T70 to the time T80 in FIG. 18 shown in the second embodiment. Namely, FIG. 26 shows a timing chart regarding the third write operation C6.

As shown in FIG. 26, the controller 27 executes the writing or data "1" to memory cells MC(n, m−1) and MC(n, m+1) and then executes writing of the data "0" to a memory cell MC(n, m) from the time T70 to the time T80f.

Specifically, the row decoder 24 selects the word line WLn in a write target row in accordance with the decode result of the row address at the time T70 and transfers a voltage of an "H" level. Accordingly, the select transistor 31 of the memory cell MC connected to the word line WLn is switched to an on state. The row decoder 24 transfers a voltage of an "L" level to the unselected word lines WL (such as the word lines WL(n−1) and WL(n+1)). Accordingly, the select transistor 31 of the memory cell MC connected to the word lines WL(n−1) and WL(n+1) is switched to an off state.

The controller 27 executes the writing of the data "1" to the memory cells MC(n, m−1) and MC(n, m+1) from a time T71 to a time T74. Since the operation from the time T71 to the time T74 is the same as the operation from the time T71 to the time T74 in FIG. 18 shown in the second embodiment, the description will be omitted.

At a time T75, an SA/WD 23 selects a bit line BLm and a source line /BLm in a write target column in accordance with a decode result of a column address. The SA/WD 23 writes data, held in the page buffer 25, to the memory cell MC(n, m), based on the write signal. Specifically, the SA/WD 23 transfers the voltage V1 to the source line /BLm connected to the memory cell MC(n, m) and transfers a grounded voltage Vss to the bit line BLm. The voltage Vss is transferred to an unselected pair of the bit line BL and the source line /BL (such as a pair of a bit line BL(m−1) and a source line /BL(m−1) and a pair of a bit line BL(m+1) and a source line /BL(m+1)). Consequently, a current flows from the source line /BLm to the bit line BLm, and the data "0" is written to the selected memory cell MC(n, m).

After completion of the writing of the data "0" to the memory cell MC(n, m), the SA/WD 23 transfers the voltage Vss to the source line /BLm at a time T76f. Namely, the voltage V1 is transferred to the source line /BLm during a period (T76f-T75). The period (T76f-T75) is longer than the period (for example, the period (T76-T75) in FIG. 18 shown in the second embodiment) during which the voltage V1 is transferred when the data "0" is written to other magnetoresistive effect elements 32.

After completion of the writing of the data "1" to the memory cells MC(n, m−1) and MC(n, m+1) and the writing of the data "0" to the memory cell MC(n, m), the row decoder 24 transfers the voltage of the "L" level to the word line WLn at the time T80f. Accordingly, the select transistor 31 of the memory cell MC connected to the word line WLn is switched to the off state.

According to the above operations, data inverted from each other can be written to the target magnetoresistive effect element 32t and the first nearest magnetoresistive effect element 32a and the second nearest magnetoresistive effect element 32b, which are in proximity to the target magnetoresistive effect element 32t, by a one-time write operation.

6.2 Effects According to the Present Embodiment

According to the sixth embodiment, when data is written to a target magnetoresistive effect element 32t(n, m), the controller 27 transfers the voltage V1 to the pair of the bit line BL and the source line /BL during the period (T76f-T75). Here, as described above, the period (T76f-T75) is longer than the period (T76-T75) during which a voltage for writing the data "0" to the magnetoresistive effect element 32 is transferred in a usual write operation. Thus, in the sixth embodiment, a write current is applied to the target magnetoresistive effect element 32t during a longer period as compared to during usual writing of the data "0". Consequently, due to an influence of manufacturing error, for example, even if there is the magnetoresistive effect element 32 to which the data "0" is not written during the period (T76-T75), the data "0" can be reliably written.

The sixth embodiment can provide similar effects to the second embodiment.

7. Seventh Embodiment

Next, a magnetic storage device according to a seventh embodiment will be described. The seventh embodiment is a combination of the first embodiment and the technical features of the third and fifth embodiments. Namely, in the seventh embodiment, in a write voltage in a case where certain data is written to a target magnetoresistive effect element 32t, the voltage value is higher, and the pulse width is longer, as compared to a write voltage in a case where the certain data is written to other magnetoresistive effect elements 32. Hereinafter, only different points from the first embodiment will be described.

7.1 Details of Write Operation

Details of a write operation in the magnetic storage device according to the seventh embodiment will be described.

First, details of the write operation in the magnetic storage device according to the seventh embodiment will be described using a command sequence.

FIG. 27 is a command sequence for explaining the details of the write operation in the magnetic storage device according to the seventh embodiment. FIG. 27 corresponds to FIG. 10 shown in the first embodiment.

As shown in FIG. 27, a memory controller 10 issues an active command "ACT" at a time T0. The magnetic storage device 20 having received the active command "ACT" shifts to the active state.

The memory controller 10 issues a write command "WTg" at a time T10 after a lapse of a period tRCD from the time T0. The write command "WTg" is similar to the write command "WTa" in that the write command "WTg" is a command for instructing execution of an operation of writing write data to a write target memory cell MC and then writing inverted data of the write data to a memory cell MC in proximity to the write target memory cell MC. In the write operation executed by the write command "WTg", a write voltage having a higher voltage value and a larger pulse width as compared to other memory cells MC is transferred to the write target memory cell MC. The magnetic storage device 20 receives the write command "WTg" subsequent to the active command "ACT".

At a time T20 after a lapse of a period tWL from the time T20, the memory controller 10 outputs a data signal Din to the magnetic storage device 20.

When the output of the data signal Din by the memory controller 10 is completed, the controller 27 starts a write operation of writing data to the memory cell array 21 at a time T30. The write operation includes, for example, a first write operation A7 (designated as Write_A7 in FIG. 27), a second write operation B1, and a third write operation C1.

The controller 27 starts the first write operation A7 at the time T30. The first write operation A7 corresponds to the first write operation A1 of FIG. 10 shown in the first embodiment. In the first write operation A7, when data "0" is written to the target magnetoresistive effect element 32t, the controller 27 transfers a voltage having a higher voltage value and a larger pulse width as compared to a write voltage transferred when the data "0" is written to other magnetoresistive effect elements 32. In the first write operation A7, an operation similar to the first write operation A1 is executed except for the above point. Thus, a period (T40g-T30) during which the first write operation A7 is executed is longer than a period (T40-T30) during which the first write operation A1 is executed. A period (T60g-T50g) during which the second write operation B1 is executed and a period (T80g-T70g) during which the third write operation C1 is executed are equal respectively to the period (T60-T50) and the period (T80-T70) in FIG. 10 shown in the first embodiment. Similarly, a period (T90g-T80g) from issuance of a precharge command "PRE" to issuance of a new active command "ACT" is equal to the period (T90-T80) in FIG. 10 shown in the first embodiment.

Since the operation in the time T40g and the subsequent times is the same as the operation in the time T40 and the subsequent times in FIG. 10 shown in the first embodiment, the description will be omitted.

Next, details of the write operation in the magnetic storage device according to the seventh embodiment will be described using a timing chart.

Figure 28:
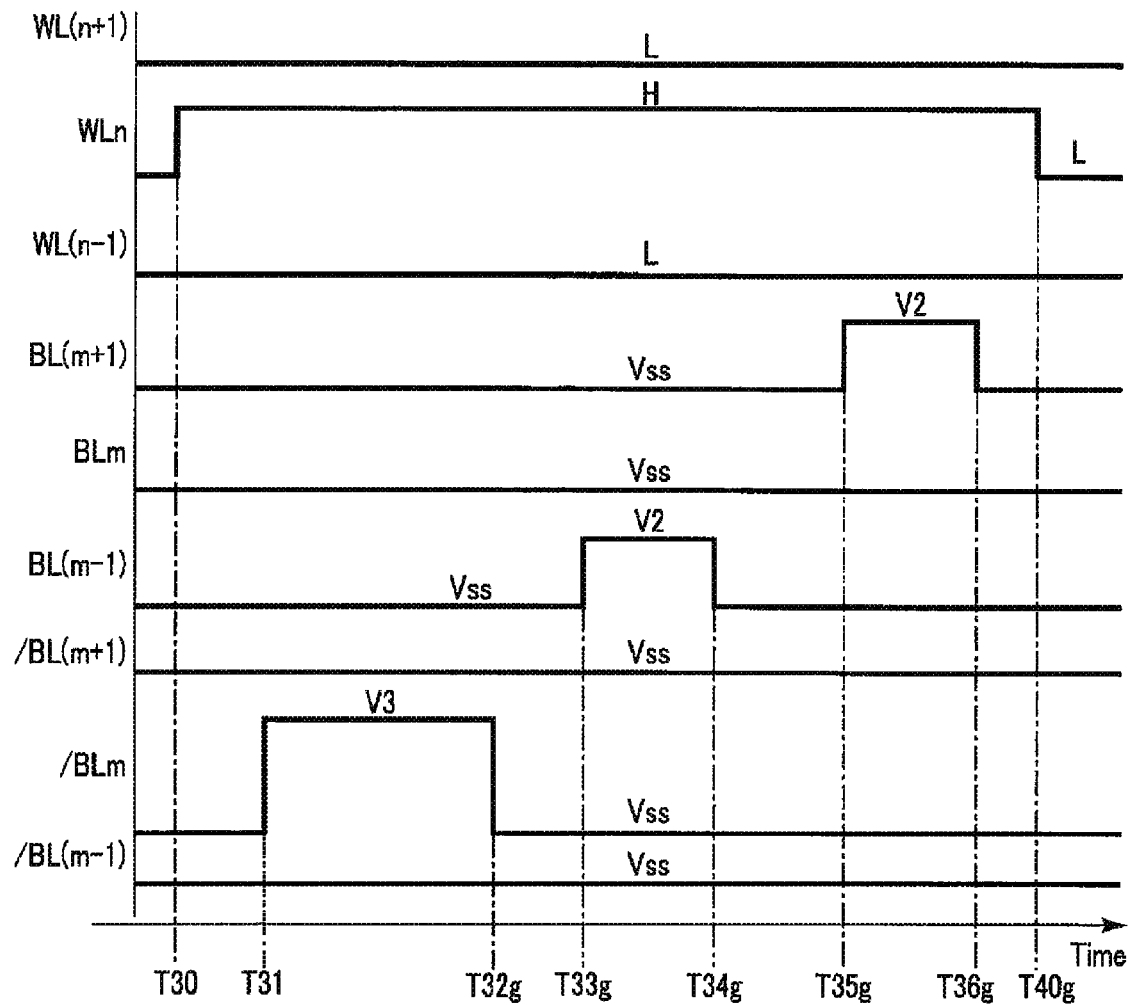
FIG. 28 is a timing chart showing the write operation in the magnetic storage device according to the seventh embodiment.

FIG. 28 is a timing chart for explaining the details of the write operation in the magnetic storage device according to the seventh embodiment. FIG. 28 corresponds to the time T30 to the time T40 in FIG. 12 shown in the first embodiment. Namely, FIG. 28 shows a timing chart regarding the first write operation A7.

As shown in FIG. 28, the controller 27 executes the writing of the data "0" to a memory cell MC(n, m) and then executes writing of data "1" to memory cells MC(n, m−1) and MC(n, m+1) from the time T30 to the time T40g.

Specifically, a row decoder 24 selects a word line WLn in a write target row in accordance with a decode result of a row address at the time T30 and transfers a voltage of an "H" level. Accordingly, the select transistor 31 of the memory cell MC connected to the word line WLn is switched to an on state. The row decoder 24 transfers a voltage of an "L" level to the unselected word lines WL (such as the word lines WL(n−1) and WL(n+1)). Accordingly, the select transistor 31 of the memory cell MC connected to the word lines WL(n−1) and WL(n+1) is switched to an off state.

At a time T31, the SA/WD 23 selects the bit line BLm and the source line /BLm in a write target column in accordance with the decode result of the column address. The SA/WD 23 writes data, held in the page buffer 25, to the memory cell MC(n, m), based on the write signal. Specifically, the SA/WD 23 transfers a voltage V3 to the source line /BLm connected to the memory cell MC(n, m) and transfers a grounded voltage Vss to the bit line BLm. The voltage Vss is transferred to an unselected pair of the bit line BL and the source line /BL (such as a pair of a bit line BL(m−1) and a source line /BL(m−1) and a pair of a bit line BL(m+1) and a source line /BL(m+1)). Consequently, a current flows from the source line /BLm to the bit line BLm, and the data "0" is written to the selected memory cell MC(n, m).

After completion of the writing of the data "0" to the memory cell MC(n, m), the SA/WD 23 transfers the voltage Vss to the source line /BLm at a time T32g. Namely, the voltage V3 is transferred to the source line /BLm during a period (T32g-T31). As described above, the voltage V3 is higher than the voltage V1, and the period (T32g-T31) is longer than the period (T32-T31).

The controller 27 executes the writing of the data "1" to the memory cells MC(n, m−1) and MC(n, m+1) from a time T33g to a time T36g. Since the operation from the time T33g to the time T36g is the same as the operation from the time T33 to the time T36 in FIG. 12 shown in the first embodiment, the description will be omitted.

After completion of the writing of the data "0" to the memory cell MC(n, m) and the writing of the data "1" to the memory cells MC(n, m−1) and MC(n, m+1), the row decoder 24 transfers the voltage of the "L" level to the word line WLn at the time T40g. Accordingly, the select transistor 31 of the memory cell MC connected to the word line WLn is switched to the off state.

According to the above operations, data inverted from each other can be written to the target magnetoresistive effect element 32t and the first nearest magnetoresistive effect element 32a and the second nearest magnetoresistive effect element 32b, which are in proximity to the target magnetoresistive effect element 32t, by a one-time write operation.

7.2 Effects According to the Present Embodiment

According to the seventh embodiment, when data is written to a target magnetoresistive effect element 32t(n, m), the controller 27 transfers the voltage Vss and the voltage V3 to the pair of the bit line BL and the source line /BL. Here, as described above, the voltage V3 is higher than the voltage V1 as a voltage level transferred when a current for writing the data "0" to the magnetoresistive effect element 32 is applied in a usual write operation. According to the seventh embodiment, the controller 27 further transfers the voltage V1 to the pair of the bit line BL and the source line /BL during the period (T32g-T31). Here, as described above, the period (T32g-T31) is longer than the period (T32-T31) during which a voltage for writing the data "0" to the magnetoresistive effect element 32 is transferred in a usual write operation. Thus, in the seventh embodiment, a write current higher than a usual write current for the data "0" is applied to the target magnetoresistive effect element 32t for a longer period. Consequently, due to an influence of manufacturing error, for example, even if there is the magnetoresistive effect element 32 to which the data "0" is significantly less likely to be written, the data "0" can be reliably written.

The seventh embodiment can provide similar effects to the first and second aspects of the first embodiment.

8. Eighth Embodiment

Next, a magnetic storage device according to an eighth embodiment will be described. The eighth embodiment is a combination of the second embodiment and the technical features of the fourth and sixth embodiments. Namely, in the eighth embodiment, in a write voltage in a case where certain data is written to a target magnetoresistive effect element 32t, the voltage value is higher, and the pulse width is longer, as compared to a write voltage in a case where the certain data is written to other magnetoresistive effect elements 32. Hereinafter, only different points from the second embodiment will be described.

8.1 Details of Write Operation

Details of a write operation in the magnetic storage device according to the eighth embodiment will be described.

First, details of the write operation in the magnetic storage device according to the eighth embodiment will be described using a command sequence.

FIG. 29 is a command sequence for explaining the details of the write operation in the magnetic storage device according to the eighth embodiment. FIG. 29 corresponds to FIG. 16 shown in the second embodiment.

As shown in FIG. 29, a memory controller 10 issues an active command "ACT" at a time T0. The magnetic storage device 20 having received the active command "ACT" shifts to the active state.

The memory controller 10 issues a write command "WTh" at a time T10 after a lapse of a period tRCD from the time T0. The write command "WTh" is similar to the write command "WTb" in that the write command "WTh" is a command for instructing execution of an operation of writing inverted data of write data to a memory cell MC in proximity to a write target memory cell MC and then writing the write data to the write target memory cell MC. In the write operation executed by the write command "WTh", a write voltage having a higher voltage value and a larger pulse width as compared to other memory cells MC is transferred to the write target memory cell MC. The magnetic storage device 20 receives the write command "WTh" subsequent to the active command "ACT".

At a time T20 after a lapse of a period tWL from the time T20, the memory controller 10 outputs a data signal Din to the magnetic storage device 20.

When the output of the data signal Din by the memory controller 10 is completed, the controller 27 starts a write operation of writing data to the memory cell array 21 at a time T30. The write operation includes, for example, a first write operation A2, a second write operation B2, and a third write operation C8 (designated as Write_C8 in FIG. 29).

Since the operation from the time T30 to a time T70 is the same as the operation from the time T30 to the time T70 in FIG. 16 shown in the second embodiment, the description will be omitted.

The controller 27 starts the third write operation. C8 at the time T70. The third write operation C8 corresponds to the third write operation C2 of FIG. 16 shown in the second embodiment. In the third write operation C8, when data "0" is written to the target magnetoresistive effect element 32t, the controller 27 transfers a voltage having a higher voltage value and a larger pulse width as compared to a write voltage transferred when the data "0" is written to other magnetoresistive effect elements 32. In the third write operation C8, an operation similar to the third write operation C2 is executed except for the above point. Thus, a period (T80h-T70) during which the third write operation C8 is executed is longer than a period (T80-T70) during which the third write operation C2 is executed. Similarly, a period (T90h-T80h) from issuance of a precharge command "PRE" to issuance of a new active command "ACT" is equal to the period (T90-T80) in FIG. 16 shown in the second embodiment.

Next, details of the write operation in the magnetic storage device according to the eighth embodiment will be described using a timing chart.

FIG. 30 is a timing chart for explaining the details of the write operation in the magnetic storage device according to the eighth embodiment. FIG. 30 corresponds to the time T70 to the time T80 in FIG. 18 shown in the second embodiment. Namely, FIG. 30 shows a timing chart regarding the third write operation C8.

As shown in FIG. 30, the controller 27 executes the writing of data "1" to memory cells MC(n, m-1) and MC(n, m+1) and then executes writing of the data "0" to a memory cell MC(n, m) from the time T70 to the time T80h.

Specifically, the row decoder 24 selects the word line WLn in a write target row in accordance with the decode result of the row address at the time T70 and transfers a voltage of an "H" level. Accordingly, the select transistor 31 of the memory cell MC connected to the word line WLn is switched to on state. The row decoder 24 transfers a voltage of an "L" level to the unselected word lines WL (such as the word lines WL(n-1) and WL(n+1)). Accordingly, the select transistor 31 of the memory cell MC connected to the word lines WL(n-1) and WL(n+1) is switched to an off state.

The controller 27 executes the writing of the data "1" to the memory cells MC(n, m-1) and MC(n, m+1) from a time T71 to a time T74. Since the operation from the time T71 to the time T74 is the same as the operation from the time T71 to the time T74 in FIG. 18 shown in the second embodiment, the description will be omitted.

At a time T75, an SA/WD 23 selects a bit line BLm and a source line /BLm in a write target column in accordance with a decode result of a column address. The SA/WD 23 writes data, held in the page buffer 25, to the memory cell MC(n, m), based on the write signal. Specifically, the SA/WD 23 transfers a voltage V3 to the source line /BLm connected to the memory cell MC(n, m) and transfers a grounded voltage Vss to the bit line BLm. The voltage Vss is transferred to an unselected pair of the bit line BL and the source line /BL (such as a pair of a bit line BL(m-1) and a source line /BL(m-1) and a pair of a bit line BL(m+1) and a source line /BL(m+1)). Consequently, a current flows from the source line /BLm to the bit line BLm, and the data "0" is written to the selected memory cell MC(n, m).

After completion of the writing of the data "0" to the memory cell MC(n, m), the SA/WD 23 transfers the voltage Vss to the source line /BLm at a time T76h. Namely, the voltage V3 is transferred to the source line /BLm during a period (T76h-T75). As described above, the voltage V3 is higher than a voltage V1, and the period (T76h-T75) is longer than the period (T76-T75).

After completion of the writing of the data "1" to the memory cells MC(n, m-1) and MC(n, m+1) and the writing of the data "0" to the memory cell MC(n, m), the row decoder 24 transfers the voltage of the "L" level to the word line WLn at the time T80h. Accordingly, the select transistor 31 of the memory cell MC connected to the word line WLn is switched to the off state.

According to the above operations, data inverted from each other can be written to the target magnetoresistive effect element 32t and the first nearest magnetoresistive effect element 32a and the second nearest magnetoresistive effect element 32b, which are in proximity to the target magnetoresistive effect element 32t, by a one-time write operation.

8.2 Effects According to the Present Embodiment

According to the eighth embodiment, when data is written to a target magnetoresistive effect element 32t(n, m), the controller 27 transfers the voltage Vss and the voltage V3 to the pair of the bit line BL and the source line /BL. Here, as described above, the voltage V3 is higher than the voltage V1 as a voltage level transferred when a current for writing the data "0" to the magnetoresistive effect element 32 is applied in a usual write operation. According to the eighth embodiment, the controller 27 further transfers the voltage V1 to the pair of the bit line BL and the source line /BL during the period (T76h-T75). Here, as described above, the period (T76h-T75) is longer than the period (T76-T75) during which a voltage for writing the data "0" to the magnetoresistive effect element 32 is transferred in a usual write operation. Thus, in the eighth embodiment, a write current higher than a usual write current for the data "0" is applied to the target magnetoresistive effect element 32t for a longer period. Consequently, due to an influence of manufacturing error, for example, even if there is the magnetoresistive effect element 32 to which the data "0" is significantly less likely to be written, the data "0" can be reliably written.

The eighth embodiment can provide similar effects to the second embodiment.

9. Variations, Etc

The present invention is not limited to the first to eighth embodiments described above and can be variously modified. In each variation to be described below, as one example, when each variation is applied to the first embodiment, only the difference from the first embodiment will be described. However, each variation is applicable not only to the first embodiment but also to the second to eighth embodiments.

9.1 First Variation

A magnetic storage device according to a first variation will be described. The magnetic storage device according to the first variation simultaneously executes data writing to a first nearest magnetoresistive effect element 32a and a second nearest magnetoresistive effect element 32b connected to the same word line WL.

Figure 31:
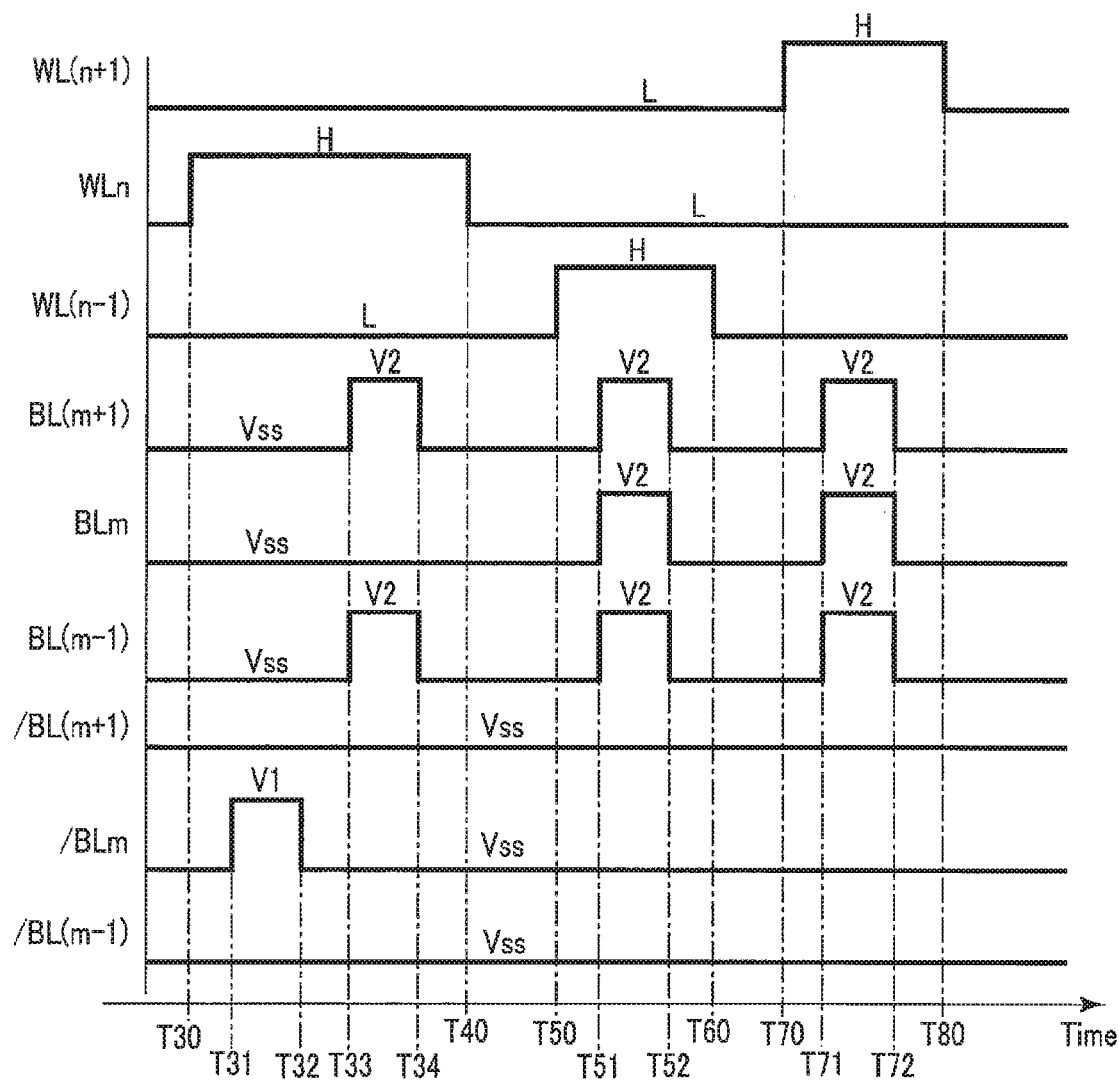
FIG. 31 is a timing chart showing a write operation in a magnetic storage device according to a first variation.

FIG. 31 is a timing chart for explaining details of a write operation in the magnetic storage device according to the first variation. FIG. 31 corresponds to FIG. 10 shown in the first embodiment.

As shown in FIG. 31, since an operation from a time T30 to a time T32 is similar to the operation from the time T30 to the time T32 in FIG. 10 shown in the first embodiment, the description will be omitted.

At a time T33, an SA/WD 23 simultaneously selects a pair of a bit line BL(m−1) and a source line /BL(m−1) and a pair of a bit line BL(m+1) and a source line /BL(m+1). The SA/WD 23 writes inverted data of data, held in a page buffer 25, to memory cells MC(n, m−1) and MC(n, m+1). Specifically, the SA/WD 23 transfers a voltage V2 to the bit lines BL(m−1) and BL(m+1) connected respectively to the memory cells MC(n, m−1) and MC(n, m+1) and transfers a voltage Vss to the source lines /BL(m−1) and /BL(m+1). The voltage Vss is transferred to an unselected pair of a bit line BL and a source line /BL (such as a pair of a bit line BLm and a source line /BLm). Consequently, a current flows from the bit line BL(m−1) to the source line /BL(m−1), and data "1" is written to the memory cell MC(n, m−1); meanwhile, a current flows from the bit line BL(m+1) to the source line /BL(m+1), the data "1" is written to the memory cell MC(n, m+1).

As described above, the SA/WD 23 is required to simultaneously transfer the voltage V2 to the two bit lines BL(m−1) and BL(m+1). Thus, the SA/WD 23 is required to output a higher voltage as compared to a case where the voltage V2 is transferred only to one bit line BL.

After completion of the simultaneous writing of the data "1" to the memory cells MC(n, m−1) and MC(n, m+1), the SA/WD 23 transfers the voltage Vss to the bit lines BL(m−1) and BL(m+1) at a time T34.

After completion of writing of data "0" to a memory cell MC(n, m) and the simultaneous writing of the data "1" to the memory cells MC(n, m−1) and MC(n, m+1), a row decoder 24 transfers a voltage of a "L" level to a word line WLn at a time T40. Accordingly, a select transistor 31 of a memory cell MC connected to the word line WLn is switched to an off state.

At a time T50, the row decoder 24 selects a word line WL(n−1) adjacent to the word line WLn and transfers a voltage of an "H" level. Accordingly, the select transistor 31 of the memory cell MC connected to the word line WL(n−1) is switched to the on state. The row decoder 24 transfers the voltage of the "L" level to the unselected word lines WL (such as the word lines WLn and WL(n+1)). Accordingly, the select transistor 31 of the memory cell MC connected to the word lines WLn and WL(n+1) is switched to the off state.

At a time T53, the SA/WD 23 simultaneously selects the pair of the bit line BL(m−1) and the source line /BL(m−1), the pair of the bit line BLm and the source line /BLm, and the pair of the bit line BL(m+1) and the source line /BL(m+1). The SA/WD 23 writes inverted data of data, held in the page buffer 25, to memory cells MC(n−1, m−1), MC(n−1, m), and MC(n−1, m+1). Specifically, the SA/WD 23 transfers the voltage V2 to the bit lines BL(m−1), BLm, and BL(m+1) connected respectively to the memory cells MC(n, m−1), MC ((n−1, m), and MC(n−1, m+1) and transfers the voltage Vss to the source lines /BL(m−1), /BLm, and /BL(m+1). The voltage Vss is transferred to the unselected pair of the bit line BL and the source line /BL. Consequently, a current flows from the bit line BL(m−1) to the source line /BL(m−1), and data "1" is written to the memory cell MC(n−1, m−1). Further, a current flows from the bit line BLm to the source line /BLm, and data "1" is written to the memory cell MC(n, m+1). Furthermore, a current flows from the bit line BL(m+1) to the source line /BL(m+1), the data "1" is written to the memory cell MC(n−1, m+1).

As described above, the SA/WD 23 is required to simultaneously transfer the voltage V2 the two bit lines BL(m−1), BLm, and BL(m+1). Thus, the SA/WD 23 is required to output a higher voltage as compared to a case where the voltage V2 is transferred to one or two bit lines BL.

After completion of the simultaneous writing of the data "1" to the memory cells MC(n−1, m−1), MC(n−1, m), and MC(n−1, m+1), the SA/WD 23 transfers the voltage Vss to the bit lines BL(m−1), BLm, and BL(m+1) at a time T52.

At a time T60, the row decoder 24 transfers the voltage of the "L" level to the word line WL(n−1). Accordingly, the select transistor 31 of the memory cell MC connected to the word line WL(n−1) is switched to the off state.

At a time T70, the row decoder 24 selects the word line WL(n+1) adjacent to the word line WLn and transfers the voltage of the "H" level. Accordingly, the select transistor 31 of the memory cell MC connected to the word line WL(n+1) is switched to the on state. The row decoder 24 transfers the voltage of the "L" level to the unselected word lines WL (such as the word lines WL(n−1) and WLn). Accordingly, the select transistor 31 of the memory cell connected to the word lines WL(n−1) and WLn is switched to the off state.

Since an operation from a time T71 to a time T72 is similar to the operation from the time T51 to the time T52 described above in the first variation, the description will be omitted.

At a time T80, the row decoder 24 transfers the voltage of the "L" level to the word line WL(n+1). Accordingly, the select transistor 31 of the memory cell MC connected to the word line WL(n+1) is switched to the off state.

According to the above operations, it is possible to reduce the time required for data writing to the first nearest magnetoresistive effect element 32a and the second nearest magnetoresistive effect element 32b executed by a one-time write operation.

According to the magnetic storage device of the first variation, a controller 27 simultaneously writes the same data to the memory cells MC connected to the same word line WL in the write operation executed by the write command "WTa". Consequently, the number of times of writing the data "1" to be written a plurality of times in the write command "WTa" can be reduced to the number of the word lines WL connected to the first nearest magnetoresistive effect element 32a and the second nearest magnetoresistive effect element second 32b in proximity to a target magnetoresistive effect element 32t. Specifically, the number of times of writing the data "1" is reduced from eight times to three times in the first variation. Accordingly, the time required for writing write data according to the write command "WTa" can be reduced.

9.2 Second Variation

A magnetic storage device according to a second variation will be described. In the magnetic storage device according to the second variation, magnetoresistive effect elements 32 are arranged so as to fill the centers and vertexes of regular hexagons densely laid on a semiconductor substrate 30.

9.2.1. Plane Arrangement of Magnetoresistive Effect Elements

Figure 32:
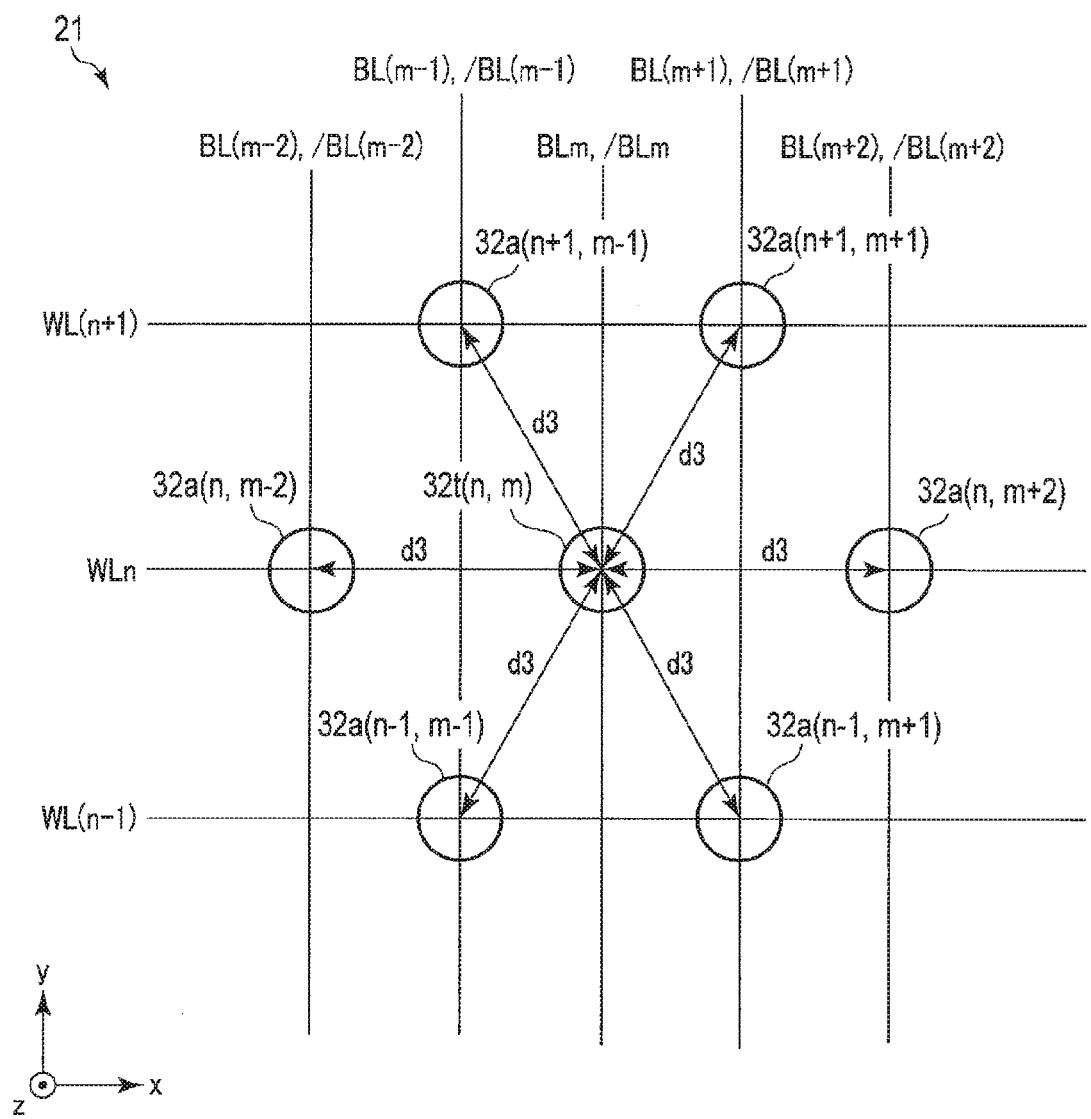
FIG. 32 is a top view showing a plane arrangement of a magnetoresistive effect element of a magnetic storage device according to a second variation.

Next, a plane arrangement of the magnetoresistive effect elements of the magnetic storage device according to the second variation will be described. FIG. 32 is a top view for explaining one example of the plane arrangement of the magnetoresistive effect elements of the magnetic storage device according to the second variation. FIG. 32 corresponds to FIG. 8 shown in the first embodiment.

As shown in FIG. 32, a plurality of magnetoresistive effect elements 32 include a plurality of columns (a pair of the magnetoresistive effect elements 32 along the y axis on the same x axis). In each column of the magnetoresistive effect elements 32, the magnetoresistive effect elements 32 are arranged at equal intervals d3. On the other hand, in a plurality of adjacent columns, the magnetoresistive effect elements 32 are not arranged along the x axis. The magnetoresistive effect elements 32 are located at the vertexes and center of a rectangular hexagon over three columns. Such rectangular hexagons are densely laid on an xy plane. Namely, the magnetoresistive effect elements 32 are located at the vertexes and center of a honeycomb structure extending on the xy plane.

In the arrangement shown in FIG. 32, a target magnetoresistive effect element 32t(n, m) is in proximity to six first nearest magnetoresistive effect elements 32a(n−1, m−1), 32a(n−1, m+1), 32a(n, m−2), 32a(n, m+2), 32a(n+1, m−1) and 32a(n+1, m+1). On the other hand, the target magnetoresistive effect element 32t(n, m) has no second nearest magnetoresistive effect element 32b because all the adjacent magnetoresistive effect elements 32 are arranged at the equal intervals d3.

The plane arrangement in the magnetic storage device according to the second variation is described in, for example, WO 2015/132997, entitled "Magnetoresistive Memory Device", filed on Oct. 2, 2014. The entirety of the patent application is hereby incorporated by reference in this specification.

9.2.2. Details of Write Operation

Next, details of a write operation in the magnetic storage device according to the second variation will be described.

First, as in the first embodiment, an operation in which writing is started from a target magnetoresistive effect element 32t, and then writing to a first nearest magnetoresistive effect element 32a is performed will be described.

FIG. 33 is a schematic view for explaining the details of the write operation in the magnetic storage device according to the second variation. FIG. 33 corresponds to FIG. 11 shown in the first embodiment.

As shown in FIG. 33, in a first write operation A1, a controller 27 identifies a magnetoresistive effect element 32(n, m) in a write target memory cell MC from the target magnetoresistive effect element 32t. The controller 27 then executes writing of the data "0" to the target magnetoresistive effect element 32t(n, m). Further, the controller 27 identifies magnetoresistive effect elements 32(n, m−2) and 32(n, m+2) in the memory cell MC, which are connected to the same word line WLn as the write target memory cell MC and are in proximity to the write target memory cell MC, from the first nearest magnetoresistive effect element 32a. The controller 27 then executes writing of data "1" to the first nearest magnetoresistive effect elements 32a(n, m−2) and 32a(n, m+2).

In the second write operation B1, the controller 27 identifies magnetoresistive effect elements 32(n−1, m−1) and 32(n−1, m+1) in the memory cell MC, which are connected to a word line WL(n−1) adjacent to the word line WLn and are in proximity to the write target memory cell MC, from the first nearest magnetoresistive effect element 32a. The controller 27 then executes writing of the data "1" to the first nearest magnetoresistive effect elements 32a(n−1) and 32a(n−1, m+1).

In the third write operation C1, the controller 27 identifies magnetoresistive effect elements 32(n+1, m−1) and 32(n+1, m+1) in the memory cell MC, which are connected to a word line WL(n+1) adjacent to the word line WLn and are in proximity to the write target memory cell MC, from the first nearest magnetoresistive effect element 32a. The controller 27 then executes writing of the data "1" to the first nearest magnetoresistive effect elements 32a(n+1, m−1) and 32a(n+1, m+1).

According to the above operations, also in a case where the magnetoresistive effect elements 32 are arranged at the vertexes and center of the honeycomb structure extending on the xy plane, data inverted from each other can be written to the target magnetoresistive effect element 32t and the first nearest magnetoresistive effect element 32a by a one-time write operation, as in the first embodiment. In the write operation, writing is started from the target magnetoresistive effect element 32t, and then, writing to the first nearest magnetoresistive effect element 32a may be performed.

Next, as in the second embodiment, an operation in which writing is started from the first nearest magnetoresistive effect element 32a, and then writing to the target magnetoresistive effect element 32t is performed will be described.

FIG. 34 is a schematic view for explaining the details of the write operation in the magnetic storage device according to the second variation. FIG. 34 corresponds to FIG. 17 shown in the second embodiment.

As shown in FIG. 34, in the first write operation A2, the controller 27 identifies a magnetoresistive effect element 32(n, m) in the write target memory cell MC, connected to the word line WLn, from the target magnetoresistive effect element 32t. The controller 27 then identifies magnetoresistive effect elements 32(n−1, m−1) and 32(n−1, m+1) in the memory cell MC, which are connected to a word line WL(n−1) adjacent to the word line WLn and are in most proximity to the write target memory cell. MC, from the first nearest magnetoresistive effect element 32a. The controller 27 then executes writing of the data "1" to the first nearest magnetoresistive effect elements 32a(n−1, m−1) and 32a(n−1, m+1).

In the second write operation B2, the controller 27 identifies the magnetoresistive effect elements 32(n+1, m−1) and 32(n+1, m+1) in the memory cell MC, which are connected to the word line WL(n+1) adjacent to the word line WLn and are in most proximity to the write target memory cell MC, from the first nearest magnetoresistive effect element 32a.

The controller 27 then executes writing of the data "1" to the first nearest magnetoresistive effect elements 32a(n+1, m−1) and 32a(n+1, m+1).

In the third write operation C2, the controller 27 identifies the magnetoresistive effect elements 32(n, m−2) and 32(n, m+2) in the memory cell MC, which are connected to the same word line WLn as the write target memory cell MC and are in proximity to the write target memory cell MC, from the first nearest magnetoresistive effect element 32a. The controller 27 then executes writing of the data "1" to the first nearest magnetoresistive effect elements 32a(n, m−2) and 32a(n, m+2) connected to the word line WLn. Further, the controller 27 executes writing of the data "0" to a target magnetoresistive effect element 32t(n, m).

According to the magnetic storage device according to the second variation, also in the case where the magnetoresistive effect elements 32 are arranged at the vertexes and center of the honeycomb structure extending on the xy plane, data inverted from each other can be written to the target magnetoresistive effect element 32t and the first nearest magnetoresistive effect element 32a by a one-time write operation, as in the second embodiment. In the write operation, writing is started from the first nearest magnetoresistive effect element 32a, and then, writing to the target magnetoresistive effect element 32t may be formed 9.3 Third Variation Next, a magnetic storage device according to a third variation will be described. In the magnetic storage device according to the third variation, although magnetoresistive effect elements 32 are rectangularly arranged on a semiconductor substrate 30, the magnetoresistive effect elements 32 are arranged such that a positional relationship with an active region is different from that of the first embodiment.

9.3.1. Plane Arrangement of Magnetoresistive Effect Elements

Figure 35:
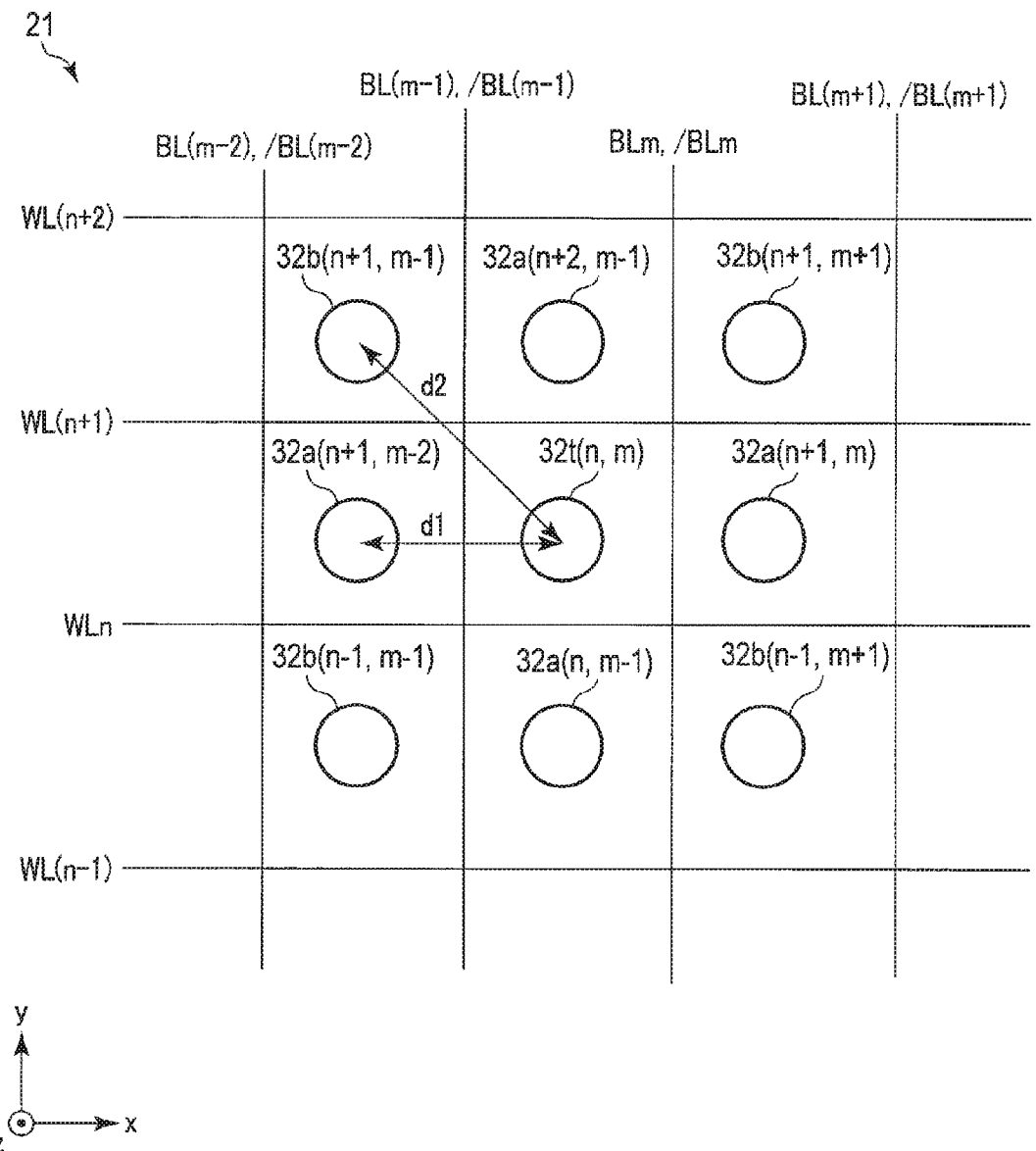
FIG. 35 is a top view showing a plane arrangement of a magnetoresistive effect element of a magnetic storage device according to a third variation.

Next, a plane arrangement of the magnetoresistive effect elements of the magnetic storage device according to the third variation will be described. FIG. 35 is a top view for explaining one example of the plane arrangement of the magnetoresistive effect elements of the magnetic storage device according to the third variation. FIG. 35 corresponds to FIG. 8 shown in the first embodiment.

As shown in FIG. 35, the magnetoresistive effect elements 32 are rectangularly arranged on an xy plane, as in the first embodiment. Namely, the magnetoresistive effect elements 32 are arranged at equal intervals along the x-axis direction and the y-axis direction.

In the example of FIG. 35, the active region (not shown) is shared among a plurality of memory cells MC in different rows or columns. Thus, the two memory cells MC adjacent to each other in the same row are not always selected by two adjacent word lines WL. On the other hand, the two memory cells MC adjacent to each other in the same column are not always selected by a pair of two bit lines BL and source lines /BL adjacent to each other.

In the arrangement shown in FIG. 35, a target magnetoresistive effect element 32t(n, m) is in proximity to four first nearest magnetoresistive effect elements 32a(n, m−1), 32a(n+1, m−2), 32a(n+1, m), and 32a(n+2, m−1) and four second nearest magnetoresistive effect elements 32b(n−1, m−1), 32b(n−1, m+1), 32b(n+1, m−1) and 32b(n+1, m+1).

The plane arrangement in the magnetic storage device according to the third variation is described in, for example, US 2012/0286339, entitled "Semiconductor Storage Device", filed on Mar. 14, 2012. The entirety of the patent application is hereby incorporated by reference in this specification.

9.3.2. Details of Write Operation

Next, details of a write operation in the magnetic storage device according to the third variation will be described.

First, as in the first embodiment, there will be described an operation in which writing is started from a target magnetoresistive effect element 32t, and then writing to a first nearest magnetoresistive effect element 32a and a second nearest magnetoresistive effect element 32b is performed.

Figure 36:
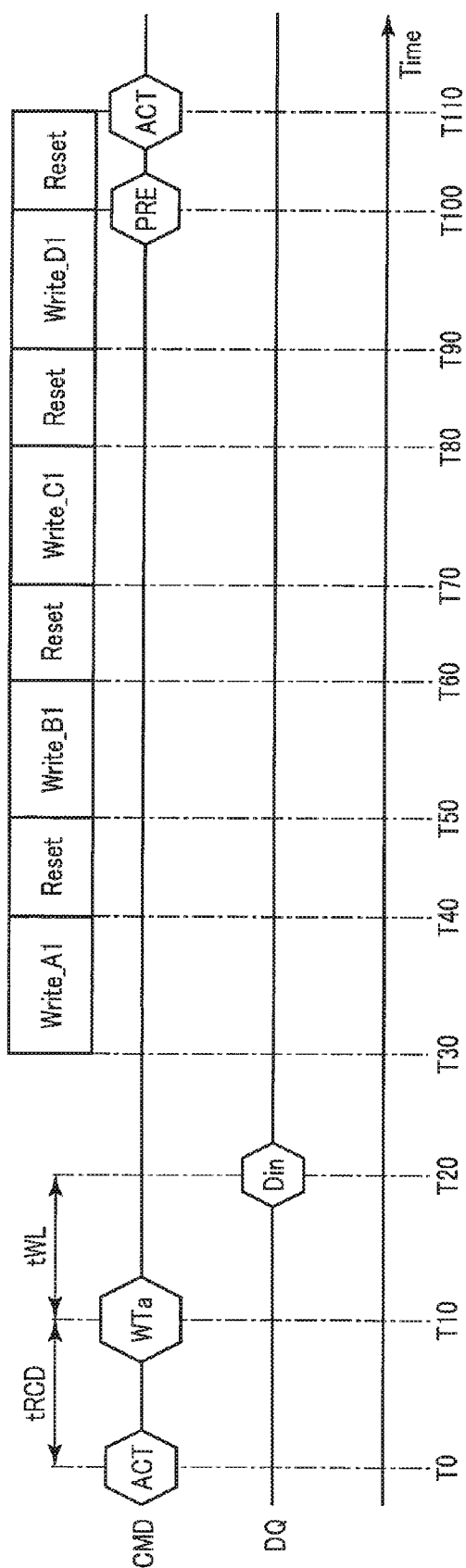
FIG. 36 is a command sequence showing a write operation in the magnetic storage device according to the third variation.

FIG. 36 is a command sequence for explaining the details of the write operation in the magnetic storage device according to the third variation. FIG. 36 corresponds to FIG. 10 shown in the first embodiment.

As shown in FIG. 36, since an operation from a time T0 to a time T20 is similar to the operation from the time T0 to the time T20 in FIG. 10 shown in the first embodiment, the description will be omitted.

When output of a data signal Din by a memory controller 10 is completed, a controller 27 starts a write operation of writing data to a memory cell array 21 at a time T30. The write operation includes, for example, a first write operation A1, a second write operation B1, a third write operation C1, and a fourth write operation D1 (designated as Write_D1 in FIG. 36).

Since the operation from the time T30 to a time T80 is similar to the operation from the time T30 to the time T80 in FIG. 10 shown in the first embodiment, the description will be omitted.

The controller 27 starts the fourth write operation D1 at a time T90. In the fourth write operation D1, writing to the memory cell MC connected to a word line WL(n+2) is executed.

When the data writing to the memory cell MC connected to the word line WL(n+2) is completed, the memory controller 10 issues a precharge command "PRE" at a time T100. The controller 27 having received the precharge command "PRE" shifts from the active state to the idle state. Further, the controller 27 makes setting of a row address invalid and terminates the fourth write operation D1.

The memory controller 10 can issue an active command "ACT" after a time T110 at which a precharge operation is completed.

FIG. 37 is a schematic view for explaining the details of the write operation in the magnetic storage device according to the third variation. FIG. 37 corresponds to FIG. 11 shown in the first embodiment.

As shown in FIG. 37, in the first write operation A1, the controller 27 identifies a magnetoresistive effect element 32(n, m) in a write target memory cell MC from the target magnetoresistive effect element 32t. The controller 27 then executes writing of the data "0" to the target magnetoresistive effect element 32t(n, m). Further, the controller 27 identifies a magnetoresistive effect element 32(n, m−1) in the memory cell MC, which is connected to the same word line WLn as the write target memory cell MC and is in proximity to the write target memory cell MC, from the first nearest magnetoresistive effect element 32a. The controller 27 then executes writing of the data "1" to the first nearest magnetoresistive effect element 32a(n, m−1).

In the second write operation B1, the controller 27 identifies magnetoresistive effect elements 32(n−1, m−1) and 32(n−1, m+1) in the memory cell MC, which are connected to a word line WL(n−1) and are in proximity to the write target memory cell MC, from the second nearest magnetoresistive effect element 32b. The controller 27 then executes writing of the data "1" to the second nearest magnetoresistive effect elements 32b(n−1) and 32b(n−1, m+1).

In the third write operation C1, the controller 27 identifies magnetoresistive effect elements 32(n+1, m−2) and 32(n+1, m) in the memory cell MC, which are connected to a word line WL(n+1) and are in most proximity to the write target memory cell MC, from the first nearest magnetoresistive effect element 32a and identifies magnetoresistive effect elements 32(n+1, m−1) and 32(n+1, m+1) in the memory cell MC, which is in most proximity to the write target memory cell MC next to the magnetoresistive effect elements 32(n+1, m−2) and 32(n+1, m), from the second nearest magnetoresistive effect element 32b. The controller 27 then executes writing of the data "1" to the first nearest magnetoresistive effect elements 32a(n+1, m−2) and 32a(n+1, m) and the second nearest magnetoresistive effect elements 32 b(n+1, m−1) and 32b(n+1, m+1).

In the fourth write operation D1, the controller 27 identifies a magnetoresistive effect element 32(n+2, m−1) in the memory cell MC, which is connected to the word line WL(n+2) and is in proximity to the write target memory cell MC, from the first nearest magnetoresistive effect element 32a. The controller 27 then executes writing of the data "1" to the first nearest magnetoresistive effect element 32a(n+2, m−1).

According to the above operations, also in a case where the active region is shared among the memory cells MC in different rows or columns, data inverted from each other can be written to the target magnetoresistive effect element 32t and the first nearest magnetoresistive effect element 32a by a one-time write operation, as in the first embodiment. In the write operation, writing is started from the target magnetoresistive effect element 32t, and then, writing to the first nearest magnetoresistive effect element 32a may be performed.

Next, as in the second embodiment, there will be described an operation in which writing is started from the first nearest magnetoresistive effect element 32a and the second nearest magnetoresistive effect element 32b, and then writing to the target magnetoresistive effect element 32t is performed.

FIG. 38 is a command sequence for explaining the details of the write operation in the magnetic storage device according to the third variation. FIG. 38 corresponds to FIG. 16 shown in the second embodiment.

As shown in FIG. 38, since the operation from the time T0 to the time T20 is similar to the operation from the time T0 to the time T20 in FIG. 16 shown in the second embodiment, the description will be omitted.

When the output of the data signal Din by the memory controller 10 is completed, the controller 27 starts the write operation of writing data to the memory cell array 21 at the time T30. The write operation includes, for example, a first write operation A2, a second write operation B2, a third write operation C2, and a fourth write operation D2 (designated as Write_D2 in FIG. 38).

Since the operation from the time T30 to a time T60 is similar to the operation from the time T30 to the time T60 in FIG. 16 shown in the second embodiment, the description will be omitted.

The controller 27 starts the third write operation C2 at a time T70 in the third write operation C2, writing to the memory cell MC connected to the word line WL(n+2) is executed.

When the data writing to the memory cell MC connected to the word line WL(n+2) is completed, the controller 27 makes the setting of the row address invalid at the time T80 and terminates the third write operation C2. Subsequently, the controller 27 performs setting of the row address for starting the data write operation to the memory cell MC connected to the word line WLn and transfers the set row address to the row decoder 24.

The controller 27 starts the fourth write operation D2 at the time T90. In the fourth write operation D2, writing to the memory cell MC connected to the word line WLn is executed.

When the data writing to the memory cell MC connected to the word line WLn is completed, the memory controller 10 issues the precharge command "PRE" at the time T100. The controller 27 having received the precharge command "PRE" shifts from the active state to the idle state. Further, the controller 27 makes setting of the row address invalid and terminates the fourth write operation D2.

The memory controller 10 can issue the active command "ACT" after the time T110 at which the precharge operation is completed.

FIG. 39 is a schematic view for explaining the details of the write operation in the magnetic storage device according to the third variation. FIG. 39 corresponds to FIG. 17 shown in the second embodiment.

As shown in FIG. 39, in the first write operation A2, the controller 27 identifies the magnetoresistive effect element 32(n, m) in the write target memory cell MC, connected to the word line WLn, from the target magnetoresistive effect element 32t. The controller 27 then identifies the magnetoresistive effect elements 32(n−1, m−1) and 32(n−1, m+1) in the memory cell MC, which are connected to the word line WL(n−1) and are in proximity to the write target memory cell MC, from the second nearest magnetoresistive effect element 32b. The controller 27 then executes writing of the data "1" to the second nearest magnetoresistive effect elements 32b(n−1, m−1) and 32b(n−1, m+1).

In the second write operation B2, the controller 27 identifies the magnetoresistive effect elements 32(n+1, m−2) and 32(n+1, m) in the memory cell MC, which are connected to the word line WL(n+1) and are in most proximity to the write target memory cell MC, from the first nearest magnetoresistive effect element 32a and identifies the magnetoresistive effect elements 32(n+1, m−1) and 32(n+1, m+1) in the memory cell MC, which is in most proximity to the write target memory cell MC next to the magnetoresistive effect elements 32(n+1, m−2) and 32(n+1, m), from the second nearest magnetoresistive effect element 32b. The controller 27 then executes writing of the data "1" to the first nearest magnetoresistive effect elements 32a(n+1, m−2) and 32a(n+1, m) and the second nearest magnetoresistive effect elements 32b(n+1, m−1) and 32b(n+1, m+11).

In the third write operation C2, the controller 27 identifies the magnetoresistive effect element 32(n+2, m−1) in the memory cell MC, which is connected to the word line WL(n+2) and is in proximity to the write target memory cell MC, from the first nearest magnetoresistive effect element 32a. The controller 27 then executes writing of the data "1" to the first nearest magnetoresistive effect element 32a(n+2, m−1).

In the fourth write operation D2, the controller 27 identifies the magnetoresistive effect element 32(n, m−1) in the memory cell MC, which is connected to the same word line WLn as the write target memory cell MC and is in proximity to the write target memory cell MC, from the first nearest magnetoresistive effect element 32a. The controller 27 then executes writing of the data "1" to the first nearest magnetoresistive effect element 32a(n, m−1) connected to the word line WLn. Further, the controller 27 executes writing of the data "0" to a target magnetoresistive effect element 32t(n, m).

According to the above operations, also in the case where the active region is shared among the memory cells MC in different rows or columns, data inverted from each other can be written to the target magnetoresistive effect element 32t and the first nearest magnetoresistive effect element 32a by a one-time write operation, as in the second embodiment. In the write operation, writing is started from the first nearest magnetoresistive effect element 32a and the second nearest magnetoresistive effect element 32b, and then, writing to the target magnetoresistive effect element 32t may be performed.

According to the magnetic storage device of the third variation, also in the case where the active region is shared among the memory cells MC in different rows or columns, data inverted from each other can be written to the target magnetoresistive effect element 32t and the first nearest magnetoresistive effect element 32a by a one-time write operation, as in the first and second embodiments.

9.4 Fourth Variation

Next, a magnetic storage device according to a fourth variation will be described. In the magnetic storage device according to the fourth variation, a range in proximity to the target magnetoresistive effect element 32t defined in the magnetic storage device according to the first embodiment is changed.

Figure 40:
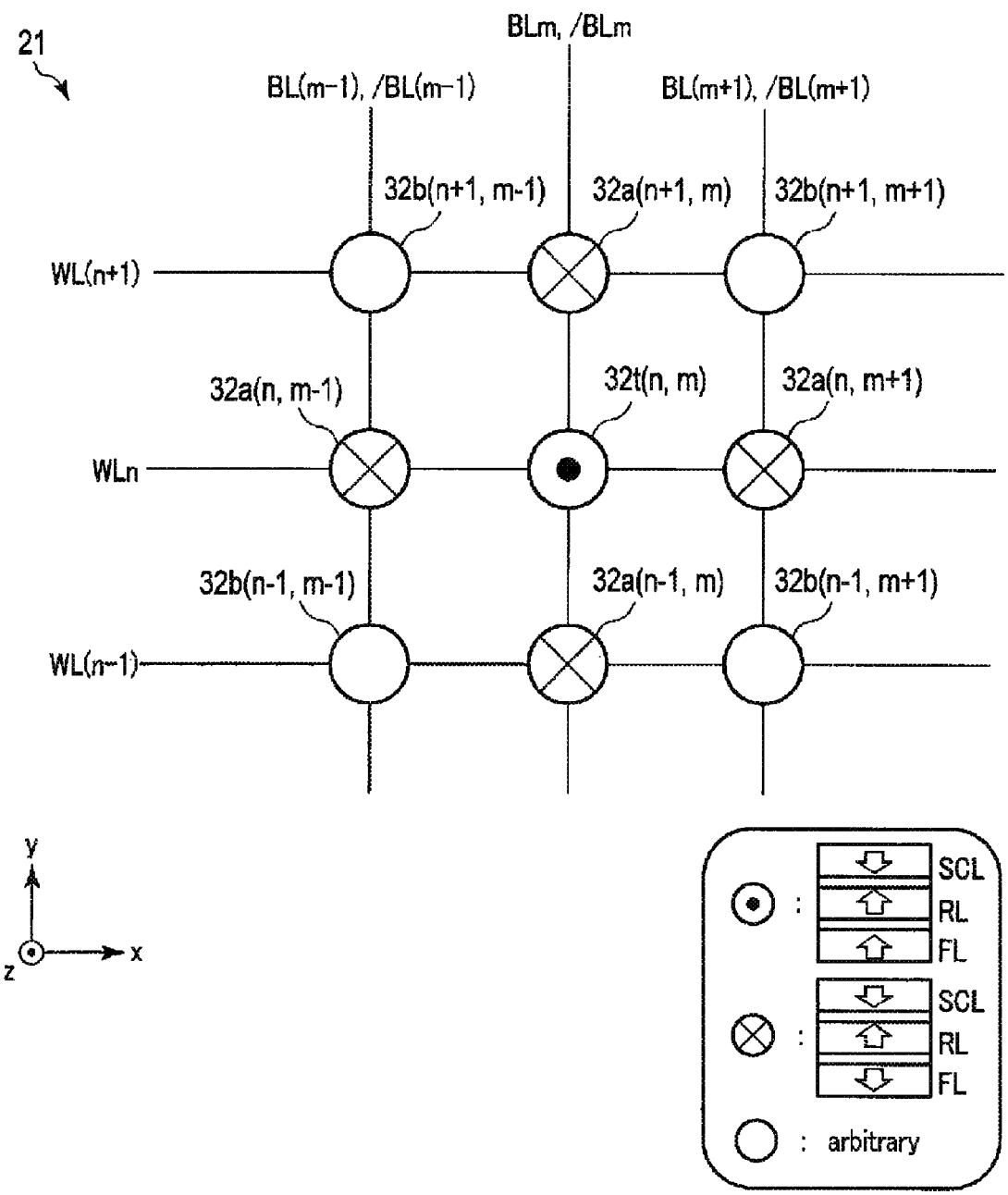
FIG. 40 is a schematic view for explaining a state after a write operation of a magnetoresistive effect element of a magnetic storage device according to a fourth variation.

FIG. 40 is a schematic view for explaining a state of a memory cell array after data writing in the magnetic storage device according to the fourth variation. In the example of FIG. 40, a change is made such that the range in proximity to the target magnetoresistive effect element 32t is only a first nearest magnetoresistive effect element 32a.

As shown in FIG. 40, upon writing of data "0" in which a target magnetoresistive effect element 32t(n, m) is a write target, data "1" is written to first nearest magnetoresistive effect elements 32a(n, m−1), 32a(n, m+1), 32a(n−1, m), and 32a(n+1, m). On the other hand, during the same write operation, data writing to second nearest magnetoresistive effect elements 32b(n−1, m−1), 32b(n−1, m+1), 32b(n+1, m−1), and 32b(n+1, m+1) is not executed.

As described above, when writing of inverted data of write data to the target magnetoresistive effect element 32t is set to only the first nearest magnetoresistive effect element 32a, the number of memory cells MC required for writing of 1 bit data can be reduced from nine to five.

In the example of FIG. 40, although the example in which the inverted data is written to all the first nearest magnetoresistive effect elements 32a is shown, the present invention is not limited thereto. For example, in a range where a leakage magnetic field can improve the retention characteristics of the target magnetoresistive effect element 32t, inverted data can be written to an arbitrary number of first nearest magnetoresistive effect elements 32a. More specifically, if inverted data is written to a majority of all the first nearest magnetoresistive effect elements 32a, the leakage magnetic field acting on the target magnetoresistive effect element 32t can improve the retention characteristics. As described above, when inverted data is written to a majority of the magnetoresistive effect elements 32 in proximity to the target magnetoresistive effect element 32t, the storable data amount can be secured depending on the situation while improving reliability of write target data.

9.5 Fifth Variation

Next, a magnetic storage device according to a fifth variation will be described. In the magnetic storage device according to the fifth variation, in order to increase the action of a leakage magnetic field on a target magnetoresistive effect element 32t, a size of a proximate magnetoresistive effect element 32 is larger than the size of the target magnetoresistive effect element 32t.

FIG. 41 is a block diagram showing a configuration of the magnetic storage device according to the fifth variation. FIG. 41 corresponds to FIG. 2 shown in the first embodiment.

As shown in FIG. 41, a memory cell array 11 includes an allocated memory area 111 and an unallocated memory area 112. The allocated memory area 111 is, for example, an area including a memory cell MC where data can be freely read and written by a user. The unallocated memory area 112 is, for example, an area including a memory cell MC where only reading is permitted by a user, and writing is inhibited. Before shipment, the memory cell MC in the unallocated memory area 112 previously holds security information and design information on a magnetic storage device 20 or information defining an allocated area that can be used by a user.

The memory cell MC in the allocated memory area 111 is connected to, for example, a word line WL different from the memory cell MC in the unallocated memory area 112. Further, the memory cell MC in the allocated memory area 111 is connected to, for example, a bit line BL and a source line /BL which are the same as the memory cell MC in the unallocated memory area 112.

FIG. 42 is the magnetic storage device according to the fifth variation.

A plane arrangement of the magnetoresistive effect elements of the magnetic storage device according to the fifth variation will be described. FIG. 42 is a top view for explaining one example of the plane arrangement of the magnetoresistive effect elements of the magnetic storage device according to the fifth variation. FIG. 42 corresponds to FIG. 8 shown in the first embodiment.

As shown in FIG. 42, the magnetoresistive effect elements 32 are rectangularly arranged on an xy plane, as in the first embodiment. Namely, the magnetoresistive effect elements 32 are arranged at equal intervals along the x-axis direction and the y-axis direction.

In the example of FIG. 42, when circular shapes of cross sections in the xy plane of the magnetoresistive effect elements 32 are compared, a diameter r2 of a circular shape of each of a first nearest magnetoresistive effect element 32a and a second nearest magnetoresistive effect element 32b is larger than a diameter r1 of a circular shape of the target magnetoresistive effect element 32t.

Consequently, the target magnetoresistive effect element 32t is more significantly affected by the leakage magnetic field generated from the first nearest magnetoresistive effect element 32a and the second nearest magnetoresistive effect element 32b. Thus, when the leakage magnetic field is applied in a direction in which a magnetization orientation of a free layer FL of the target magnetoresistive effect element 32t is maintained, the retention characteristics can be further improved.

In order to strengthen a leakage magnetic field generated from a magnetic layer, it is considered that the magnetic layer is enlarged. However, the magnetoresistive effect elements 32 are generated by being simultaneously stacked on the xy plane. Thus, it is difficult to significantly generate only the first nearest magnetoresistive effect element 32a and the second nearest magnetoresistive effect element 32b in the z-axis direction relative to the target magnetoresistive effect element 32t. On the other hand, as shown in the fifth variation, it is relatively easy to significantly generate only the first nearest magnetoresistive effect element 32a and the second nearest magnetoresistive effect element 32b in the xy plane relative to the target magnetoresistive effect element 32t. Accordingly, the retention characteristics can be improved without increasing the number of steps as compared to a usual case in a manufacturing process.

9.6 Other Variations

Although the case where the magnetoresistive effect element 32 described in each of the embodiments and variations described above is a perpendicular magnetization MTJ has been described, the present invention is not limited thereto, and the magnetoresistive effect element 32 may be a horizontal magnetization MTJ element having a horizontal magnetic anisotropy.

Further, although there has been described the case where the magnetoresistive effect element 32 described in each of the embodiments and variations described above is a bottom free type MTJ element in which a free layer 2FL is provided on the semiconductor substrate 30 side, the magnetoresistive effect element 32 may be a top free type MTJ element in which a reference layer RL is provided on the semiconductor substrate 30 side.

Further, the magnetoresistive effect elements 32 are not limited to the top free type and the bottom free type, but any type which can hold data is applicable. For example, other type of magnetoresistive effect element 32 having a configuration of which a storage layer FL is provided between two reference layers RL along the z axis may be applicable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A magnetic storage device comprising:
   a first magnetoresistive effect element;
   a second magnetoresistive effect element and a third magnetoresistive effect element being in proximity to the first magnetoresistive effect element; and
   a controller,
   wherein when the controller receives a command which is associated with an operation of writing a first data item to the first magnetoresistive effect element, the controller is configured to perform a first operation of writing the first data item to the first magnetoresistive effect element by applying a first voltage having a first polarity, and a second operation of writing a second data item different from the first data item to the second magnetoresistive effect element and the third magnetoresistive effect element by applying a second voltage having a second polarity different from the first polarity, and
   wherein the first magnetoresistive effect element, the second magnetoresistive effect element, and the third magnetoresistive effect element include ferromagnets, respectively, the ferromagnets each storing a data item, and a magnetization orientation of the ferromagnet of the first magnetoresistive effect element is opposite to a magnetization orientation of the ferromagnets of the second magnetoresistive effect element and the third magnetoresistive effect element after the first operation and the second operation.

2. The device of claim 1, wherein the second operation is performed without receiving a command to write the second data item to the second magnetoresistive effect element or the third magnetoresistive effect element.

3. The device of claim 1, further comprising:
   a fourth magnetoresistive effect element positioned farther from the first magnetoresistive effect element than the second magnetoresistive effect element and the third magnetoresistive effect element,
   wherein when the controller receives a command which is associated with an operation of writing the first data item to the first magnetoresistive effect element and a third data item to the fourth magnetoresistive effect element, the controller is configured to perform the first operation, the second operation, and a third operation of writing the third data item to the fourth magnetoresistive effect element.

4. The device of claim 1, wherein the controller is configured to perform the second operation after the first operation.

5. The device of claim 1, wherein the controller is configured to perform the second operation before the first operation.

6. The device of claim 1, wherein the controller sets a value of a write voltage of the first operation when receiving the command to be larger than the value of the write voltage of the first operation when not receiving the command.

7. The device of claim 1, wherein the controller sets a pulse width of a write voltage of the first operation when receiving the command to be larger than the pulse width of the write voltage of the first operation when not receiving the command.

8. The device of claim 1, wherein the controller sets a value of a write voltage of the first operation when receiving the command to be larger than the value of the write voltage of the first operation when not receiving the command, and the controller sets a pulse width of the write voltage of the first operation when receiving the command to be larger than the pulse width of the write voltage of the first operation when not receiving the command.

9. The device of claim 1, further comprising:
   a plurality of magnetoresistive effect elements each being in proximity to the first magnetoresistive effect element, and including the second magnetoresistive effect element and the third magnetoresistive effect element,
   wherein when the controller receives the command, the controller is configured to perform the first operation and a fourth operation of writing the second data item to each of the plurality of magnetoresistive effect elements.

10. The device of claim 9, wherein the plurality of magnetoresistive effect elements include a first magnetoresistive effect element group electrically coupled in common to a first word line and a second magnetoresistive effect element group electrically coupled in common to a second word line different from the first word line, and
   wherein when the controller receives the command, the controller is configured to perform an operation of writing the second data item to the second magnetoresistive effect element group after an operation of writing the second data item to the first magnetoresistive effect element group.

11. The device of claim 10, wherein the controller is configured to write the second data item simultaneously to the plurality of magnetoresistive effect elements in the first magnetoresistive effect element group or the second magnetoresistive effect element group.

12. The device of claim 9, wherein the plurality of magnetoresistive effect elements include a majority of all the magnetoresistive effect elements in proximity to the first magnetoresistive effect element.

13. The device of claim 1, wherein after the first operation by the command, the controller inhibits writing to the first magnetoresistive effect element.

14. The device of claim 1, wherein after the second operation by the command, the controller inhibits writing to the second magnetoresistive effect element and the third magnetoresistive effect element.

15. The device of claim 1, wherein the first magnetoresistive effect element, the second magnetoresistive effect element, and the third magnetoresistive effect element are provided above a substrate and arranged along a direction in which the substrate extends.

16. The device of claim 15, wherein a cross-sectional area in a plane along the substrate of the second magnetoresistive effect element and the third magnetoresistive effect element is larger than the cross-sectional area in the plane along the substrate of the first magnetoresistive effect element.

17. The device of claim 15, wherein magnetization orientations of the first magnetoresistive effect element, the second magnetoresistive effect element, and the third magnetoresistive effect element are perpendicular to the direction in which the substrate extends.

18. A memory system comprising:
the magnetic storage device according to claim 1; and
another controller configured to output the command.

19. A magnetic storage device comprising:
a first magnetoresistive effect element;
a second magnetoresistive effect element and a third magnetoresistive effect element being in proximity to the first magnetoresistive effect element;
a fourth magnetoresistive effect element positioned farther from the first magnetoresistive effect element than the second magnetoresistive effect element and the third magnetoresistive effect element; and
a controller,
wherein when the controller receives a command which is associated with an operation of writing a first data item to the first magnetoresistive effect element, the controller is configured to perform a first operation of writing the first data item to the first magnetoresistive effect element, and a second operation of writing a second data item different from the first data item to the second magnetoresistive effect element and the third magnetoresistive effect element, and
wherein when the controller receives a command which is associated with an operation of writing the first data item to the first magnetoresistive effect element and a third data item to the fourth magnetoresistive effect element, the controller is configured to perform the first operation, the second operation, and a third operation of writing the third data item to the fourth magnetoresistive effect element.

20. A magnetic storage device comprising:
a first magnetoresistive effect element;
a second magnetoresistive effect element and a third magnetoresistive effect element being in proximity to the first magnetoresistive effect element; and
a controller,
wherein when the controller receives a command which is associated with an operation of writing a first data item to the first magnetoresistive effect element, the controller is configured to perform a first operation of writing the first data item to the first magnetoresistive effect element, and a second operation of writing a second data item different from the first data item to the second magnetoresistive effect element and the third magnetoresistive effect element, and
wherein the controller is configured to perform the second operation before the first operation.

* * * * *